(12) United States Patent
Inagaki et al.

(10) Patent No.: US 11,079,620 B2
(45) Date of Patent: Aug. 3, 2021

(54) OPTIMIZATION OF ELECTRONIC DISPLAY AREAS

(71) Applicant: FLEXTERRA, INC., Skokie, IL (US)

(72) Inventors: Philippe Inagaki, Skokie, IL (US); Hjalmar Edzer Ayco Huitema, Belmont, CA (US)

(73) Assignee: FLEXTERRA, INC., Skokie, IL (US)

( * ) Notice: Subject to any disclaimer, the term of this patent is extended or adjusted under 35 U.S.C. 154(b) by 0 days.

(21) Appl. No.: 15/043,053

(22) Filed: Feb. 12, 2016

(65) Prior Publication Data

US 2016/0266672 A1    Sep. 15, 2016

Related U.S. Application Data

(63) Continuation of application No. PCT/US2014/050972, filed on Aug. 13, 2014.
(Continued)

(51) Int. Cl.
*G02F 1/1333* (2006.01)
*G09F 9/40* (2006.01)
(Continued)

(52) U.S. Cl.
CPC .... *G02F 1/133305* (2013.01); *G02F 1/13452* (2013.01); *G06F 3/042* (2013.01);
(Continued)

(58) Field of Classification Search
CPC ......... G09G 2300/0426; G09G 3/3614; G09G 3/3648; G09G 2300/0452; G09G 3/3233;
(Continued)

(56) References Cited

U.S. PATENT DOCUMENTS

| 4,015,423 A | 4/1977 | Brunet |
| 4,834,376 A | 5/1989 | Steinberg |

(Continued)

FOREIGN PATENT DOCUMENTS

| CN | 1306636 A | 8/2001 |
| CN | 101180669 A | 5/2008 |

(Continued)

OTHER PUBLICATIONS

Extended European Search Report for Application No. 14875752.9, dated Aug. 1, 2017.
(Continued)

*Primary Examiner* — Kent W Chang
*Assistant Examiner* — Sujit Shah
(74) *Attorney, Agent, or Firm* — Marshall, Gerstein & Borun LLP

(57) ABSTRACT

Techniques for optimizing the display area of an electronic display of an article include maximizing the contiguous area of the display, on one or more surfaces of the article, on which text or images may be presented to a user, and/or to minimize the area of a border of the display that is viewable to the user. Optimization techniques may include bending portions of the display, and/or minimizing the footprint of the display border by particularly configuring the electrical connections to the display elements. These optimization techniques may be applied to rigid electronic displays, to statically-flexed displays, or to dynamically flexible displays, as well as to other rigid, statically-flexed, or dynamically flexible electronic sheets of individual electronic elements, such as lighting arrays, solar cell arrays, sensor arrays, etc.

20 Claims, 36 Drawing Sheets

Related U.S. Application Data

(60) Provisional application No. 62/012,949, filed on Jun. 16, 2014, provisional application No. 61/952,005, filed on Mar. 12, 2014, provisional application No. 61/920,705, filed on Dec. 24, 2013, provisional application No. 61/876,181, filed on Sep. 10, 2013, provisional application No. 61/870,781, filed on Aug. 27, 2013, provisional application No. 61/865,492, filed on Aug. 13, 2013.

(51) Int. Cl.
*G09F 9/30* (2006.01)
*G02F 1/1345* (2006.01)
*H01L 51/00* (2006.01)
*G09G 3/20* (2006.01)
*G06F 3/042* (2006.01)
*G09F 21/02* (2006.01)
*H01L 51/50* (2006.01)
*H01L 27/32* (2006.01)

(52) U.S. Cl.
CPC .............. *G09F 9/30* (2013.01); *G09F 9/40* (2013.01); *G09G 3/20* (2013.01); *H01L 51/0097* (2013.01); *G06F 2203/04102* (2013.01); *G09F 9/301* (2013.01); *G09F 21/02* (2013.01); *G09G 2300/0465* (2013.01); *G09G 2380/02* (2013.01); *H01L 27/3276* (2013.01); *H01L 51/50* (2013.01); *Y02E 10/549* (2013.01)

(58) Field of Classification Search
CPC ......... G09G 3/3688; G09G 9/30; G09G 3/40; G09G 3/20; G09G 3/301; G09G 2300/0465; G09G 2380/02; G02F 1/133305; G02F 1/03452; G06F 3/042; G06F 2203/04102; H01L 51/0097; H01L 27/3276; H01L 51/50; G09F 21/02; Y02E 10/549

See application file for complete search history.

(56) References Cited

U.S. PATENT DOCUMENTS

| | | | |
|---|---|---|---|
| 5,065,376 A | 11/1991 | Choulat | |
| 5,162,696 A | 11/1992 | Goodrich | |
| 5,438,488 A | 8/1995 | Dion | |
| 5,438,851 A | 8/1995 | Geissbuhler | |
| 5,644,858 A | 7/1997 | Bemis | |
| 5,707,745 A | 1/1998 | Forrest et al. | |
| 5,844,363 A | 12/1998 | Gu et al. | |
| 5,889,737 A | 3/1999 | Alameh et al. | |
| 5,930,026 A | 7/1999 | Jacobson et al. | |
| 5,930,921 A | 8/1999 | Sorofman et al. | |
| 5,931,764 A | 8/1999 | Freeman et al. | |
| 5,980,409 A | 11/1999 | Blase | |
| 6,011,309 A * | 1/2000 | Ahn | H01L 23/5226 257/758 |
| 6,097,147 A | 8/2000 | Baldo et al. | |
| 6,134,965 A | 10/2000 | Somville | |
| 6,196,932 B1 | 3/2001 | Marsh et al. | |
| 6,212,133 B1 | 4/2001 | McCoy et al. | |
| 6,303,238 B1 | 10/2001 | Thompson et al. | |
| 6,369,865 B2 | 4/2002 | Hinata | |
| 6,503,188 B1 | 1/2003 | August | |
| 6,577,496 B1 | 6/2003 | Gioscia et al. | |
| 6,585,914 B2 | 7/2003 | Marks et al. | |
| 6,608,323 B2 | 8/2003 | Marks et al. | |
| 6,619,835 B2 | 9/2003 | Kita | |
| 6,750,607 B2 | 6/2004 | Huitema et al. | |
| 6,831,769 B2 | 12/2004 | Holman et al. | |
| 6,837,590 B2 | 1/2005 | Marston | |
| 6,839,158 B2 | 1/2005 | Albert et al. | |
| 6,991,749 B2 | 1/2006 | Marks et al. | |
| 7,170,670 B2 | 1/2007 | Webber | |
| 7,180,665 B2 | 2/2007 | Daniel et al. | |
| 7,209,114 B2 | 4/2007 | Radley-Smith | |
| 7,278,093 B2 | 10/2007 | Jablonski et al. | |
| 7,374,702 B2 | 5/2008 | Marks et al. | |
| 7,384,814 B2 | 6/2008 | Huitema et al. | |
| 7,446,945 B2 | 11/2008 | Kuiper et al. | |
| 7,453,452 B2 | 11/2008 | Huitema et al. | |
| 7,528,176 B2 | 5/2009 | Marks et al. | |
| 7,564,436 B2 | 7/2009 | Huitema et al. | |
| 7,569,693 B2 | 8/2009 | Marks et al. | |
| 7,605,225 B2 | 10/2009 | Marks et al. | |
| 7,618,260 B2 | 11/2009 | Daniel et al. | |
| 7,667,962 B2 | 2/2010 | Mullen | |
| 7,671,202 B2 | 3/2010 | Marks et al. | |
| 7,710,370 B2 | 5/2010 | Slikkerveer et al. | |
| 7,714,801 B2 | 5/2010 | Kimmel | |
| 7,755,605 B2 | 7/2010 | Daniel et al. | |
| 7,786,951 B2 | 8/2010 | Huitema et al. | |
| 7,787,097 B2 | 8/2010 | Satoh | |
| 7,787,917 B2 | 8/2010 | Aoki et al. | |
| 7,816,480 B2 | 10/2010 | Marks et al. | |
| 7,842,198 B2 | 11/2010 | Marks et al. | |
| 7,892,454 B2 | 2/2011 | Facchetti et al. | |
| 7,893,265 B2 | 2/2011 | Facchetti et al. | |
| 7,902,363 B2 | 3/2011 | Facchetti et al. | |
| 7,947,837 B2 | 5/2011 | Marks et al. | |
| 7,956,820 B2 | 6/2011 | Huitema et al. | |
| 7,965,258 B2 | 6/2011 | Aoki | |
| 7,982,039 B2 | 7/2011 | Marks et al. | |
| 8,017,458 B2 | 9/2011 | Marks et al. | |
| 8,022,214 B2 | 9/2011 | Facchetti et al. | |
| 8,077,283 B2 | 12/2011 | Van Veenendaal et al. | |
| 8,097,877 B2 | 1/2012 | Marks et al. | |
| 8,111,465 B2 | 2/2012 | Heikenfeld et al. | |
| 8,117,903 B2 | 2/2012 | Golden et al. | |
| 8,125,434 B2 | 2/2012 | Huitema et al. | |
| 8,151,501 B2 | 4/2012 | Bemelmans et al. | |
| 8,196,267 B2 | 6/2012 | Nalley et al. | |
| 8,199,471 B2 | 6/2012 | Bemelmans et al. | |
| 8,237,909 B2 | 8/2012 | Ostreko et al. | |
| 8,279,166 B2 | 10/2012 | Huitema et al. | |
| 8,325,143 B2 | 12/2012 | Destura et al. | |
| 8,329,855 B2 | 12/2012 | Usta et al. | |
| 8,334,545 B2 | 12/2012 | Levermore et al. | |
| 8,358,275 B2 | 1/2013 | Huitema | |
| 8,380,327 B2 | 2/2013 | Park | |
| 8,395,150 B2 | 3/2013 | Marks et al. | |
| 8,404,844 B2 | 3/2013 | Kastler et al. | |
| 8,414,411 B2 | 4/2013 | Stites et al. | |
| 8,440,828 B2 | 5/2013 | Quinn et al. | |
| 8,446,549 B2 | 5/2013 | Huitema et al. | |
| 8,466,851 B2 | 6/2013 | Huitema et al. | |
| D686,217 S | 7/2013 | Andre | |
| 8,474,146 B2 | 7/2013 | Hartford et al. | |
| 8,477,250 B2 | 7/2013 | Schellingerhout et al. | |
| 8,482,909 B2 | 7/2013 | Douglas | |
| 8,493,714 B2 | 7/2013 | Visser et al. | |
| 8,502,788 B2 | 8/2013 | Cho | |
| 8,508,468 B2 | 8/2013 | Huitema | |
| 8,508,920 B2 | 8/2013 | Huitema et al. | |
| 8,514,213 B2 | 8/2013 | van Veenendaal et al. | |
| 8,536,579 B2 | 9/2013 | Sele et al. | |
| 8,537,104 B2 | 9/2013 | Markvoort et al. | |
| 8,547,293 B2 | 10/2013 | Van Lieshout et al. | |
| 8,547,325 B2 | 10/2013 | Huitema | |
| 8,618,448 B2 | 12/2013 | Alexander | |
| 9,030,419 B1 | 5/2015 | Freed | |
| 9,176,530 B2 | 11/2015 | Rothkopf et al. | |
| 9,223,494 B1 | 12/2015 | DeSalvo et al. | |
| 9,510,470 B2 | 11/2016 | Huitema et al. | |
| 9,560,751 B2 | 1/2017 | Huitema et al. | |
| 9,629,120 B2 | 4/2017 | Ryu et al. | |
| 9,642,241 B2 | 5/2017 | Huitema et al. | |
| 2001/0004808 A1 | 6/2001 | Hurwitz | |
| 2002/0019296 A1 | 2/2002 | Freeman et al. | |
| 2002/0027634 A1 * | 3/2002 | Kang | G06F 1/13452 349/150 |

(56) References Cited

U.S. PATENT DOCUMENTS

| | | |
|---|---|---|
| 2002/0070926 A1 | 6/2002 | Kavanagh |
| 2003/0030595 A1* | 2/2003 | Radley-Smith ...... G06F 15/0216 345/1.3 |
| 2003/0046849 A1 | 3/2003 | Lin |
| 2003/0182924 A1 | 10/2003 | Tsutsumi et al. |
| 2003/0197597 A1 | 10/2003 | Bahl et al. |
| 2004/0052044 A1 | 3/2004 | Mochizuki et al. |
| 2004/0189605 A1 | 9/2004 | Shih |
| 2004/0212968 A1 | 10/2004 | Lin |
| 2004/0266496 A1* | 12/2004 | Kauhaniemi ........ H04M 1/0214 455/575.1 |
| 2005/0110785 A1 | 5/2005 | Ochiai et al. |
| 2006/0020469 A1 | 1/2006 | Rast |
| 2006/0055691 A1 | 3/2006 | Bursett |
| 2006/0077127 A1 | 4/2006 | Sampsell et al. |
| 2006/0096392 A1 | 5/2006 | Inkster et al. |
| 2006/0132025 A1 | 6/2006 | Gao et al. |
| 2006/0202618 A1 | 9/2006 | Ishii et al. |
| 2006/0204675 A1 | 9/2006 | Gao et al. |
| 2006/0209218 A1 | 9/2006 | Lee et al. |
| 2006/0238494 A1 | 10/2006 | Narayanaswami et al. |
| 2006/0262098 A1 | 11/2006 | Okamoto |
| 2006/0273304 A1 | 12/2006 | Cok |
| 2007/0090420 A1* | 4/2007 | Chu .................. G02F 1/136286 257/291 |
| 2007/0117600 A1 | 5/2007 | Robertson et al. |
| 2007/0120813 A1 | 5/2007 | Huitema et al. |
| 2007/0195067 A1 | 8/2007 | Zotov et al. |
| 2007/0205997 A1 | 9/2007 | Lieshout et al. |
| 2007/0228952 A1* | 10/2007 | Kwon ...................... H01J 5/48 313/580 |
| 2007/0279852 A1 | 12/2007 | Daniel et al. |
| 2008/0018631 A1 | 1/2008 | Hioki et al. |
| 2008/0037374 A1 | 2/2008 | Chu et al. |
| 2008/0094314 A1 | 4/2008 | Huitema et al. |
| 2008/0094322 A1* | 4/2008 | Sarma ............... G02F 1/133305 345/76 |
| 2008/0100636 A1 | 5/2008 | Lai et al. |
| 2008/0150928 A1 | 6/2008 | Van Der Hoef et al. |
| 2008/0198184 A1 | 8/2008 | Schellingerhout et al. |
| 2008/0204367 A1 | 8/2008 | Lafarre et al. |
| 2008/0212271 A1 | 9/2008 | Misawa |
| 2008/0218369 A1 | 9/2008 | Krans et al. |
| 2008/0223708 A1 | 9/2008 | Joo |
| 2008/0223746 A1 | 9/2008 | Van Rens et al. |
| 2008/0248838 A1 | 10/2008 | Chiang |
| 2008/0271429 A1 | 11/2008 | Komiya |
| 2008/0278472 A1 | 11/2008 | Huitema et al. |
| 2008/0291225 A1 | 11/2008 | Arneson |
| 2008/0316580 A1 | 12/2008 | Gillies et al. |
| 2009/0067123 A1 | 3/2009 | Huitema et al. |
| 2009/0122007 A1 | 5/2009 | Tsuzaki et al. |
| 2009/0189878 A1 | 7/2009 | Goertz et al. |
| 2009/0197749 A1 | 8/2009 | Merkel et al. |
| 2009/0219225 A1 | 9/2009 | Cope |
| 2009/0251888 A1 | 10/2009 | Douglas |
| 2009/0267969 A1 | 10/2009 | Sakamoto |
| 2009/0290117 A1 | 11/2009 | Watanabe et al. |
| 2009/0296249 A1* | 12/2009 | van Lieshout .... G02F 1/133305 359/892 |
| 2010/0033435 A1 | 2/2010 | Huitema |
| 2010/0045705 A1 | 2/2010 | Vertegaal et al. |
| 2010/0050133 A1 | 2/2010 | Nishihara et al. |
| 2010/0117975 A1 | 5/2010 | Cho |
| 2010/0127965 A1 | 5/2010 | Park |
| 2010/0156868 A1* | 6/2010 | Hirayama ............ G09G 3/3655 345/208 |
| 2010/0164973 A1 | 7/2010 | Huitema et al. |
| 2010/0194785 A1 | 8/2010 | Huitema et al. |
| 2010/0231544 A1* | 9/2010 | Lu .................... G02F 1/134363 345/173 |
| 2010/0238098 A1* | 9/2010 | Watanabe ............. G02F 1/1339 345/87 |
| 2010/0238612 A1 | 9/2010 | Hsiao et al. |
| 2010/0252112 A1 | 10/2010 | Watson |
| 2010/0259524 A1 | 10/2010 | Markvoort et al. |
| 2010/0283047 A1 | 11/2010 | Facchetti et al. |
| 2010/0295761 A1 | 11/2010 | van Lieshout et al. |
| 2010/0315225 A1 | 12/2010 | Teague |
| 2010/0320448 A1 | 12/2010 | Sele et al. |
| 2010/0326527 A1 | 12/2010 | Facchetti et al. |
| 2011/0003665 A1 | 1/2011 | Burton et al. |
| 2011/0043976 A1 | 2/2011 | Visser et al. |
| 2011/0048619 A1 | 3/2011 | Meinders et al. |
| 2011/0090155 A1 | 4/2011 | Caskey et al. |
| 2011/0109654 A1 | 5/2011 | Van Veenendaal et al. |
| 2011/0120558 A1 | 5/2011 | Facchetti et al. |
| 2011/0122593 A1 | 5/2011 | van Lieshout et al. |
| 2011/0124375 A1 | 5/2011 | Stuivenwold |
| 2011/0128260 A1 | 6/2011 | Huitema et al. |
| 2011/0128266 A1 | 6/2011 | Chiu et al. |
| 2011/0136333 A1 | 6/2011 | Facchetti et al. |
| 2011/0148797 A1 | 6/2011 | Huitema et al. |
| 2011/0157046 A1 | 6/2011 | Lee et al. |
| 2011/0185612 A1 | 8/2011 | Waggoner |
| 2011/0187681 A1 | 8/2011 | Kim et al. |
| 2011/0227080 A1* | 9/2011 | Roh .................... G02B 26/005 257/59 |
| 2011/0227855 A1 | 9/2011 | Kim et al. |
| 2011/0256649 A1 | 10/2011 | Huitema et al. |
| 2011/0279418 A1* | 11/2011 | Han .................. G02F 1/136286 345/204 |
| 2011/0279442 A1 | 11/2011 | Hage et al. |
| 2011/0310035 A1* | 12/2011 | Kim ....................... G06F 3/044 345/173 |
| 2012/0007796 A1 | 1/2012 | Jokinen et al. |
| 2012/0038861 A1 | 2/2012 | van Lieshout et al. |
| 2012/0080462 A1 | 4/2012 | Hajarian |
| 2012/0083705 A1 | 4/2012 | Yuen et al. |
| 2012/0086691 A1 | 4/2012 | van Lieshout et al. |
| 2012/0105333 A1 | 5/2012 | Maschmeyer et al. |
| 2012/0122519 A1 | 5/2012 | Jochheim |
| 2012/0162088 A1 | 6/2012 | van Lieshout et al. |
| 2012/0162876 A1* | 6/2012 | Kim .................... H04M 1/0237 361/697.01 |
| 2012/0182282 A1 | 7/2012 | van Veenendaal et al. |
| 2012/0182755 A1 | 7/2012 | Wildner |
| 2012/0188750 A1 | 7/2012 | Marston |
| 2012/0194448 A1 | 8/2012 | Rothkopf |
| 2012/0194478 A1 | 8/2012 | Liu et al. |
| 2012/0212433 A1 | 8/2012 | Lee et al. |
| 2012/0223314 A1 | 9/2012 | Marks et al. |
| 2012/0242599 A1 | 9/2012 | Seo et al. |
| 2012/0264489 A1 | 10/2012 | Choi et al. |
| 2012/0283799 A1 | 11/2012 | Fan |
| 2012/0314546 A1 | 12/2012 | Brewer et al. |
| 2012/0327048 A1 | 12/2012 | Ramrattan et al. |
| 2013/0005404 A1 | 1/2013 | Bremer |
| 2013/0010405 A1 | 1/2013 | Rothkopf et al. |
| 2013/0025647 A1 | 1/2013 | Bouten et al. |
| 2013/0027853 A1 | 1/2013 | Chen et al. |
| 2013/0038622 A1 | 2/2013 | Yang |
| 2013/0044215 A1 | 2/2013 | Rothkopf et al. |
| 2013/0054997 A1 | 2/2013 | Wyatt et al. |
| 2013/0055762 A1 | 3/2013 | Leung |
| 2013/0058063 A1 | 3/2013 | O'Brien |
| 2013/0062598 A1 | 3/2013 | Usta et al. |
| 2013/0070431 A1 | 3/2013 | Fukuma et al. |
| 2013/0076612 A1 | 3/2013 | Myers |
| 2013/0076649 A1 | 3/2013 | Myers et al. |
| 2013/0083496 A1 | 4/2013 | Franklin et al. |
| 2013/0106603 A1 | 5/2013 | Weast et al. |
| 2013/0113761 A1 | 5/2013 | van Lieshout et al. |
| 2013/0120106 A1 | 5/2013 | Cauwels et al. |
| 2013/0127690 A1 | 5/2013 | Tsai |
| 2013/0127748 A1 | 5/2013 | Vertegaal et al. |
| 2013/0127765 A1 | 5/2013 | Behdasht et al. |
| 2013/0128439 A1 | 5/2013 | Walters et al. |
| 2013/0131887 A1 | 5/2013 | Park |
| 2013/0141405 A1 | 6/2013 | Huitema et al. |
| 2013/0145522 A1 | 6/2013 | da Silva |
| 2013/0145795 A1 | 6/2013 | Asami |
| 2013/0154826 A1 | 6/2013 | Ratajczyk |

(56) References Cited

U.S. PATENT DOCUMENTS

| | | |
|---|---|---|
| 2013/0172068 A1 | 7/2013 | Zhou et al. |
| 2013/0182382 A1 | 7/2013 | Vardi et al. |
| 2013/0191741 A1 | 7/2013 | Dickinson et al. |
| 2013/0197680 A1 | 8/2013 | Cobbett et al. |
| 2013/0219332 A1 | 8/2013 | Woley et al. |
| 2013/0222208 A1 | 8/2013 | Gorilovsky et al. |
| 2013/0222270 A1 | 8/2013 | Winkler et al. |
| 2013/0222271 A1 | 8/2013 | Alberth et al. |
| 2013/0229373 A1 | 9/2013 | Eriksson et al. |
| 2013/0235008 A1 | 9/2013 | Kwon |
| 2013/0265257 A1 | 10/2013 | Jung et al. |
| 2013/0286466 A1 | 10/2013 | Lieshout et al. |
| 2013/0300779 A1 | 11/2013 | Van Baarsen et al. |
| 2013/0326790 A1 | 12/2013 | Cauwels et al. |
| 2013/0335929 A1 | 12/2013 | Cavallaro |
| 2014/0042406 A1 | 2/2014 | Degner et al. |
| 2014/0049487 A1 | 2/2014 | Konertz et al. |
| 2014/0062892 A1 | 3/2014 | Dickinson et al. |
| 2014/0123015 A1 | 5/2014 | Sako et al. |
| 2014/0123436 A1 | 5/2014 | Griffin et al. |
| 2014/0138637 A1 | 5/2014 | Yang et al. |
| 2014/0226275 A1 | 8/2014 | Ko et al. |
| 2014/0257050 A1 | 9/2014 | Kuroda et al. |
| 2015/0020081 A1 | 1/2015 | Cho et al. |
| 2015/0084892 A1 | 3/2015 | Shirota et al. |
| 2015/0089974 A1 | 4/2015 | Seo et al. |
| 2015/0124566 A1 | 5/2015 | Lake et al. |
| 2015/0131222 A1 | 5/2015 | Kauhaniemi et al. |
| 2015/0162751 A1 | 6/2015 | Leabman et al. |
| 2015/0169011 A1 | 6/2015 | Bibl et al. |
| 2015/0185766 A1 | 7/2015 | Otsuka et al. |
| 2015/0185944 A1 | 7/2015 | Magi et al. |
| 2015/0227245 A1 | 8/2015 | Inagaki et al. |
| 2015/0333572 A1 | 11/2015 | Leabman |
| 2015/0334069 A1 | 11/2015 | Winston et al. |
| 2015/0378391 A1 | 12/2015 | Huitema et al. |
| 2015/0381793 A1 | 12/2015 | Cerda et al. |
| 2016/0014919 A1 | 1/2016 | Huitema et al. |
| 2016/0019703 A1 | 1/2016 | Tian |
| 2016/0034742 A1 | 2/2016 | Kim et al. |
| 2016/0037625 A1 | 2/2016 | Huitema et al. |
| 2016/0041581 A1 | 2/2016 | Piccionelli et al. |
| 2016/0041680 A1 | 2/2016 | Chi et al. |
| 2016/0062410 A1 | 3/2016 | Ko et al. |
| 2016/0142863 A1 | 5/2016 | Lam |
| 2016/0212837 A1 | 7/2016 | Kim |
| 2016/0277891 A1 | 9/2016 | Dvortsov et al. |
| 2016/0283086 A1 | 9/2016 | Inagaki et al. |
| 2016/0299570 A1 | 10/2016 | Davydov |
| 2016/0322745 A1 | 11/2016 | Shedletsky et al. |
| 2016/0360618 A1 | 12/2016 | Elsherbini et al. |
| 2016/0379205 A1 | 12/2016 | Margadoudakis |
| 2017/0046931 A1 | 2/2017 | Hartweg et al. |
| 2017/0052749 A1 | 2/2017 | Lee |
| 2017/0235341 A1 | 8/2017 | Huitema et al. |
| 2017/0236497 A1 | 8/2017 | Huitema et al. |

FOREIGN PATENT DOCUMENTS

| | | |
|---|---|---|
| CN | 101180864 A | 5/2008 |
| CN | 101796563 A | 8/2010 |
| CN | 102486906 A | 6/2012 |
| CN | 202311570 U | 7/2012 |
| CN | 103021277 A | 4/2013 |
| DE | 202006012076 U1 | 10/2006 |
| EP | 1599110 A1 | 11/2005 |
| EP | 2551110 A1 | 1/2013 |
| FR | 2284149 A1 | 4/1976 |
| JP | 2002-278466 A | 9/2002 |
| JP | 2003-299238 A | 10/2003 |
| JP | 2008-026710 A | 2/2008 |
| JP | 2008-275114 A | 11/2008 |
| JP | 2009-110780 A | 5/2009 |
| JP | 2009-170173 A | 7/2009 |
| JP | 2010-508557 A | 3/2010 |
| JP | 2010-072380 A | 4/2010 |
| JP | 2010-159803 A | 7/2010 |
| JP | 2010-204377 A | 9/2010 |
| JP | 2013044293 A | 3/2013 |
| JP | 2013044294 A | 3/2013 |
| JP | 2013068292 A | 4/2013 |
| JP | 56-91704 B2 | 4/2015 |
| JP | 60-89448 B2 | 3/2017 |
| KR | 2011-0008118 U | 8/2011 |
| KR | 1256109 | 4/2013 |
| KR | 1278604 | 6/2013 |
| KR | 2013-0073331 A | 7/2013 |
| KR | 1301561 | 9/2013 |
| KR | 20150035232 A | 4/2015 |
| TW | 504127 U | 9/2002 |
| TW | M258364 U | 3/2005 |
| TW | M265636 U | 5/2005 |
| TW | 200815886 A | 4/2008 |
| TW | 201035934 A | 10/2010 |
| TW | 201301002 A | 1/2013 |
| TW | I383343 B | 1/2013 |
| WO | WO-00/25193 A2 | 5/2000 |
| WO | WO-01/64070 A1 | 9/2001 |
| WO | WO-2004/047059 A1 | 6/2004 |
| WO | WO-2006/027727 A1 | 3/2006 |
| WO | WO-2006/085271 A2 | 8/2006 |
| WO | WO-2006/090434 A1 | 8/2006 |
| WO | WO-2007/023406 A2 | 3/2007 |
| WO | WO-2007/042987 A1 | 4/2007 |
| WO | WO-2008/054206 A2 | 5/2008 |
| WO | WO-2012/156804 A1 | 11/2012 |
| WO | WO-2012/167204 A2 | 12/2012 |
| WO | WO-2013/138003 A1 | 9/2013 |
| WO | WO-2015/023804 A1 | 2/2015 |

OTHER PUBLICATIONS

Office Action for Taiwanese Application No. 103129521, dated Apr. 9, 2018.

First Office Action received in corresponding Chinese Application No. 2014/180076308.2 dated Jun. 29, 2018.

First Office Action received in corresponding Chinese Application No. 2014/80076314.8 dated Jun. 28, 2018.

"3M Flexible Transparent Touchscreen Concepts" video located on the Internet at <http://www.youtube.com/watch?v=kCZz4jFok_o> (uploaded Jan. 6, 2011).

"Amazin Concept Holo Computer Elodie Delassus", Art, Concepts, Design, Gadgets, downloaded from the Internet at: <http://designskings.com/amazin-concept-holo-computer-elodie-delassus/> (Jan. 18, 2012).

"Athletics and their supporters", Enlightened®: Illuminated Clothing by Janet Hansen, downloaded from the Internet at <http://enlighted.com/pages/athletics.shtml> (Aug. 8, 2013).

"E-Clock", Tokyoflash Japn Product Design Studio, downloaded from the Internet at <http://blog.tokyoflash.com/2010/03/e-clock/> (Mar. 10, 2010).

"Features", SEG Sports Entertainment Gear, downloaded from the Internet at <http://www.segshirts.com/features> (Aug. 8, 2013).

"Flex Mobile, a Flexible Phone That Becomes a Bracelet, Some Other Wearable Piece of Gear", Concept Phones, downloaded from the Internet at <http://www.concept-phones.com/tag/carolina-rebelo/> (Apr. 19, 2011).

"Flexible Smart Phone Fluid Presented by Philips", YouTube, downloaded from the Internet at <http://www.youtube.com/watch?v-Wq9montNgbM&feature=player_detailpage> (Apr. 2, 2012).

"IPING Putter App Cradle Attachment Case for iPhone 5", Carlsbad Golf Center, downloaded from the Internet at <https://www.cgcgolfshop.com/p-50-iping-putter-app-cradle-attachment-case-for-iphone-5.aspx> (Aug. 8, 2013).

"Moment Smartwatch: World's First Wrap Around Smart Watch," Momentum Labs LLC, 28 pp. (Jun. 24, 2014).

"OutEDGE iPhone 5 External 2800 mAH Battery Extender Case w/ Flip Screen Cover", outEDGEPOWER Products, downloaded from the Internet at <http://www.outedgepower.com/outedge-iphone-5-external-2800-mah-battery-extender-case-w-flip-screen-coved> (Aug. 8, 2013).

(56) References Cited

OTHER PUBLICATIONS

"Philips unveils world's first 'Rollable Display' pocket e-Reader concept READIUS", phys.org website(Sep. 1, 2005).
"Rohm shows a flexible-OLED wristband", OLED-Info.com, downloaded from the Internet at <http://www.oled-info.com/rohm-shows-flexible-oled-wristband> (Oct. 5, 2009).
"Samsung concept video for wearables and phones", YouTube screenshot, downloaded from the Internet at <http://www.youtube.com/watch?v=ezriwGwJGOs> (Jul. 15, 2013).
"Samsung Galaxy X Concept Packs the Same Specs of teh Galaxy S II Plus a 12 MP Camera", Concept Phones website (May 15, 2011).
"Samsung Smart Watch Trademarks Filed, Wearable Internet Nearing Debut", Fox News Latino, downloaded from the Internet at <http://latino.foxnews.com/latino/money/2013/08/07/samsung-smart-watch-trademarks-filed-wearable-internet-nearing-debut/> (Aug. 7, 2013).
"Sony Smartwatch 2 goes official: water-resistant, open API", phoneArena.com, downloaded from the Internet at <http://www.phonearena.com/news/Sony-Smartwatch-2-goes-official-water-resistant-open-API_id44469> (Jun. 25, 2013).
"Taiwan Company to Begin Production of Large Format Flexible Electronic Paper Display Technology", Over the Wire, downloaded from the Internet at <http://www.naylornetwork.com/ppi-otw/articles/?aid=219054&issueID=29119> (Aug. 8, 2013).
"Thermal Image Athletic Apparel", Trendhunter Lifestyle, downloaded from the Internet at <http://www.trendhunter.com/trends/high-tech-athletic-apparel> (Mar. 16, 2013).
"Wearable Concept Phone is Not Nokia 888", Concept Phones, downloaded from the Internet at <http://www.concept-phones.com/tag/hyun-sung-lee/> (Jul. 18, 2008).
"What Will You Pop'?", popSLATE, downloaded from the Internet at <http://www.popslate.com> (2012).
"Yuno Concept", TechPin, downloaded from the Internet at <http://www.techpin.com/yuno-concept/> (May 8, 2008).
Catacchio, "New OLED panel to bring bendable cell phones closer to reality?", TNW, downloaded from the Internet at <http://thenextweb.com/asia/2010/10/04/new-oled-panel-to-bring-bendable-cell-phones-closer-to-reality/> (Oct. 4, 2010).
Cochrane et al., "Flexible displays for smart clothing: Part I—Overview", Indian Journal of Fibre & Textile Research, 36:422-8 (Dec. 2011).
Cooper, "Hands-on with Polymer Vision's e-ink Readius", engadget, downloaded from the Internet at <http://www.engadget.com/2008/02/14/hands-on-with-polymer-visions-e-ink-readius/> (Feb. 14, 2008).
Crisp, "Rafael Nadal demonstrates Babolat Play & Connect interactive tennis racquet", gizmag, downloaded from the Internet at <http://www.gizmag.com/rafael-nadal-demonstrates-babolat-play--connect-interactive-tennis-racquet/22699/> (May 26, 2012).
Eaton, "Nokia Morph Cellphone Rolls Up, Stretches, Cleans Itself", Gizmodo, downloaded from the Internet at <http://gizmodo.com/360260/nokia-morph-cellphone-rolls-up-stretches-cleans-itself> (Feb. 25, 2008).
Extended European Search Report for Application No. 14874426.1, dated Aug. 11, 2017.
Extended European Search Report for Application No. 14875486.4, dated Sep. 19, 2017.
Fingas, "Tentative Samsung smartwatch design unearthed in Korean patents", engadget, downloaded from the Internet at <http://www.engadget.com/2013/08/03/tentative-samsung-smartwatch-designs-unearthed-in-korean-patents/> (Aug. 3, 2013).
First Chinese Office Action for Application No. 201480058291.8, dated Jul. 31, 2017.
Honig, "Pebble smartwatch review", engadget, downloaded from the Internet at <http://www.engadget.com/2013/01/25/pebble-smartwatch-review/> (Jan. 25, 2013).
Inofuentes, "Officially announced: LG G Flex and a healing factor", ars technica, downloaded from the Internet at <http://arstechnica.com/gadgets/2013/10/officially-announced-lg-g-flex-and-a-healing-factor/> (Oct. 28, 2013).

International Preliminary Report on Patentability for Application No. PCT/US2016/019729, dated Sep. 8, 2017.
International Preliminary Report on Patentability, International Application No. PCT/US14/50972, dated Jan. 19, 2016.
International Preliminary Report on Patentability, International Application No. PCT/US14/52814, dated Mar. 1, 2016.
International Preliminary Report on Patentability, International Application No. PCT/US14/52957, dated Mar. 1, 2016.
International Preliminary Report on Patentability, International Application No. PCT/US14/55043, dated Mar. 15, 2016.
International Search Report and Written Opinion for Application No. PCT/US2016/019729, dated May 17, 2016.
International Search Report and Written Opinion, International Application No. PCT/US14/50972, dated Jan. 14, 2015.
International Search Report and Written Opinion, International Application No. PCT/US14/52814, dated Dec. 11, 2014.
International Search Report and Written Opinion, International Application No. PCT/US14/52957, dated Dec. 9, 2014.
International Search Report and Written Opinion, International Application No. PCT/US14/71859, dated Mar. 20, 2015.
International Search Report and Written Opinion, International Application No. PCT/US14/72172, dated Mar. 18, 2015.
International Search Report and Written Opinion, International Application No. PCT/US2014/055043, dated Jan. 27, 2015.
International Search Report and Written Opinion, International Application No. PCT/US2014/072313, dated Apr. 22, 2015.
International Search Report and Written Opinion, International Application No. PCT/US2014/072328, dated Apr. 22, 2015.
International Search Report and Written Opinion, International Application No. PCT/US2015/014964, dated May 14, 2015.
International Search Report and Written Opinion, International Application No. PCT/US2015/022691, dated Jul. 8, 2015.
International Search Report and Written Opinion, International Application No. PCT/US2015/026163, dated Jul. 20, 2015.
International Search Report and Written Opinion, International Application No. PCT/US2015/030254, dated Aug. 10, 2015.
International Search Report and Written Opinion, International Application No. PCT/US2015/030724, dated Aug. 14, 2015.
International Search Report and Written Opinion, International Application No. PCT/US2015/032799, dated Aug. 31, 2015.
Johan, "ASUS Waveface Ultra", techfresh.net, downloaded from the Internet at <http://www.techfresh.net/asus-waveface-ultra/> (Jan. 19, 2010).
Kahn, "Is Apple's iWatch a slap wrist band with a flexible display?", 9to5Mac Apple Intelligence, downloaded from the Internet at <http://9to5mac.com/2013/02/21/is-apples-iwatch-a-slap-wrist-band-with-a-flexible-display/> (Feb. 21, 2013).
Kaki, "10 Beautiful Nokia Concept Phones for Future Generations", DreamsRain website, downloaded from the Internet at <http://www.dreamsrain.com/2011/09/18/10-beautiful-nokia-concept-phones-for-future-genrations/> (Sep. 18, 2011).
Kelvin, "Apple iBand Envisioned by T3: Health Features, Fitness and Watch Functions (Video)", Concept Phones, downloaded from the Internet at <http://www.concept-phones.com/apple/apple-iband-envisioned-t3-health-features-fitness-watch-functions-video/> (Feb. 18, 2014).
Kelvin, "Apple iWatch 2 Concept by Jermaine Smit Lets You Change the Watch Bracelet Easily (Video)", Concept Phones, downloaded from the Internet at <http://www.concept-phones.com/apple/apple-iwatch-2-concept-jermaine-smit-lets-change-watch-bracelet-easily-video/> (Mar. 5, 2014).
Kelvin, "Apple iWatch Concept Goes Back to Basics, Looks Like Nike Fuelband", Concept Phones, downloaded from the Internet at <http://www.concept-phones.com/apple/apple-iwatch-concept-basics-nike-fuelband/> (Oct. 22, 2013).
Kelvin, "Apple iWatch Glass Hologram is an Overpowered Smartwatch (Video)", Concept Phones, downloaded from the Internet at <http://www.concept-phones.com/apple/apple-iwatch-glass-hologram-overpowered-smartwatch-video/> (Apr. 19, 2014).
Kelvin, "Apple iWatch Goes Back to the Idea of an iPod Nano With a Belt", Concept Phones, downloaded from the Internet at <http://www.concept-phones.com/apple/apple-iwatch-idea-ipod-nano-belt/> (Mar. 2, 2014).

(56) References Cited

OTHER PUBLICATIONS

Kelvin, "Finally, a HTC Smartwatch! We Needed Those!", Concept Phones, downloaded from the Internet at <http://www.concept-phones.com/htc/finally-htc-smartwatch-needed/> (Feb. 4, 2014).
Kelvin, "Flexible Screen X Phone Becomes a Bracelet", Concept Phones, downloaded from the Internet at <http://www.concept-phones.com/cool-concepts/flexible-screen-phone-bracelet/> (Oct. 28, 2013).
Kelvin, "HTC One Watch Render Seems Taken out of Tron", Concept Phones, downloaded from the Internet at <http://www.concept-phones.com/htc/htc-watch-render-tron/> (Oct. 14, 2013).
Kelvin, "iPhone 6 and iWatch Pro Get Designed by Dani Yako", Concept Phones, downloaded from the Internet at <http://www.concept-phones.com/apple/iphone-6-iwatch-pro-designed-dani-yako/> (Jun. 6, 2014).
Kelvin, "iWatch Concept is a Curved Bracelet, Runs Flappy Bird", Concept Phones, downloaded from the Internet at <http://www.concept-phones.com/apple/iwatch-concept-curved-bracelet-runs-flappy-bird/> ( Feb. 13, 2014).
Kelvin, "iWatch Goliath is a Giant on Your Wrist (Video)", Concept Phones, downloaded from the Internet at <http://www.concept-phones.com/apple/iwatch-goliath-giant-wrist-video/> (May 23, 2014).
Kelvin, "iWatch Render Goes the Way of the Nike FuelBand", Concept Phones, downloaded from the Internet at <http://www.concept-phones.com/apple/iwatch-render-nike-fuelband/> (Jan. 21, 2014).
Kelvin, "Meizu MWatch Render is Exactly What Smartwatches Need", Concept Phones, downloaded from the Internet at <http://www.concept-phones.com/cool-concepts/meizu-mwatch-render-smartwatches/> (Feb. 12, 2014).
Kelvin, "MWC 2014: Kyocera Showcases Flexible Phone That Turns Into Bracelet", Concept Phones, downloaded from the Internet at <http://www.concept-phones.com/kyocera/mwc-2014-kyocera-showcases-flexible-phone-turns-bracelet/> (Feb. 27, 2014).
Kelvin, "New Apple iWatch Render Shows us an Ultrathin Bracelet", Concept Phones, downloaded from the Internet at <http://www.concept-phones.com/apple/apple-iwatch-render-shows-ultrathin-bracelet/> (Oct. 16, 2013).
Kelvin, "New iWatch Design Brings Us Back the Basics of a Watch", Concept Phones, downloaded from the Internet at <http://www.concept-phones.com/apple/iwatch-design-brings-basics-watch/> (Apr. 29, 2014).
Kelvin, "Nokia Lumia 101 Smartwatch is a Nice Little, Elegant Bracelet", Concept Phones, downloaded from the Internet at <http://www.concept-phones.com/nokia/nokia-lumia-101-smartwatch-nice-elegant-bracelet/> (Dec. 3, 2013).
Kelvin, "Superb Google Smartwatch Render Created in Cinema 4D", Concept Phones, downloaded from the Internet at <http://www.concept-phones.com/google/superb-google-smartwatch-render-created-cinema-4d/> (Jan. 31, 2014).
Kim,"Analysis of iWatch-related Patents from RitFast", IHS Technology, downloaded from the Internet at <http://www.displaybank.com/letter/letter_contents.php?nm=&email=prakash%40polyera.com&mail_id=8995> (Jul. 19, 2013).
Lilienthal, "Book? Accordian? Nope. Lumino is a Gorgeous LED Lamp the Goes Wherever You Do," Digital Trends, 6 pp. (Apr. 27, 2014).
Non-Final Office Action from U.S. Appl. No. 14/188,440 dated Aug. 14, 2015.
Office Action for U.S. Appl. No. 15/054,725, dated Aug. 23, 2017.
Rastogi, "Nokia Lumia 1080: The Concept Phone", 91 mobiles, downloaded from the Internet at <http://www.91mobiles.com/blog/nokia-lumia-1080-the-concept-phone.html> (Jun. 27, 2013).
Ridden, "Emopulse Smile SmartWatch goes up for pre-order", Gizmag,downloaded from the Internet at <http://www.gizmag.com/emopulse-smile-smartwatch/27984/> (Jun. 19, 2013).
Seth, "In 2020 We Can Wear Sony Computers on our Wrist", Yanko Design Form Beyond Function, downloaded from the Internet at <http://www.yankodesign.com/2010/05/25/in-2020-we-can-wear-sony-computers-on-our-wrist/> (May 25, 2010).
Seth, "Love This iWatch!", Yanko Design Form Beyond Function, downloaded from the Internet at <http://www.yankodesign.com/2013/07/26/love-this-iwatch/> (Jul. 26, 2013).
Seth, "My Latest Fashion Accessory", Yanko Design Form Beyond Function, downloaded from the Internet at <http://www.yankodesign.com/2009/08/11/my-latest-fashion-accessory/> (Aug. 11, 2009).
Seth, "Super Sexy Roll", Yanko Design Form Beyond Function, downloaded from the Internet at <http://www.yankodesign.com/2011/03/21/super-sexy-roll/> (Mar. 21, 2011).
Smith, "Flexi E Ink screen finds home in curved world time watch", The Register, downloaded from the Internet at <http://www.theregister.co.uk/2010/10/11/phosphor_watches_world_time/> (Oct. 11, 2010).
Smith, "Samsung smartwatch concept shown in patent hints at flexible display use", Android Authority (Aug. 3, 2013).
Smith, "Samsung's curved smartphone is the Galaxy Round, launches in Korea tomorrow (video)", engadget, downloaded from the Internet at <http://www.engadget.com/2013/10/08/samsung-galaxy-round/> (Oct. 8, 2013).
Thrystan, "Apple iWatch 2 Design Appears, More Elegant Than Ever", Concept Phones, downloaded from the Internet at <http://www.concept-phones.com/apple/apple-iwatch-2-design-appears-elegant/> (Feb. 9, 2012).
Thrystan, "BenQ Siemens Snake Concept Phone is Yet Another Bracelet-Handset", Concept Phones, downloaded from the Internet at <http://www.concept-phones.com/benq-siemens/benq-siemens-snake-concept-phone-bracelethandset/> (Feb. 9, 2009).
Thrystan, "Bracelet Phone Concept Incorporates an MP3 Player, Shines Like a Diamond", Concept Phones, downloaded from the Internet at <http://www.concept-phones.com/fashion-phones/bracelet-phone-concept-incorporates-mp3-player-shines-diamond/> (Sep. 8, 2008).
Thrystan, "CEATEC 2010 Hosts TDK's Flexible OLED Displays; Hands-on Photos Here!", Concept Phones, downloaded from the Internet at <http://www.concept-phones.com/news/ceatec-2010-hosts-tdks-flexible-oled-displays-handson-photos/> (Oct. 5, 2010).
Thrystan, "Dyson Concept Phone Charger Turns Temperature Differences Into Electricity", Concept Phones, downloaded from the Internet at <http://www.concept-phones.com/cool-concepts/dyson-concept-phone-charger-turns-temperature-differences-electricity/> (Jul. 24, 2009).
Thrystan, "Email Beeper Watch is Hip, Restarts a Trend", Concept Phones, downloaded from the Internet <http://www.concept-phones.com/cool-concepts/email-beeper-watch-hip-restarts-trend/> (Mar. 3, 2009).
Thrystan, "Flux, Portable and Wearable PC Concept", Concept Phones, downloaded from the Internet at <http://www.concept-phones.com/eco-friendly/flux-portable-and-wearable-pc-concept/> (May 5, 2008).
Thrystan, "Fujitsu Concept Phones Part 2: Judge-Dredd-Like Curvy Handset", Concept Phones, downloaded from the Internet <http://www.concept-phones.com/fujitsu/fujitsu-concept-phones-part-2-judgedreddlike-curvy-handset/> (Oct. 10, 2009).
Thrystan, "iPhone 5 Bracelet Looks Out of this World", Concept Phones, downloaded from the Internet at <http://www.concept-phones.com/apple/iphone-5-bracelet-world/> (Jul. 6, 2012).
Thrystan, "iPhone Holographic Display Concept is Surreal, Could Work", Concept Phones, downloaded from the Internet at <http://www.concept-phones.com/apple/iphone-holographic-display-concept-surreal-work/> (Aug. 22, 2009).
Thrystan, "iWatch Design Created by James Ivaldi is All Metal", Concept Phones, downloaded from the Internet at <http://www.concept-phones.com/apple/iwatch-design-created-james-ivaldi-metal/> (Jul. 29, 2013).
Thrystan, "iWatch Render in the Vision of the Ciccarese Design Team: Simply Stunning (Video)", Concept Phones, downloaded from the Internet at <http://www.concept-phones.com/apple/iwatch-render-vision-ciccarese-design-team-simply-stunning-video/> (Aug. 21, 2013).
Thrystan, "Leaf Phone Features an Organic Structure, is Made of Eco-Friendly Plastic," Concept Phones, downloaded from the Internet at <http://www.concept-phones.com/eco-friendly/leaf-phone-features-organic-structure-ecofriendly-plastic/> (Nov. 4, 2009).

(56) References Cited

OTHER PUBLICATIONS

Thrystan, "LG Auki Bracelet Phone is Colorful and Elegant", Concept Phones, downloaded from the Internet at <http://www.concept-phones.com/lg/lg-auki-bracelet-phone-colorful-elegant/> (Aug. 26, 2011).
Thrystan, "LG Helix Cellphone is Also a Slap Bracelet", Concept Phones, downloaded from the Internet at <http://www.concept-phones.com/lg/lg-helix-cellphone-slap-bracelet/> (Oct. 9, 2009).
Thrystan, "LG Oyster, a Bracelet-Like Mobile Phone Design", Concept Phones, downloaded from the Internet at <http://www.concept-phones.com/lg/lg-oyster-braceletlike-mobile-phone-design/> (Jul. 26, 2009).
Thrystan, "New iWatch Render by Tolga Tuncer is Fancy and Classy", Concept Phones, downloaded from the Internet at <http://www.concept-phones.com/apple/iwatch-render-tolga-tuncer-fancy-classy/> (Mar. 3, 2013).
Thrystan, "Nokia Mixed Reality Concept, Future Technology Demoed at Nokia World (Video)", Concept Phones, downloaded from the Internet at <http://www.concept-phones.com/nokia/nokia-mixed-reality-concept-future-technology-demoed-nokia-world-video/> (Sep. 9, 2009).
Thrystan, "Nokia Open Bracelet Shows Incoming Calls of the Ones You Love", Concept Phones, downloaded from the Internet at <http://www.concept-phones.com/nokia/nokia-open-bracelet-shows-incoming-calls-love/> (Dec. 13, 2008).
Thrystan, "Nokia Smart Watch Concept Looks Interesting", Concept Phones, downloaded from the Internet at <http://www.concept-phones.com/uncategorized/nokia-smart-watch-concept-interesting/> (Oct. 22, 2011).
Thrystan, "Purse Bracelet Fancy Concept Phone, Designed by Yw Li", Concept Phones, downloaded from the Internet at <http://www.concept-phones.com/fashion-phones/purse-bracelet-fancy-concept-phone-designed-yw-li/> (Oct. 19, 2008).
Thrystan, "Quartz Tele Concept Should be in a Final Fantasy Game, Because Its All About Crystals", Concept Phones, downloaded from the Internet at <http://www.concept-phones.com/fashion-phones/quartz-tele-concept-final-fantasy-game-crystals/> (Sep. 8, 2008).
Thrystan, "Samsung Finger Touching Cellphone Concept Comes in Handy", Concept Phones, downloaded from the Internet at <http://www.concept-phones.com/samsung/samsung-finger-touching-cellphone-concept-handy/> (Jan. 31, 2009).
Thrystan, "Samsung Futuristic Technology Relies on Health and Flexibility (Video)", Concept Phones, downloaded from the Internet at <http://www.concept-phones.com/samsung/samsung-futuristic-technology-relies-health-flexibility-video/> (Jul. 10, 2013).
Thrystan, "Samsung S-Health Bracelet Render is Based on Tizen OS", Concept Phones, downloaded from the Internet at <http://www.concept-phones.com/samsung/samsung-shealth-bracelet-render-based-tizen-os/> (Jun. 17, 2013).
Thrystan, "Sony Ericsson Bracelet Phone, a Design That Won't Make it Into Production", Concept Phones, downloaded from the Internet at <http://www.concept-phones.com/sony-ericsson/sony-ericsson-bracelet-phone-design-production/> (Jun. 19, 2009).
Thrystan, "Sony Ericsson Ring Phone Concept by Tao Ma Will Always Be a Winner", Concept Phones, downloaded from the Internet at <http://www.concept-phones.com/sony-ericsson/sony-ericsson-ring-phone-concept-tao-ma-winner/> (Sep. 15, 2008).
Thrystan, "Speak to Me Concept Watch Phone is Hot, a Must-Have Fashion Accessory", Concept Phones, downloaded from the Internet at <http://www.concept-phones.com/fashion-phones/speak-concept-watch-phone-hot-musthave-fashion-accessory/> (Jan. 27, 2009).
Thrystan, "The Hook Bracelet Phone Concept Runs Windows Phone in a New Format", Concept Phones, downloaded from the Internet at <http://www.concept-phones.com/cool-concepts/hook-bracelet-phone-concept-runs-windows-phone-format/> (Jun. 21, 2013).
Thrystan, "The New iPod is iBangle . . . iLike iT", Concept Phones, downloaded from the Internet at <http://www.concept-phones.com/apple/ipod-ibangle-ilike/> (Oct. 23, 2008).
Thrystan, "Xbox 720 Concept is a Pyramid With Two Kinect "Eyes"", Concept Phones, downloaded from the Internet at <http://www.concept-phones.com/microsoft/xbox-720-concept-pyramid-kinect-eyes/> (Jul. 8, 2013).
Thrystan, "Yuxa is a Wearable Cellphone Made From Eco-Friendly Materials", Concept Phones, downloaded from the Internet at <http://www.concept-phones.com/eco-friendly/yuxa-wearable-cellphone-ecofriendly-materials/> (Jun. 24, 2010).
Thrystan, "ZTE Cube Phone, Another Mobile World Congress Concept", Concept Phones, downloaded from the Internet at <http://www.concept-phones.com/cool-concepts/zte-cube-phone-another-mobile-world-congress-concept/> (Feb. 14, 2008).
Vertegaal et al., "Organic User Interfaces have non-planar displays that may actively or passively change shape via analog physical inputs", Organic User Interfaces—Communications of the ACM (May 31, 2008).
Wei et al., Shape memory materials and hybrid composites for smart systems, Part II: Shape-memory hybrid composites, J. Mater. Sci., 33:3763-83 (1998).
European Office Action for Application No. 14875752.9, dated Sep. 19, 2018.
First Office Action received in corresponding Chinese Application No. 2014/80076264.3 dated May 28, 2018.
Notice of Reasons for Rejection for Japanese Application No. 2016-543044, dated Oct. 30, 2018.
Office Action for Taiwanese Application No. 103145225, dated Jan. 7, 2019.
Office Action for Taiwanese Application No. 103145253, dated Aug. 2, 2018.
Second Chinese Office Action for Application No. 201480058291.8, dated Jun. 1, 2018.
Third Chinese Office Action for Application No. 201480058291.8, dated Jan. 14, 2019.
European Office Action for Application No. 14874426.1, dated Mar. 7, 2019.
Notice of Reasons for Rejection for Japanese Application No. 2016-542913, dated Feb. 27, 2019.
Second Chinese Office Action for Application No. 201480076308.2, dated Mar. 11, 2019.
Second Chinese Office Action for Application No. 201480076314.8, dated Mar. 11, 2019.
Office Action for Taiwanese Application No. 103145254, dated Mar. 18, 2019.
European Office Action for Application No. 14875486.4, dated Apr. 25, 2019.
First Chinese Office Action for Application No. 201480056371.X, dated Apr. 3, 2019.
Office Action for Taiwanese Application No. 103127788, dated Mar. 7, 2019.
Notice of Reasons for Rejection for Japanese Application No. 2016-543044, dated May 29, 2019.
Office Action for Taiwanese Application No. 104109785, dated Jul. 12, 2019.
European Office Action for Application No. 14875486.4, dated Mar. 25, 2020.
European Office Action for Application No. 14875752.9, dated Mar. 25, 2020.
Notice of Final Rejection for Japanese Application No. 2016-542913, dated Oct. 29, 2019.
Second Chinese Office Action for Application No. 201480056371.X, dated Apr. 2, 2020.
Notice of Reasons for Rejection for Japanese Application No. 2020-034700, dated Mar. 15, 2021.
Notice of Preliminary Rejection for Korean Application No. 2016-7020269, dated Apr. 6, 2021.

* cited by examiner

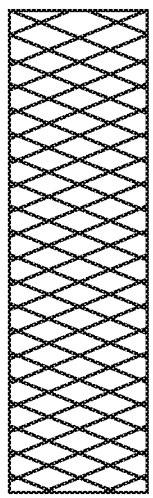
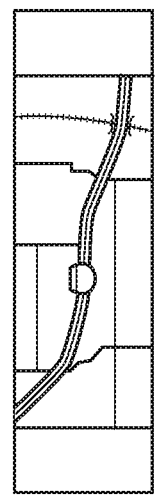
*FIG. 22A*  *FIG. 22B*  *FIG. 22C*  *FIG. 22D*  *FIG. 22E*
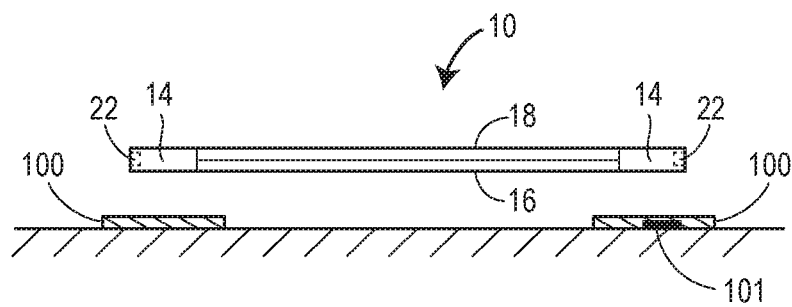
*FIG. 23*
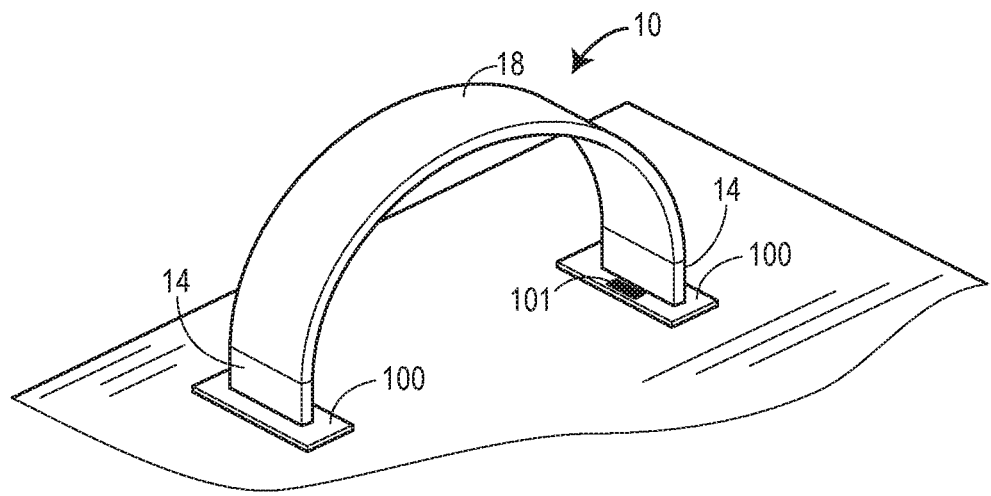
*FIG. 24*

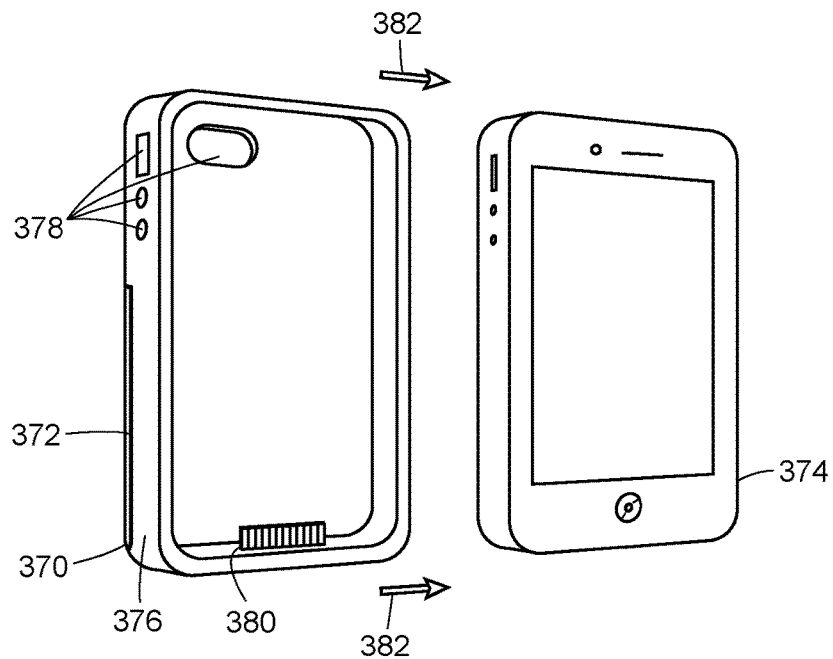
FIG. 46
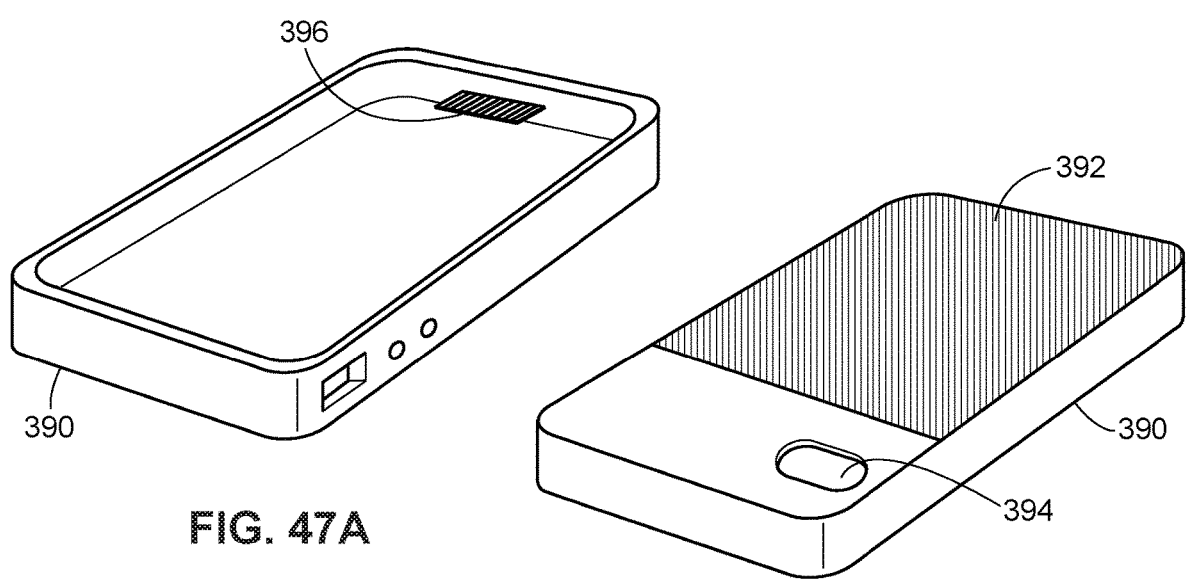
FIG. 47A
FIG. 47B

OPTIMIZATION OF ELECTRONIC DISPLAY AREAS

RELATED APPLICATIONS

This application is a continuation application of International Patent Application No. PCT/US2014/050972 filed Aug. 13, 2014, which claims priority to and the benefit of the filing dates of: U.S. Provisional Patent Application No. 61/865,492, entitled "INTEGRAL DISPLAYS WITH MAXIMAL SURFACE COVERAGE", which was filed on Aug. 13, 2013; U.S. Provisional Patent Application No. 61/870,781, entitled "ARTICLE OR DEVICE WITH AN INTEGRAL FLEXIBLE DISPLAY", which was filed on Aug. 27, 2013; U.S. Provisional Patent Application No. 61/876,181, entitled "ARTICLE OR DEVICE WITH AN INTEGRAL FLEXIBLE DISPLAY AND NATURAL MESSAGING ROUTINE", which was filed on Sep. 10, 2013; U.S. Provisional Patent Application No. 61/920,705, entitled "DYNAMICALLY FLEXIBLE ARTICLE OR DEVICE HAVING AN INTEGRAL FLEXIBLE DISPLAY", which was filed on Dec. 24, 2013; U.S. Provisional Patent Application No. 61/952,005, entitled "EDGE MINIMIZATION OF A FLEXIBLE ELECTRONIC DISPLAY", which was filed on Mar. 12, 2014; and U.S. Provisional Patent Application No. 62/012,949, entitled "EDGE MINIMIZATION OF A FLEXIBLE ELECTRONIC DISPLAY", which was filed on Jun. 16, 2014. The entire disclosure of each of these applications is hereby expressly incorporated by reference herein for all uses and purposes.

TECHNICAL FIELD

This application relates generally to electronic displays, and more particularly to optimization of display areas of electronic displays.

BACKGROUND

Electronic displays are commonly installed within hard surfaces of electronic devices, such as computer screens, television sets, smart phones, tablet computers, etc., and in many cases are installed on accessories for the electronic devices, such as removable monitors. Many electronic devices having an electronic display are portable, and have thus become very useful in implementing mobile applications. This fact is particularly true with smart phones which have become ubiquitous. However, unfortunately, typical mobile devices such as smart phones have electronic displays that are rigid (and in some cases, flat) in nature. Thus, while these displays are useful in implementing many different applications, the device on which the display is present must still typically be held in a hand, or must be stored in a pocket, a purse, a briefcase or other container, which makes the electronic device less accessible in many situations, such as when a person is carrying other items, undertaking an athletic activity such as running, walking, etc. Moreover, in many cases these traditional electronic devices require two free hands to hold and operate, making these devices cumbersome or difficult to use or to view in situations in which, for example, a person has only one or no free hands or is otherwise occupied.

Flexible displays are generally known and are starting to come into more common usage, however, flexible displays have not been widely incorporated into easily portable items such as items of clothing, wristbands, jewelry, etc. or on items that are easily attached to other items, much less in a manner that makes the display more useable and visible to the user in many different scenarios.

Further, in electronic displays, display areas in which text and/or image content is presented are typically surrounded by thick, opaque borders under which electronic connections to the display elements are hidden from view. As such, a significant percentage of the viewable area or surface is not used to display text and/or image content.

SUMMARY

The present application is generally directed to displays with optimized display areas, and to articles or devices having such displays. The techniques, systems, methods, and apparatuses described herein pertain to articles or devices that maximize an amount of a display area used to present text and/or images on one or more surfaces of the article (e.g., a "viewable" portion of the display or "viewable display area"), and/or that minimize the area of the edges or borders surrounding the display area on the viewable surface(s) of the article. Maximizing the amount of display area and/or minimizing the area of the edges or borders surrounding the display area may include bending or folding one or more portions of the display, and/or may include particularly arranging the configuration of the connections to elements of the display, as will be described in more detail below.

As an initial matter, though, it is noted that while the techniques, systems, methods, and apparatuses described herein are discussed with respect to electronic displays for illustrative purposes, any or all of said techniques, systems, methods, and apparatuses are not limited to being applied to only electronic displays. Further, any or all of said techniques, systems, methods, and/or apparatuses described herein are easily applied to other types of electronic sheets that emit or actively generate energy, such as lighting arrays. Additionally or alternatively, any or all of said techniques, systems, methods, and/or apparatuses described herein are easily applied to electronic sheets that receive (e.g., passively receive) and/or detect energy or other information, such as solar cell arrays, sensor arrays, etc., or to any type of electronic sheets that have sets or arrays of electronic elements. Moreover, any or all of the techniques, systems, methods, and apparatuses described herein are applicable to rigid electronic sheets (e.g., in a flat or statically flexed position), and/or to dynamically flexible electronic sheets.

Generally, an example electronic display to which one or more of the techniques, systems, methods, and apparatuses described herein may be applied is fabricated using any desired electronic display material, such as any of various suitable plastics. The electronic display may be inflexible or rigid, and formed in either a flat or statically flexed position. Alternatively, the electronic display may be dynamically flexible. With regard to statically flexed and dynamically flexible displays (which are collectively and categorically referred to herein as "flexible electronic displays" or "flexible displays"), such flexible electronic displays may be manufactured as a displays that have display elements (e.g., pixel elements) disposed on separate frontplane and backplane substrates, if desired. Typically, the backplane substrate of a flexible display is formed of flexible material. The frontplane substrate may be formed of the same or different flexible material, or may be formed of inflexible material. In some cases, such as in the case in which e-paper is used as a flexible display, a separate layer of material may be disposed between the frontplane and the backplane materials to form the pixel elements, e.g., as an adhesive layer of the frontplane. In any case, these substrate materials may be placed together to form the flexible electronic display, which may then be disposed on or proximate to a support.

The support for the electronic display may be inflexible or rigid (e.g., to maintain the flexible display in a flat or statically-flexed position), or the support may be dynamically flexible (e.g., a leather support, a bendable metal support, etc. to allow the flexible display to be dynamically flexed or curved during use). Thus, a display support for a dynamically flexible display whose display area is optimized may itself be dynamically flexible. In some configurations, the dynamically flexible support may limit the maximum, dynamic bending radius of the dynamically flexible display (e.g., in longitudinal and/or torsional directions) so that the display is not permitted to flex to a degree at which its operation may be compromised. Indeed, the dynamically flexible support may incorporate various types of structures to protect the flexible display by, for example, limiting the possible types of motion that the flexible display can undergo. These types of structures can, for example, include a set of transverse bars, stays or stints disposed in or on the flexible support to limit the torsional motion of the flexible support to thereby prevent damage to the flexible display due to torsional bending of the flexible display. In a similar manner, one or more bending limiting structure elements may be configured within the flexible support to limit the bending motion of the flexible support around either a longitudinal axis of the device or about a transverse axis of the device. Such structures thus prevent flexing of the flexible display in one or more directions so as to prevent damage to the flexible display from bending motions that might delaminate, buckle, crack or otherwise damage the various layers of the flexible display. Still further, the flexible support may include a raised edge or ridge formed of, for example, a metal wire or other material that is disposed along the edges of the flexible display to prevent or limit damage to the flexible display by impacts at the edge or side of the flexible display.

If desired, a dynamically flexible support for a flexible electronic display may include a series of rigid pieces of material interconnected with hinges, wherein the hinges limit bending of the flexible electronic display when disposed on the flexible support within the bending tolerance of the flexible electronic display. The rigid pieces of material may be disposed laterally along the article or device, and the hinges may include protrusions that interact to limit the range of bending motion of the hinge. Likewise, the flexible support may include a flexible material with rigid elements spaced laterally apart along the flexible material, and the rigid elements may operate to limit bending of the flexible support in the transverse direction of the band more than in the lateral direction of the article or device. Additionally, in some cases, the flexible support may have two portions disposed laterally adjacent to one another, wherein the first portion can be bent to a minimum radius of curvature that is different than the minimum radius of curvature to which the second portion can be bent.

On the other hand, a display support for a statically-flexed display whose display area is optimized may be essentially rigid in nature. In an embodiment, such a support includes a flat surface with one or more edges, and one or more other surfaces are congruent to the flat surface at respective edges. Each of the other surfaces is disposed in a respective plane different than the plane in which the flat surface is disposed. In some cases, two or more of the other surfaces are disposed in parallel planes. For example, a display support for a statically-flexed display may be a box, a case, a cover, or two walls meeting at a corner of a building or room, and the flexible display follows the contours of the display support across the different planes. In some configurations, at least one of the other surfaces is a curved surface.

For example, a display support for a statically-flexed display may be a cover or case for an electronic device such as a cell phone or smart device. The cover or case has a rectangular wall and two or more side walls connected to the first rectangular wall, so that the rectangular wall and the two or more side walls define a cavity, e.g., for accepting the electronic device. The case or cover may include an electrical connection element disposed in one of its side walls to engage the electronic device and/or to engage an external plug. The flexible display may be disposed so that at least part of the viewable display area of the flexible display is supported by the rectangular wall. In some cases, the flexible display is disposed so that at least part of the viewable display area of the flexible display is additionally or alternatively supported by one or more of the side walls.

Thus, an article or device that includes an electronic display with an optimized display area may also include a support for the display. The electronic display may be a flexible display, for example, and in an embodiment, the support for the flexible display is integrally rigid to support the display in a statically flexed position. In other embodiments, the support for the flexible display is dynamically flexible to allow the display to bend during use.

With particular regard to optimizing the display area of flexible displays, an article or device may be configured to present a maximal display area on one or more of its surfaces by being formed such that the edges or borders of the flexible display are bent or folded down or under the display area, so that lead lines, electrodes, connectors, or connecting lines that are used to energize the display area are bent or folded down or under the display area. In some cases, a display area may be maximized by bending the display to follow the contours of a display support across different curves and/or planes. Additionally or alternatively, to optimize a display area, a total number of lead lines or electrodes along each side of the display area may be selected and configured so as to minimize the size or area of the edges or borders surrounding or adjacent to the display area. Such configurations in which edges or borders of the display area are minimized may limit or reduce the size of an area on the upper or outer surface of the article at which no display pixels are located. For example, a width of the border of the flexible display, e.g., along a longitudinal side or along a transverse side, may have a cumulative width that is less than the width of an entirety of a set of lead lines or connectors disposed along that border and any spaces therebetween. Moreover, additionally or alternatively, to optimize a display area on an article or device, a flexible display may utilize pixels or display elements that share source lines and/or gate lines to minimize the edge width or area along the edges or borders of the flexible display.

In some cases, the article configured to optimize a display area includes one or more electronics modules for control of and/or communications to/from the article. In some configurations, the one or more electronics modules are self-contained and are attached to the display support. For ease of reading, the one or more electronics modules are referred to herein in the singular (i.e., "electronics module"), although it is understood that an article may include more than one electronics module.

The electronics module includes a processor for implementing applications or programming, such as an application or program to communicate with a display driver to drive the electronic display to display fixed or changeable messages, artwork, pictures, text, images, etc. The electronics module also includes a memory for storing non-transitory, computer-readable or computer-executable instructions corresponding to the applications or programming. For example, the instructions stored on the memory are executed by the processor to perform the applications or programming. Further, the memory of the electronics module may store pictures, images, messages, text, videos, etc. to be displayed on the electronic display at various times, as well as may store application data, such as configuration data, to be used by the applications and/or programming for performing various display tasks at different times. The electronics module may include a battery for powering the electronic display, the processor, a display driver, and other electronic elements, a battery charging device for charging the battery either in a wireless or a wired manner, and a communications module that enables other devices (e.g., other computing or communication devices) to communicate with the processor, the display driver and the memory to provide new or different images or messages to be displayed on the electronic display, to configure the operation of the electronic display of the attachable electronic device, etc.

The article or device so formed may, for example, enable a user to have a single type or multiple different types of digital media depicted or displayed on the display at the same time, including, for example, photographs, digital artwork created by the user or others, messages sent to or created by the user, reminders, notes that provide instructive, educational or inspirational messages, e-cards, advertisements, personalized agendas, calendars, such as a personalized Outlook® calendar, etc. More particularly, the display driver may be configurable to drive the electronic display by displaying thereon one or more images, messages, digital artwork, videos, etc., stored in the memory. In some cases, the display driver is connected to a set of electrodes (e.g., also referred to interchangeably herein as "lead lines," "connectors," "connection lines," "connection elements," "connecting lines," or "connecting elements") that, in turn, are connected to the display elements (e.g., pixel elements) of the flexible display, and the display driver provides respective content to each electrode or connector to produce the image displayed on the flexible display. The display driver may display or present an image via the flexible electronic display, may change the image being displayed/presented on the flexible electronic display from time to time, such as by accessing the memory and providing a new image to the display, may display videos, such as real time videos, and/or may display other types of digital media. Likewise, the display driver may cause various interfaces associated with many different applications at different times or in different modes of the article to be presented on the flexible display. For example, the display driver may be driven by various different applications executed in the processor to display a calendar interface, an e-mail in-box interface, an alarm clock interface, a keyboard interface, a step-counter interface, etc. These interfaces may be located on the same place on the flexible display and displayed at different times, and/or may be located at different places on the flexible display and displayed at the same or at different times.

Further, a battery charger unit may be connected to the battery and may operate to charge the battery using, for example, an inductively coupled charging technique. The battery charger unit may be a part of an inductively coupled charging system and may respond to electromagnetic waves produced by an exterior charging unit to charge the battery when the article is disposed near the external charging unit. In another case, the battery charger may be a kinetic energy charger unit that converts motion of the article (such as that associated with movement of an arm when the article is in the form of a wristband) into electrical energy which is then used to charge the battery.

Still further, a communications module may enable the processor, the driver, the memory and/or the flexible electronic display to communicate with one or more external sources or devices, such as a computer, a mobile phone, a tablet device, a remote control unit, etc., using, for example, wireless communications produced using a Wi-Fi network, a cellular network, a Bluetooth connection, a near-field communications (NFC) connection, an infrared communication technique, a radio frequency identification (RFID) device or tag, etc. The communications module may operate to enable the driver to receive new images or other digital media for storage in the memory and ultimate display on the flexible electronic display, new applications for execution by the driver to perform control of the electronic display in various manners, and/or new configuration information for configuring the manner in which the display driver controls the flexible electronic display to operate to display images and other information. In this manner, a user may reprogram the article via, for example, a wireless communication network to display different pictures, images, messages, etc., at different times, to execute different applications at different times or in different locations. The communications module operates to eliminate the need for the article or device to be plugged into a computer, or otherwise to have wires connected thereto for writing information to the memory of the device.

In some cases, the memory may store, and the processor may execute, one or more applications provided or downloaded to the article or device by the user. These applications may enable the user to direct or program the operational features of the article or device with the flexible electronic display, such as the particular digital media or images to display at any given time, the order in which images are to be displayed, the speed at which images will change, display features, such as background colors, borders, visual effects, etc. Moreover, the applications may enable or perform communications via the communications module to obtain information that may be displayed on the flexible electronic display, such as e-cards, advertising or promotional information, etc. provided via, for example, a Wi-Fi connection, a cellular connection, a Bluetooth or NFC connection, or any other wireless communications network or connection.

In an example configuration, the processor, which may be a generally purpose microprocessor type of controller or a special purpose controller, the battery, the battery charger unit, the computer-readable memory and the communications module are integrated (within, for example, an endpiece or a side wall of the article), and these integrated components may be sealed or otherwise protected from water, air, dirt, etc. to which the exterior of the article is exposed. Any or all of these electronic components (and indeed, the electronics module itself) may be encapsulated in a hermetically sealed manner to prevent any direct exposure of these components to exterior forces and environmental hazards.

In some configurations, a flexible, transparent, touch screen interface is disposed over or on top of the electronic display to enable a user to input data or take input actions with respect to the electronic display. In some cases, the inputs may be in the form of gestures or other inputs that are detected by other sensors included in article in which the electronic display is included, and the gestures detected by the sensors may cause the electronic display to present corresponding image content.

As previously mentioned, an article having an optimized display area may be a dynamically flexible article, such as a wristband, a shoe, a belt, a piece of jewelry, etc. Such a dynamically flexible article may include a dynamically flexible electronic display disposed thereon in a manner that is dynamically bendable or conformable to a user's wrist, arm or other curved or even flat surface, and that enables various images to be displayed on the electronic display in a manner that is easily viewable to a user. The dynamically flexible article with such a dynamically flexible electronic display may be attached to or worn on a user's body, such as in the form of a wristband or on a shoe or a belt, and may bend to fit the various contours or body surfaces on which the electronic display is located. The dynamically flexible article is also easily attached to other items, such as mugs, cups, computers, phone covers, bike handles, automobile dashboards, stands, etc., that enable the flexible display to be viewed (e.g., in a flat and any number of flexed positions) when not being held in one's hands or on one's body. The electronic display of the article is thus, in many cases, viewable to a user and is capable of being manipulated or actuated by the user without having to be held in one or both of the user's hands, making the electronic device useable while the user is engaged in or performing other activities, such as running, biking, etc.

As such, in an example, a dynamically flexible support for a dynamically flexible electronic display may have one, two, or more fasteners or connection mechanisms that are attached to the support and that allow the article in which the support and the display are included to be removably attached to itself, to another object, or worn by a person. The fasteners or connection mechanisms may be end-pieces, or the fasteners or connection mechanisms may be located along the length of the support.

In an illustrative but non-limiting example in which a flexible display having an optimized display area is supported in a dynamically flexible manner, an article or device is a dynamically flexible band, and the band includes first and second ends and a clasp mechanism coupled to one or both of the first and second ends of the band to couple the first and second ends of the flexible support together. The clasp mechanism may include one or more magnets and may further include a first set of uneven grooves disposed at one portion of the band and a corresponding second set of uneven grooves disposed at a second portion of the band for mating with the first set of uneven grooves. In another example, the clasp mechanism may include a multiplicity of magnets disposed in series along at least one end of the band and the clasp mechanism may be adjustable to enable the first and second ends of the band to be moved to different overlapping positions with respect to one another. If desired, the clasp mechanism may include a series of magnets disposed along the first end of the band and a series of magnetically permeable material elements, such as metal or magnets, disposed along the second end of the band, or may include at least one magnet disposed at a first lateral end of the band and a magnetically permeable material disposed at a second and opposite lateral end of the band. The clasping mechanism may further include a tab disposed at one of the first and second lateral ends of the band and a groove that accepts the tab disposed at the other of the first and second lateral ends of the band. In still other embodiments, the clasp mechanism may include a hook and loop structure coupled to the band or a buckle connected to one end of the band that accepts the other end of the band through the buckle.

In an embodiment, an article or device having an optimized display area includes a dynamically flexible support, a dynamically flexible electronic display disposed on the dynamically flexible support, and an electronics module that is electronically connected to the flexible electronic display and that includes a display driver and a processor. In this embodiment, the dynamically flexible support includes bending limiting structure elements that operate together to limit the bending radius of the flexible support to a range within a bending tolerance of the flexible electronic display. If desired, the electronics module may be rigid, and may be coupled to the flexible support at, for example, an end of the flexible support or at any point between two ends of the flexible support.

In another embodiment, an article having an optimized display area includes a generally rectangular shaped band having first and second lateral ends and first and second sides extending between the first and second lateral ends. The band includes a dynamically flexible support for a flexible electronic display and having a multiplicity of interconnected pieces that each extend between the first and second sides of the band and that operate together to limit the bending motion of the flexible display to a particular minimum bending radius. The article also includes a flexible electronic display disposed on or proximate to the flexible support, the flexible electronic display having a minimum critical bending radius at which the flexible electronic display can bend without impairing the electronic functionality of the flexible electronic display. Still further, an electronics module is electronically connected to the flexible electronic display and includes a display driver coupled to the flexible electronic display and a processor coupled to the display driver. In this embodiment, the particular minimal bending radius of the flexible substrate in a lateral, transverse, and/or torsional direction of the band is greater than or equal to the minimal critical bending radius of the flexible electronic display in the lateral, transverse, and/or torsional direction of the band.

In a still further embodiment, an article having an optimized display area includes a band having a dynamically flexible support and a flexible electronic display, where the flexible electronic display has first and second opposing surfaces. Here, the flexible electronic display is configured to display information via the first opposing surface, wherein the flexible electronic display is disposed on the flexible support so that the first opposing surface faces away from the flexible support, and wherein the flexible electronic display includes a minimum critical bending radius when bent in a direction that that causes the first opposing surface to be convex and the second opposing surface to be concave, without impairing electronic functionality of the flexible electronic display. The article further includes an electronics module electronically connected to the flexible electronic display including a display driver and a processor. Moreover, the flexible support is bendable to allow bending that causes the first opposing surface to be convex and the second opposing surface to be concave, but that limits bending in the direction that causes the first opposing surface to be convex and the second opposing surface to be concave to a particular bending radius that is greater than or equal to the minimal critical bending radius of the flexible electronic display.

In an illustrative but non-limiting example in which a flexible display having an optimized display area is supported in a statically flexed configuration, an article or device comprises a display support having a flat surface with first and second edges. Further, the article or device comprises a flexible electronic display disposed adjacent the display support including a backplane component having a flexible backplane substrate, a set of electrical energizing components disposed on the flexible backplane substrate in a display area, a first set of electrical connection lines disposed on the flexible backplane substrate in a first area adjacent to a first side of the display area and a second set of electrical connection lines disposed on the flexible backplane substrate in a second area adjacent to a second side of the display area. The article or device also includes a frontplane component having a frontplane substrate and a set of electrically energizable components disposed on the frontplane substrate, the frontplane substrate being aligned with the display area of the flexible backplane substrate. The first area of the flexible backplane substrate is aligned with or disposed in one or more planes different from the flat surface of the display support and the second area of the flexible backplane substrate is aligned with or disposed in one or more planes different from the flat surface of the display support so that the first and second sides of the display area of backplane component are congruent with the first and second edges of the flat surface, respectively.

The first area of the flexible backplane substrate may be oriented perpendicularly to the flat surface of the display support along the first edge of the flat surface of the display support and the second area of the flexible backplane substrate may be oriented perpendicularly to the flat surface of the display support along the second edge of flat surface of the display support, in some embodiments.

The frontplane substrate may be flexible, and the first and second sides of the display area on the flexible backplane substrate may be adjacent to one another. In the embodiment, the flexible backplane substrate may include a cut-out area disposed between the first and second areas, and the cutout area may have a corner that is adjacent to a corner of the display area disposed between the first and second sides of the display area.

Further, the article or device may include a transparent protective material disposed over the frontplane component and a driving circuit connected to the first set of connection lines and to the second set of connection lines for providing electrical signals to the first and second sets of connection lines. The article or device may also include a first driving circuit connected to the first set of connection lines and a second driving circuit connected to the second set of connection lines for providing electrical signals to the first and second sets of connection lines. Still further, the article or device may include a first pin connection module, a second pin connection module and a display controller, wherein the first driving circuit is connected through the first pin connection module to the display controller, the second driving circuit is connected through the second pin connection module to the display controller. In such a case, the display controller may operate to control the operation of the electrical energizing components mounted on the flexible backplane substrate.

In another embodiment in which a flexible display is supported in a statically flexed configuration, an article or device comprises a generally rectangular display support having a flat surface with first, second, and third contiguous edges, wherein the first edge is generally perpendicular to the second edge. Further, the article or device comprises an electronic display disposed on the display support including a backplane component having a flexible backplane substrate, a set of electrical energizing components disposed on the flexible backplane substrate in a display area having three or more sides, a first set of electrical connection lines disposed on the flexible backplane substrate in a first area adjacent to a first side of the display area and a second set of electrical connection lines disposed on the flexible backplane substrate in a second area adjacent to a second side of the display area. The electronic display also includes a frontplane component having a frontplane substrate and a set of electrically energizable components disposed on the frontplane substrate, wherein the frontplane substrate is aligned with the display area of the flexible backplane substrate. The first area of the flexible backplane substrate is disposed at least partially in a first plane different from the flat surface of the display support, and wherein the first side of the display area is aligned with the first edge of the flat surface.

In yet another embodiment, a case for an electronic device comprises a cover having a first rectangular wall and two or more side walls connected to the first rectangular wall, wherein the first rectangular wall and the two or more side walls define a cavity for accepting the electronic device, and the first rectangular wall has a flat surface with first and second contiguous edges and an electronic display disposed at least partially on the first rectangular wall. The electronic display includes a backplane component having a flexible backplane substrate, a set of electrical energizing components disposed on the flexible backplane substrate in a rectangular display area, a first set of electrical connection lines disposed on the flexible backplane substrate in a first area adjacent to a first side of the display area and a second set of electrical connection lines disposed on the flexible backplane substrate in a second area adjacent to a second side of the display area, and a frontplane component having a frontplane substrate and a set of electrically energizable components disposed on the frontplane substrate, wherein the frontplane substrate is aligned with the display area of the flexible backplane substrate. The first area of the flexible backplane substrate is disposed at least partially in a plane different from the flat surface and is disposed in a first one of the side walls, and the second area of the flexible backplane substrate is disposed at least partially in a plane different from the flat surface and is disposed in a second one of the side walls.

In still another embodiment, a case for an electronic device that includes a display and a display controller comprises a cover having a flat back substrate and two or more side walls, wherein the flat back substrate and the two or more side walls define a cavity for accepting the electronic device, and wherein the flat back substrate has a flat surface with first and second contiguous edges. Further the case comprises an electrical connection element disposed in one of the side walls of the cover, having a male electrical connection end that is adapted to engage a female electrical connection element of the electronic device when the electronic device is disposed in the cavity, and having a female connection end that is adapted to engage a male connection element of an external plug. Still further, the case comprises an electronic display disposed on the flat back substrate, the electronic display including a backplane component having a flexible backplane substrate, a set of electrical energizing components disposed on the flexible backplane substrate in a rectangular display area, electrical connection lines disposed on the flexible backplane substrate for providing electrical signals to the set of electrical energizing components and a frontplane component having a frontplane substrate and a set of electrically energizable components disposed on the frontplane substrate, wherein the frontplane substrate is aligned with the display area of the flexible backplane substrate. The electrical connection lines are communicatively coupled to the electrical connection element to enable the display controller of the electronic device to drive the electronic display.

BRIEF DESCRIPTION OF THE DRAWINGS

FIGS. 22A-22E illustrate various example display images that can be provided on a display with an optimized display area in different operational modes of an article or device including the display.

FIGS. 23 and 24 illustrate the band device of FIG. 1 or 3 disposed adjacent to one or more location detection strips in a straight configuration and a curved configuration, respectively, to form a band detection system.

FIG. 46 is a perspective view of an example mobile device case with an integral display.

FIGS. 47A and 47B are perspective views of one embodiment of a mobile device case with an integral display.

DETAILED DESCRIPTION

Examples of Displays

Figure 1:
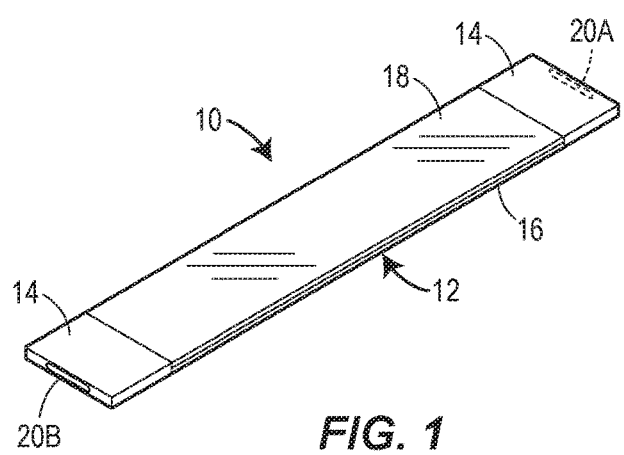
FIG. 1 is a perspective view of an example dynamically flexible article in the form of a band having a dynamically flexible display with an optimized display area.

The display of some or all of the embodiments described herein in which a display area is optimized may be manufactured as any type of rigid or flexible electronic display using any suitable electronic display technology. For example, a display may be manufactured using light emitting diode (LED) technology or liquid crystal technology, e.g., by using an array of pixel elements, and may be a flat, rigid display, a curved or bent rigid display, or a dynamically flexible display. As used interchangeably herein, the term "flexible display" or "flexible electronic display" generally refers to an electronic display that has or is formed from at least one flexible substrate. Thus, as referred to herein, the term "flexible display" may refer to an electronic display that is maintained in a statically flexed position, and/or to an electronic display that is dynamically flexible during its use. Examples of flexible displays include e-paper displays, organic light emitting diode (OLED) displays, etc. Typically, such flexible displays, once manufactured, may then be formed, curved or bent (either statically or dynamically) in various manners.

Generally speaking, a flexible display may be made of a flexible backplane substrate and a frontplane substrate. The frontplane substrate may or may not be flexible. For example, in a dynamically flexible display, two flexible substrates including a backplane flexible substrate and frontplane flexible substrate are placed back to back, next to one another, or laminated onto each other. In the case of e-paper, an additional layer of material such as an adhesive may be included in the frontplane and disposed between the backplane and the frontplane. In some cases, such as with the use of active-matrix OLEDs, electrophoretic displays (EPDs), e-paper, electronic ink displays, e-reader displays, liquid-crystal displays (LCDs), or other active-matrix type displays, the backplane includes a plurality of semiconductor devices or elements, e.g., an array of transistors and/or other elements, disposed thereon for driving or providing energization to individual lighting, transmitting, or reflective elements disposed in a similar array on the frontplane or on top of the transistors and/or other elements. The semiconductor devices or elements may be formed on the backplane in any known or desired manner, such as by etching, dye cut forming, printing, sputtering, spin-coating, spray coating, other deposition or patterning techniques, or combinations thereof, etc. Likewise, the light emitting, transmitting, or reflective elements may be formed as any desired types of light emitting, transmitting, or reflective elements using these same or different techniques, and the elements may include light emitting diodes (LEDs), OLEDs, e-paper, liquid crystal, etc. In the case of e-paper, for example, the frontplane and the backplane may be formed with black and white, oppositely charged particles suspended in a clear fluid which, when put in an electric field, will cause the black or the white particles to drift to the top of the display to create a white state, a black state, or an intermediate grey state. In any case, the substrate of the backplane and the frontplane may be formed of the same material or of a different flexible material, such as plastic or flexible glass, and these materials may have the same or different flexibility properties, as long as both materials are able to flex to the curvature needed for bending the electronic display.

Referring more particularly to dynamically flexible displays, such flexible displays may include a dynamically flexible display area on which text and/or image content may be presented. The display area may include a backplane display area and a frontplane display area which are placed back to back, next to one another, or laminated onto each other. The frontplane display area comprises an array of optic elements (e.g., electro-optic elements, or elements that are configured to emit light upon energization or upon receiving signals) that is capable of displaying an image, and the optic elements may be provided on a first flexible substrate. The backplane display area comprises an array of semiconductor devices or elements (e.g., transistor elements) provided on a second flexible substrate for driving or providing energization or signals to the optic elements on the frontplane. Materials suitable for use as the flexible substrate for either the frontplane and/or the backplane include, but are not limited to, various plastic substrates such as polyimide, polyethylene terephthalate (PET), polycarbonate, polyethersulfone, polyether ether ketone (PEEK), and polyethylene naphthalate (PEN). Metallic foils or flexible glass also may be used.

Preferably, the backplane display area comprises an array of thin film transistors (TFTs) provided on a flexible, plastic substrate such as PET. The TFT array may include switching and/or driving TFTs, and additional elements such as storage capacitors, and interconnect wiring. An individual TFT element generally is made by successive deposition and patterning of conductor (i.e., source, drain, and gate electrodes), insulator (i.e., dielectric) and semiconductor thin film layers. The active semiconductor layer can be composed of either organic (small-molecule or polymeric semiconductors) or inorganic materials (such as amorphous silicon, low-temperature polycrystalline silicon, graphene, carbon nanotube, and metal oxide semiconductors).

The TFT array may preferably comprise organic TFTs (OTFTs) based upon an organic semiconductor described in at least one of U.S. Pat. Nos. 6,585,914; 6,608,323; 6,991,749; 7,374,702; 7,528,176; 7,569,693; 7,605,225; 7,671,202; 7,816,480; 7,842,198; 7,892,454; 7,893,265; 7,902,363; 7,947,837; 7,982,039; 8,022,214; 8,329,855; 8,404,844; 8,440,828; U.S. Patent Publication No. 2010/0252112; U.S. Patent Publication No. 2010/0283047; U.S. Patent Publication No. 2010/0326527; U.S. Patent Publication No. 2011/0120558; U.S. Patent Publication No. 2011/0136333; and U.S. Patent Publication No. 2013/0062598, the disclosure of each of which is incorporated by reference herein in its entirety for all purposes. While OTFTs may include metallic contacts and a dielectric layer composed of silicon oxide ($SiO_2$) or another inorganic oxide or nitride (such as $Al_2O_3$, $HfO_2$, $SiO_2$, or $Si_3N_4$), a dielectric layer composed of an electrically insulating polymer may be preferred. Exemplary polymeric dielectric materials include polyacrylates, polyimides, polyvinyl alcohol, polystyrene, polyester, polycarbonate, polyhaloethylene, epoxy resins, siloxane polymers, benzocyclobutene-based polymers. Other polymeric dielectrics are described in U.S. Pat. Nos. 7,605,394; 7,981,989; 8,093,588; 8,274,075; 8,338,555; U.S. Patent Publication No. 2011/0175089; U.S. Patent Publication No. 2011/0215334; and U.S. Patent Publication No. 2012/0068314. Conductive polymers such as poly(3,4-ethylenedioxythiophene) poly(styrenesulfonate) (PEDOT:PSS) may be used as alternative materials for metallic contacts in OTFTs.

Preferably, the TFT array may comprise metal oxide TFTs based upon a metal oxide semiconductor. For example, the metal oxide semiconductor can be selected from various mixed oxides including one or more of indium, zinc, tin, and gallium such as indium zinc oxide (IZO), zinc tin oxide (ZTO), indium gallium oxide (IGO), and indium gallium zinc oxide (IGZO). In a more preferred embodiment, the TFT array may comprise IGZO TFTs. While state-of-the art IGZO TFTs usually include thick layers of inorganic materials such as $SiO_2$, $SiO_x$, $Si_3N_4$, and $SiO_xN_y$ as dielectric and passivation layers, it is preferred that if the TFT array backplane comprises metal oxide TFTs, organic materials are used in at least some of the dielectric and passivation layers, such that the thickness of the remaining inorganic layer(s) may be reduced to allow maximum flexibility of the TFT array as whole. Metal oxide TFTs incorporating one or more organic layers are described in U.S. Pat. Nos. 8,017,458; 8,097,877; 8,395,150; and U.S. Patent Publication No. 2012/0223314, the disclosure of each of which is incorporated by reference herein in its entirety for all purposes.

In some scenarios, such as for an electrophoretic or e-reader display, the frontplane display area may be laminated, sealed to, or otherwise secured onto the backplane display area. The frontplane display area may be produced by forming a subassembly that comprises, in sequence, a flexible substrate, a conductive electrode layer, an electro-optic layer, and optionally, an adhesive layer to allow lamination to the backplane. In the case of an OLED display, the electro-optic layer is sandwiched between two electrode layers and is typically built on the TFT array. Generally, at least one of the two electrode layers is transparent, often composed of a transparent conductive oxide such as indium tin oxide (no). The electro-optic layer is composed of an organic material capable of emitting light when a voltage is applied across the two electrode layers. The organic light-emitting material may have a stacked structure including a plurality of different organic layers. In addition to one or more emissive layers, the stacked structure may include additional layers such as a hole-injection layer, a hole-transport layer, an electron-transport layer, a hole-blocking layer, and/or an electron-blocking layer to enhance device performance. Individual OLED elements may have different emitters (for example, a red emitter, a green emitter, or a blue emitter) in their emissive layer to provide a colored image. Exemplary OLED device structures and materials are described in U.S. Pat. Nos. 5,707,745, 5,844,363, 6,097,147, 6,303,238, and 8,334,545, the disclosure of each of which is incorporated by reference herein in its entirety for all purposes.

In the case of an e-paper display, the electro-optic layer may be composed of an encapsulated electrophoretic medium. The encapsulated electrophoretic medium generally comprises numerous small capsules, each of which itself comprises an internal phase containing electrophoretically-mobile (e.g., black and/or white) particles suspended in a liquid suspending medium, and a capsule wall surrounding the internal phase. Typically, the capsules are themselves held within a polymeric binder to form a coherent layer positioned between two electrode layers. Most commonly, one electrode layer has the form of a single continuous electrode, while the other electrode layer is patterned into a matrix of pixel electrodes, each of which defines one pixel of the display. Electronic charges are applied to the capsules to bring particles of a selected color to the surface. Electrophoretic media and related display device structures are described in, for example, U.S. Pat. Nos. 5,930,026; 6,831,769; 6,839,158; and 7,170,670, the disclosure of each of which is incorporated by reference herein in its entirety for all purposes. In addition to electrophoretic displays, other e-paper display technologies include electrowetting displays, and electrofluidic displays as described in, for example, U.S. Pat. Nos. 7,446,945 and 8,111,465, the disclosure of each of which is incorporated by reference herein in its entirety for all purposes.

To integrate the TFT array backplane with the frontplane for a completed display system, the bottom or pixel electrode of the frontplane is (connected) to the drain or source electrode of the switching TFT in an e-paper display, and the driving TFT in an active matrix OLED (AMOLED) display.

Further, various organic layers on either the frontplane and/or the backplane may be formed on the flexible substrate by solution-phase deposition techniques such as spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Inorganic (e.g., metallic or metal oxide) layers usually are deposited by physical or chemical vapor deposition methods (e.g., sputtering), but may be solution-processed if a soluble precursor is available. The layers may be patterned into specific elements by photolithography, either by use of the intrinsic photosensitivity of the layers (e.g., certain polymeric layers) or by use of a photoresist (e.g., metallic, metal oxide, or small-molecule organic layers).

Examples of Dynamically Flexible, Optimized Display Areas

FIG. 1 illustrates an example article or device 10 having a display area that is optimized using one or more of the techniques, systems, methods, and apparatuses described herein. The article 10 is dynamically flexible, and may be in the form of a band, such as a wristband or other elongated band. As such, the article 10 includes a flexible band portion 12, which is generally rectangular in shape and configuration, disposed between two ends, end pieces, or fasteners 14. The band portion 12 includes a dynamically flexible support 16 and a dynamically flexible electronic display 18 disposed on or proximate to the support 16 so as to be viewable from one surface of the band 12, as illustrated in FIG. 1. Further, as shown in FIG. 1, the display area of the flexible display 18 (e.g., the area of the display 18 on which viewable content is able to be presented) is optimized using any one or more of the optimization techniques, systems, methods, and apparatuses described herein. One or more of the fasteners, end pieces, ends, or clasps 14, each of which may be made of hard plastic or other rigid material, but could instead be made of a pliable material, may include various electronic components therein for driving the electronic display 18 and for providing other electronic functionality for the article 10. Additionally or alternatively, one or more various electronic components may be disposed in modules that are attached to the band 12 at locations other than with the fasteners 14.

Figure 2:
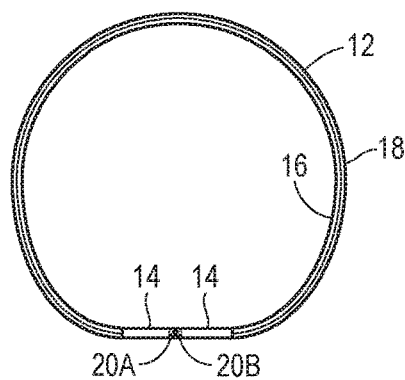
FIG. 2 is a side view of the wristband of FIG. 1 bent to form a fixed length, circular or oval band.

As illustrated in FIG. 1, one or both of the end pieces or clasps 14 may include a connection structure therein that functions to connect the end pieces 14 together when the band portion 12 is bent, as illustrated in FIG. 2, to form a circular or oval band. In one case, the connection structure may be in the form of magnetic materials 20A and 20B disposed in or on each of the clasps 14, wherein the materials 20A and 20B operate, when in close proximity to one another, to hold the end pieces or clasps 14 together. The magnetic materials 20A and 20B can each be a permanent magnet, or one of the materials 20A or 20B can be a permanent magnet while the other material 20A or 20B can be a magnetically permeable material, such as many kinds of metal. The magnetic materials 20A and 20B can be disposed at the longitudinal ends of the clasps 14 so that the clasps 14 connect end-to-end when the band 12 is bent to allow the clasps 14 to meet up with each other end-to-end, as illustrated in FIG. 2. In the case in which the materials 20A and 20B are both permanent magnets, the materials 20A and 20B may be disposed in ends of the clasps 14 so that opposite poles of the permanent magnets are facing outwardly from the clasps 14 or so that the magnets have their respective north poles facing in opposite directions when the band portion 12 is bent in the manner shown in FIG. 2 (e.g., so that a south pole of one of the magnets 20A and 20B meets or mates with a north pole of the other one of the magnets 20A and 20B). As will be understood, the configuration and placement of the materials 20A and 20B in the clasps 14 in the manner illustrated in FIG. 1 enables the device 10 to be clasped in a continuous circle with a fixed or predetermined length so that the clasps 14 meet end-to-end.

Figure 3:
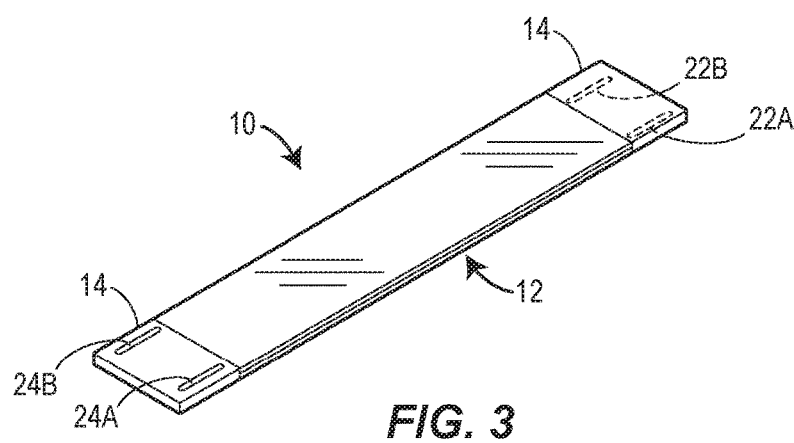
FIG. 3 is a perspective view of an example dynamically flexible article in the form of a band having a dynamically flexible display with an optimized display area.
Figure 4:
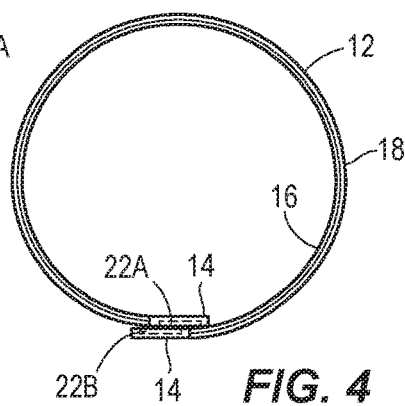
FIG. 4 is a side view of the example article of FIG. 3 bent to form an adjustable length circular or oval band.

In another embodiment illustrated in FIG. 3, the article or device 10, again illustrated in the form of a dynamically flexible band, includes a similar band portion 12 and end pieces or clasps 14. However, in this case, the clasps 14 have a connection structure in the form of magnets disposed on the top or bottom sides of the clasps 14 (and possibly even a portion of the band 12) to enable the device 10 to be folded around on itself in an adjustable manner as illustrated in FIG. 4 so as to create a band of variable length when disposed around or connected around a wrist or other object. As illustrated in FIGS. 3 and 4, magnets or magnetic members 22A and 22B are disposed on or near a lower side of one the clasps 14, and come into contact or react with magnets or magnetic members 24A and 24B disposed on or near an upper side of the other one of the clasps 14. In some cases, the magnets or magnetically permeable elements or members 24A and 24B may be disposed within the support 16, such as in the center of the support 16, instead of on or near an upper or lower surface of the support 16. In these configurations, the clasps 14 may be disposed near or on top of one another during use and are thus connectable in various different positions with respect to one another, such as that illustrated in FIG. 4, when the flexible band 12 is bent to form a circular member to be placed around a wrist, a leg, a bicycle handle bar, etc., for example. In this manner, the article or device 10 may be easily adjustable in size to fit various different sized mounting members. As illustrated in FIG. 4, the support or flexible material 16 of the band portion 12 is illustrated as being flexed in a manner that causes the display 18 to be disposed on the exterior or outside of the band portion 12. Of course, in the configuration illustrated in FIG. 4, the magnets or metallic members 22A and 22B on the one side, and the magnets or the metallic members 24A and 24B on the other side of the band portion 12 may slide with respect to one another in the longitudinal direction of the device 10 so as to make the device 10 variable in size or circular shape to fit around different sized wrists or other mounting members. Of course, if desired, portions of the members 22A, 22B and/or 24A, 24B could be disposed in the band portion 12 in addition to or instead of in the clasps 14 and, if so disposed, would still be considered as being disposed in the end portions of the band 12. Still further, any or all of the magnetic members 22A, 22B, 24A, 24B could be a single, long piece of material, as illustrated in FIGS. 3 and 4, or could be a series of magnetic members disposed near but not contacting each other, to enable better registration of the north and south poles of the respective magnetic members in various different longitudinal locations of the band 12. This second configuration may provide for better adjustability of the length of the band 12 when both magnetic members 22 and 24 are permanent magnets.

Figure 5A:
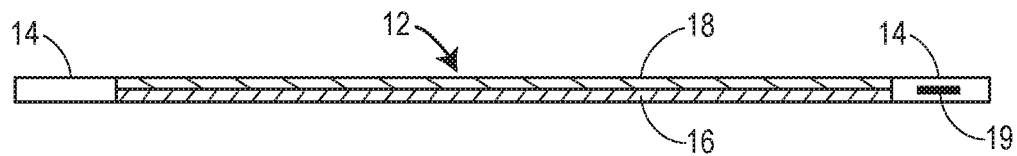
FIG. 5A is a side view of an example article of FIGS. 1-4 that has a dynamically flexible display with an optimized display area disposed on a dynamically flexible support between two clasps.

Of course, the article or device 10 could take on many different configurations besides those illustrated in FIGS. 1-4. For example, as a reference, FIG. 5A illustrates a side view of the device 10 of FIGS. 1-4 in more detail. In this case, the band portion 12 is illustrated as including a flexible base or a support portion 16 that may be made of any suitable flexible material such as, for example, cloth, leather, plastic, metal links, or other material, while the dynamically flexible display 18 is disposed on the support 16. The clasps 14 may be the same size as each other and may be the same height as the display 18 and the support 16 together. In another case, the clasps 14 may be larger in height than the display 18 and the support 16 and, in this case, may stick out above surface of the display 18 and/or below the bottom surface of the support 16. As noted above, one or both of the clasps 14 may be or include an electronics module 19 that holds electronics, such as processors, memories, sensors, batteries, etc. that are used to power and drive the display 18 and to provide other communication functionality for the device 10. In some embodiments, the electronics module 19 is not included in the clasps or fasteners 14, but is attached to the band 12 in a location separate from the fasteners 14. If desired, the components of the electronics module 19 may be sealed or otherwise protected from water, air, dirt, etc. to which the exterior of the device 10 is exposed. For example, any or all of these electronic components may be encapsulated in a hermetically sealed manner to prevent any direct exposure of these components to exterior forces and environmental hazards.

Figure 5B:
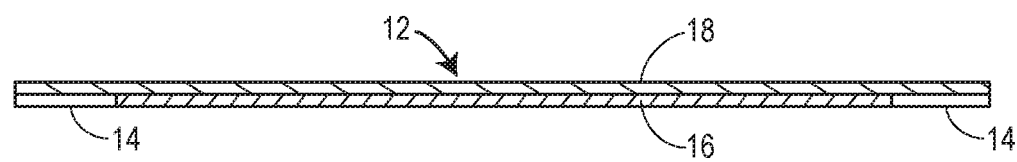
FIG. 5B is a side view of an example article in the form of a band that has a dynamically flexible display with an optimized display area disposed over an entire length of a support.

In another embodiment, as illustrated in FIG. 5B, an article or device 10 having a dynamically flexible display 18 has the display 18 disposed over the entire length of the support 16 and end portions 14, which may be part of the support 16. In this case, the display 18 spans the entire length of the band portion 12 and of the device 10 and thus extends from end to end of the device 10. The connection structure, in the form of for example, magnets (not shown in FIG. 5B) may be disposed in the end pieces 14 and/or, if desired, in portions of the flexible support 16.

Figure 5C:
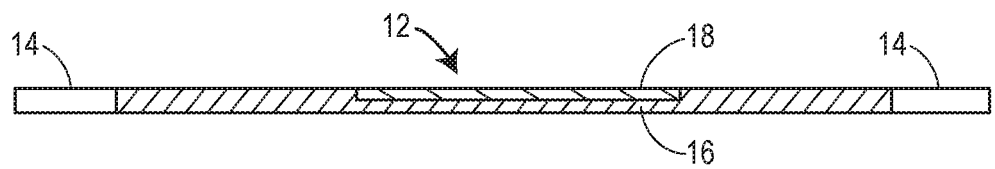
FIG. 5C is a side view of an example article in the form of a band that has a dynamically flexible display with an optimized display area disposed on a center portion of a dynamically flexible support.

In yet another configuration, as illustrated in FIG. 5C, a dynamically, flexible article 10 has a dynamically flexible display 18 disposed on a limited portion of the flexible support 16 so that the display 18 is only disposed, in this case, in the center portion of the band 12. Of course, while not shown, the display 18 could be disposed on any other portion of the band 12, including in portions offset from the center of the band 12 and the display 18 could cover any desired amount or portion of uppers surface of the band 12. Here again, any desired connection structure could be provided in the ends of the support 16, including in the clasps 14, to connect the two ends of the band 12 together.

Figure 5D:
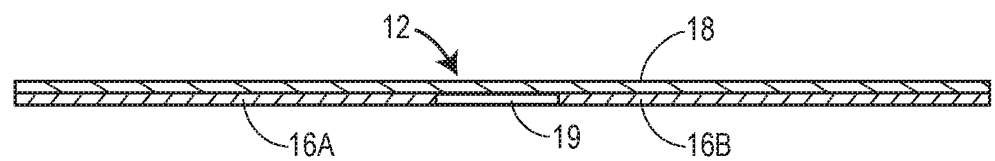
FIG. 5D is a side view of an example article in the form of a band that has a dynamically flexible display with an optimized display area disposed over a support having two flexible end pieces connected by an electronics module.

In a still further case, as illustrated in FIG. 5D, a dynamically flexible article 10 has a dynamically flexible display 18 disposed over a support 16 having two flexible end pieces 16A and 16B connected by an electronics module 19 which, in this case, is illustrated is being disposed in the center of the flexible support 16. The electronics module 19 may or may not be made of a flexible material and in either case is still part of the flexible support 16. Moreover, while being illustrated in the center of the support 16, the electronics module 19 could be disposed at any other location along the support 16 including at any position offset from the center of the support 16. Again, any desired connection structure could be attached to or disposed in or on the end portions of the device 10, including the ends of the support 16.

Figure 6:
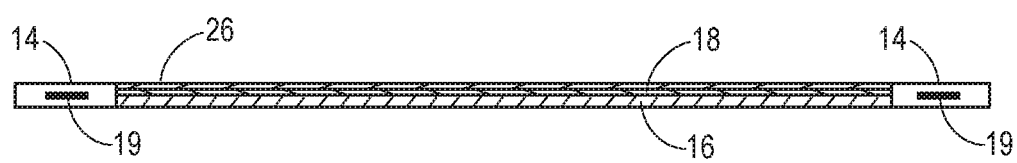
FIG. 6 is a side view of an example article in the form of a band having a flexible touch screen disposed on a dynamically flexible display with an optimized display area and a flexible support disposed between two clasps.

In another embodiment, as illustrated in FIG. 6, the article or device 10 may be configured similarly to that of FIGS. 1-5D, but may also include a touch screen interface 26 disposed over the dynamically flexible display 18. In particular, in this case, the touch screen interface 26 can be a capacitive touch screen or any other type of touch screen interface that is transparent in nature, and thus can be laid over top of the display 18 to allow the display 18 to be viewable there-through. Further, the touch screen interface 26 may be flexible or dynamically flexible in conjunction with the display 18. As will be understood, the touch screen interface 26 of FIG. 6 is powered by and controlled by the electronics disposed within one or more electronics modules 19 illustrated as being disposed, in this case, in both of the clasps 14 to perform various different types of touch detection functionality associated with a typical touch screen display. Of course, the touch screen interface 26 could be added to any of the configurations of FIGS. 5A-5D or to any of the other article embodiments described herein.

Figure 7A:
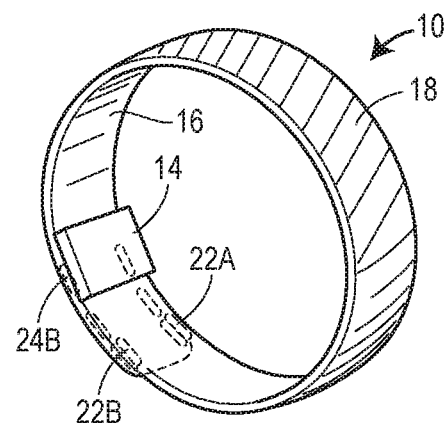
FIGS. 7A and 7B illustrate a perspective and top view, respectively, of an example article in the form of a band similar to FIGS. 1-6 having magnetic members disposed on one or both ends or sides of the band to form an adjustable connection or clasping structure.
Figure 7B:
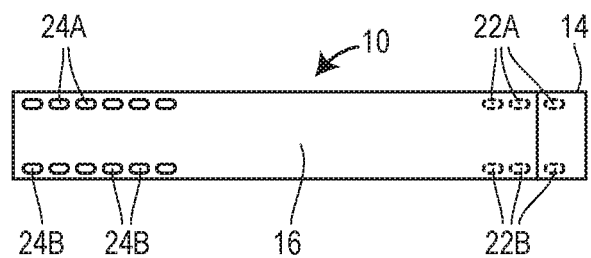

While the dynamically flexible article or device 10 of FIGS. 1-6 is generally illustrated as having an display 18 and a flexible support 16 disposed between or including two magnetically coupled clasps 14, with at least one of the clasps 14 containing or operating as an electronics module 19, other manners of disposing connection structure on the device 10 and of locating the electronics module 19 could be used instead. For example, FIGS. 7A and 7B illustrate an example article or device 10 in the form of a band having a single clasp member 14, such as one of clasps members 14 of FIGS. 1-6, disposed at one end of the dynamically flexible display 18 and a set of magnets 22 and 24 or other magnetically permeable material disposed on or in an end piece or end portion attached to or formed as part of the other end of the flexible support 16. In this case, individual magnets 22A and 22B are disposed in a spaced apart manner within the end piece 14 or are disposed in the flexible support 16 next to the end piece 14 and operate in conjunction with the individual magnetic materials 24 which are spaced apart and disposed on the other end piece of the band 12 to form a secure magnetic connection when the band portion 12 is wrapped around a user's wrist, for example. The spaced apart nature of the individual magnetic members 22 and 24 enable the band to be adjustable in length so that a pair of magnetic members 22A and 22B (on opposite sides of one end of the band 12 or support 16) may meet up with any of a number of different pairs of magnets 24A and 24B (on opposite sides of the other end of the band 12 or support 16) to enable the length of the band, when connected, to be adjustable. Of course, the magnetic members 22 and 24 may each be permanent magnets, or one may be made of permanent magnets while the other is formed of magnetically permeable material. Of course, the spaced apart magnetic material configuration of FIGS. 7A and 7B may be used in any of the embodiments illustrated in FIGS. 1-6.

In other embodiments, the flexible support 16 and the flexible electronic display 18 can be removably coupled to one another and/or to another object in any number of different ways. The flexible support 16 and the display 18 can, for example, be snapped together, hooked together, latched together, or coupled to one another and/or to another in some other manner at one or more locations. A discussion of various coupling and/or connecting mechanisms for dynamically flexible articles is provided in a later section.

Example Electronics Suite

Figure 8:
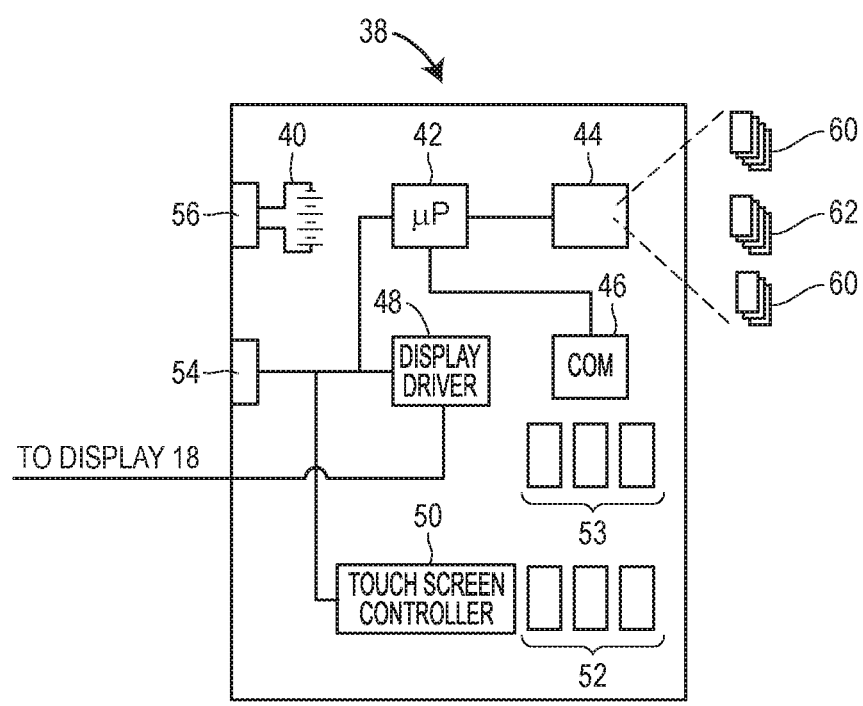
FIG. 8 is a block diagram of an electronics module associated with the articles or devices described herein.

FIG. 8 illustrates a block diagram of various electronic components, referred to herein as an electronics suite 38, that may be used in or disposed in the electronics module 19 of any of the articles or devices described herein to drive a display whose display area is optimized. For example, the electronics suite 38 may drive the flexible electronic display 18 of the article 10, or may drive another electronic display. In particular, the electronics suite 38 illustrated in FIG. 8 includes a battery 40 that powers a number of other modules or electronic components including a microprocessor or other processor 42, a computer-readable memory 44, which may be, for example, a flash memory or other suitable type of non-transitory, tangible, data storage medium, a communication module 46, a display driver 48, a touch screen controller 50, and a number of sensors 52 and other secondary devices 53.

The sensors 52 may include, for example, an impact sensor or step counter, one or more gyroscopic sensors or gyroscopes, temperature sensors, vibration sensors, pulse rate monitors, pressure sensors, strain gauges, force sensors, etc. The secondary electronic devices 53 may include, for example, an alarm or noise creation device, a speaker, a microphone, a vibrator the operation of which causes the clasp 14 or electronics module 19 to vibrate, etc. Although FIG. 8 illustrates the sensors 52 and the secondary electronic devices 53 as being integral with the electronics suite 38, in some cases, one or more of the sensors 52 and/or the secondary electronic devices 53 are physically disposed at one or more other locations along the band 12 separate from the remainder of the electronics suite 38. In these cases, though, the separately disposed sensors 52 and/or secondary electronic devices 53 remain in communicative connection with the remainder of the electronics suite 38 (e.g., via a wired or wireless connection).

Similarly, although FIG. 8 illustrates the display driver 48 as being integral with the electronics suite 38, in some cases, the display driver 48 is physically disposed at another location separate from the remainder of the electronics suite 38. In an example, the display driver 48 is disposed in a location that is proximate to electrodes or connectors of the display elements (e.g., pixel elements) of the electronic display 18, e.g., on the backplane of the display 18 or at some other suitable location. The separately located display driver 48, though, remains in communicative connection with the remainder of the electronics suite 38 (e.g., via a wired or wireless connection) despite of the remote locations. In some configurations, an article or device 10 may include more than one display driver 48.

As will be understood, the memory 44, the communication module 46, the display driver 48 and the touch screen controller 50, as well as the sensors 52 and other secondary electronic devices 53, are communicatively connected to the processor 42 and may operate to perform various functions in conjunction with applications or other programs implemented by the processor 42. Further, each of these elements is connected to and is powered by the battery 40 in any known or desired manner. Still further, the electronics suite 38 of FIG. 8 may include one or more communication ports, such as communication port 54 (e.g., a USB or other type of digital communication port), and a power or battery charger input port 56. In this case, the power input port 56 may be connected to the battery 40 and enable charging or recharging of the battery 40 using any known or desired recharging circuitry and methodology. Alternatively or in addition, the communications input port 54 (in the form of for example, a USB input port) may be connected to the battery 40 and provide power to the battery 40 for charging battery 40, and the input port 54 may also be connected to the microprocessor 42, as well as to the communication circuit module 46, for performing wired-based communications via the input port 54. Of course, the communication input port 54, while being illustrated as a USB-type connection, could any other type of known wired or physical communication connection, including any desired serial or parallel digital communication port using any number of pins or wires, as is known in the art, an analog communication port, etc. Additionally or alternatively, the input port 54 may include a wireless input port for performing wireless communications.

In an embodiment, the power input port 56 may be a wireless input port for powering the article 10, and in this case may, for example, be part of a battery charger unit that operates to charge the battery 40 using, for example, an inductively coupled charging technique. If the battery charger unit is part of an inductively coupled charging system, it generally responds to electromagnetic waves produced by an exterior charging unit (not shown) to charge the battery 40 when the article 10 is disposed near the external charging unit. In another case, the battery charger of the input port 56 may be a kinetic energy charger unit that converts motion of the device 10 (such as that associated with movement of an arm when the attachable electronic device 10 is in the form of a wristband) into electrical energy which is provided to charge the battery 40.

As will be understood, the processor 42, which may be a programmable, general-purpose processor or a specially programmed processor programmed using any desired type of hardware or firmware programming, generally coordinates and implements the operation of the display 18 and the associated electronic components as described in more detail herein. The computer readable memory 44 stores various applications and/or programs, including for example the general operating system implemented by the processor 42, and various applications (illustrated as a set of applications 60 in FIG. 8) to be run on the processor 42 to implement various different types of functionality via the device 10, some of which will be described in more detail herein. The memory 44 may also store one or more data files 62, which may be, for example, image or video data files associated with various images to be displayed on the display screen 18 at various different times. Still further, the memory 44 may store application data that may be created by the various applications 60 or the microprocessor 42 as part of the operation of various applications 60 and to be used by those applications 60 either during runtime of the applications 60 or at other times. If desired, the microprocessor 42 or one of the secondary electronic components 53 may include or be a clock that tracks the current time, day, date, month, year, time zone, etc.

As an example, one or more of the applications 60 may implement various functionalities typically associated with standard computers or other types of electronic devices such as personal handheld electronic devices, including for example an e-mail application, an Internet or web-browsing application, an alarm clock application, a calendar application, a music-playing application such as an MP3 application, a video application, a digital picture slideshow application, a mapping application, an e-reading application which may provide books, notes, magazines or other types of articles, for reading by the user, etc. Still further, one or more of the applications 60 may operate on the processor 42 to turn the display 18 associated with the article or device 10 into a slave display device that may be tied to or communicably coupled to an exterior master device that is generating content to be displayed via the display 18. The master device, which may be a smart phone or a nearby computer device, may be wirelessly connected to the electronics suite 38 to provide content to be displayed on the display 18 and will typically have more memory, and computing and processing power than the processor 42.

The communication module 46 of FIG. 8 may include or use any type of communication hardware/software/firmware that uses any desired types of communication techniques to enable the microprocessor 42 to communicate with exterior devices or sources. Of course, the communication module 46 could include multiple different types of communication hardware/software/firmware, including any kind of hardwire-based communication module or wireless-based communication module. As examples, the communication module 46 may be a wired or wireless Internet-based communication module that may provide wired or wireless-based, IP protocol communications between the dynamically flexible article or device 10 and other devices or a communication network such as a LAN or a WAN to which other devices are communicatively connected. Likewise, the communication module 46 may include a near field communications (NFC) module, a radio frequency identification (RFID) communications module for communicating with, sending messages to and/or receiving messages from RFID tags stored in other devices around or close to the device 10. In this case, the communications module 46 may decode signals received from RFID tags in response to pings by the RFID communication module 46 to identify the RFID tags or tag numbers (identifiers) associated with these devices. Likewise, the communication module 46 may be a near field communication (NFC) module or a Bluetooth communication module, which may perform near field communications or Bluetooth communications in any known or desired manner with nearby NFC or Bluetooth enabled devices, thereby enabling wireless communication between the device 10 and other closely situated or closely located electronic devices. Still further, the communication module 46 may support a wireless cellular communication protocol, such as TDMA, CDMA, GSM, LTE, PCS, etc. Still further, the communications module 46 may include a USB or other type of wired communication module for decoding and encoding USB-based communication signals to be sent out and received via the USB communication port 54.

As illustrated in FIG. 8, the display driver 48 is coupled to the microprocessor 42 and to the display 18, and the display driver 48 drives the display 18 to present different images to a user and thus implement functionality via the display 18. The display driver 48 may be associated with or use any type of display driver technology associated with the various different types of flexible displays that might be used, including, for example, e-ink or other bi-stable display drivers, organic light emitting diode (OLED) display drivers, etc.

Of course, it will be understood that the display driver 48 is connected to the various display elements (e.g., pixels or pixel elements) of the display 18 to cause the pixel elements to change their visual appearance so as to present content image on the display 18. Typically, but not necessarily, each pixel element is communicatively connected to two electrodes, lead lines, connecting lines, or connectors corresponding the (x, y) coordinates of the particular pixel element on the display 18. Thus, the display driver 48 provides image content (e.g., by using electrical signals or other suitable signals) to a set of connecting lines corresponding to a width of the display 18 or its display area (and, in some cases, physically emanating from a width edge or transverse side of the display 18 to the driver 48), and the same display driver 48 may provide image content (e.g., by using electrical signals or other suitable signals) to another set of connecting lines corresponding to a length of the display 18 (and, in some cases, physically emanating from a length edge or longitudinal side of the display 18 to connect to the driver 48). In an example, the display driver 48 provides image content to a set of transverse connecting lines and/or to a set of longitudinal connecting lines so that image content is presented on the display area of the display 18. In an example, the article 10 includes multiple display drivers 48, each of which provides image content to a respective set of connecting lines. In an embodiment, the one or more display drivers 48 are communicatively connected to one or more driving circuits (not shown), and the one or more driving circuits provide image content to the pixels via one or more sets of connecting lines.

Referring still to FIG. 8, the display driver 48 illuminates or causes the pixel elements to obtain or reach a color, a lighting level, an on-off state, etc., so as to drive the display 18 to present various images and other functionality as determined by the particular application 60 being executed on the microprocessor 42. In some cases, the display driver 48 may cause various images, such as one or more artistic renditions, patterns, etc. or other types of images stored in the memory 44 to be displayed as one of the images 62 on the display 18. Such an image may be any type of graphic element in the form of artwork, an indication of an association of the user with a particular university or other organization, such as a logo, a mascot, an icon, etc. In the case of a static display, and particularly when the display 18 is a bi-stable type of flexible display, such as an e-ink type of display, the display 18 might display a particular image or background image whenever the device 10 is in a sleep mode, and thus in which the display driver 48 is not operating to actively drive the display 18.

The touch screen controller 50 of the electronics suite 38 is connected to a touch screen interface 26, such as that illustrated in FIG. 6, if such an interface exists, and receives input signals from the touch screen interface 26. The controller 50 operates to decode these input signals to identify touch events that occur with respect to the touch screen interface 26. The touch screen interface 26 may be a capacitive touch screen interface or any other suitable type of touch screen interface disposed over the display 18, and may be transparent in nature to thus enable the pixel elements of the display 18 to be viewable through the touch screen interface 26. Of course, other types of touch screen interfaces may be used instead or as well. In any event, the touch screen controller 50 operates to energize and control the touch screen interface 26, as well as to recognize and decode touch screen events to identify, for example, the location of each touch screen event, a type of a touch screen event, such as a tap or a swipe movement, etc. If desired, the touch screen controller 50 alone or in conjunction with the processor 42 may operate to determine or recognize gestures that are input via the touch screen interface 26, such gestures being, for example, a slide, a swipe, a multi-finger pinch or any other type of gesture that includes one or more finger movements coordinated with one another. Each such gesture may indicate an action to be taken on or via the device 10. Of course, the article or device 10 may include other or different types of user input devices configured to detect user-generated gestures, such as interfaces that include buttons switches, roller balls, slide bars, pressure sensors, strain gauges, etc., disposed on, for example, one of the clasps 14 of FIGS. 1-7B or elsewhere along the band 12. Such user interfaces may enable the user to perform more rudimentary functions, such as scrolling movements, on-off powering movements, mode switching, etc. that are traditionally entered via actuate-able buttons or switches.

As will be understood, the various different electronic devices or components disposed in or shown in the electronic suite 38 of FIG. 8 may be used in conjunction with one another in various different manners to provide a whole host of functionality for the dynamically flexible article or device 10, which might be beneficial in various different uses of that article. However, only some of these uses are described in detail herein.

Examples of Display Area Optimization

Figure 9:
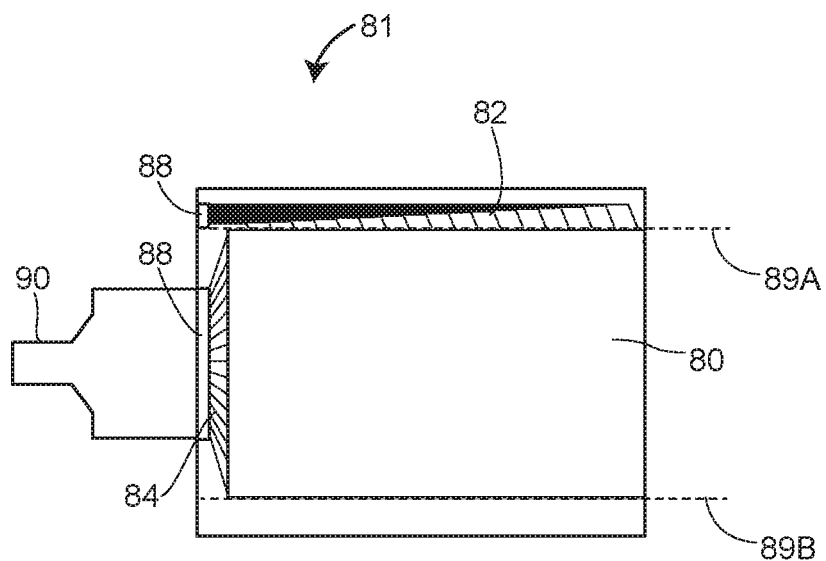
FIG. 9 illustrates a top view of a backplane layer of a flexible electronic display as formed on a flexible display substrate.

It may be desirable to manufacture an electronic display in a manner that maximizes the amount of the display area space viewable on a surface layer of an article or device in which the electronic display is included. For example, it may be desirable to maximize the viewable display space of the electronic display 18 of the article 10, i.e., the area on the display 18 on which text and/or images are presentable and viewable to a user. In this regard, FIG. 9 illustrates, in an exemplary but non-limiting manner, a base or backplane layer 81 of the flexible display 18 as manufactured. Generally speaking, the backplane of a flexible display 18 comprises a surface, or a first display substrate, and has a display area with various electrical energizing elements (e.g., transistors) formed, printed, etched or otherwise disposed thereon. As is known, the electronically energizing components on the backplane substrate of a backplane component are then operatively connected to electronically energizable components, such as organic light emitting diodes (OLEDs), encapsulated electrophoretic media (e.g., as in an e-paper display), etc., disposed on or formed on a frontplane component. Both the backplane substrate of the backplane component and the frontplane substrate of the frontplane component may be flexible, and the backplane substrate and the frontplane substrate are aligned to provide a register between various energizing components and energizable components to thereby form pixels on the display area. In particular, the flexible display may be made of two or more layers including a backplane display substrate on which various display elements, such as pixel elements, associated with each pixel of the display are printed, etched or otherwise manufactured in the form of, for example, transistors or other switching elements, a secondary or frontplane display substrate on which OLEDs, e-ink microcapsules or other energizable components that form black and white or various colors on the display for each pixel, and, in some cases a further flexible substrate layer that operates as a ground layer. In some embodiments, such as in electrophoretic displays, the frontplane and backplane are laminated together as frontplane and backplane components. In some embodiments, the flexible display 48 may be built in layers, e.g., starting with the backplane and ending with attaching the frontplane substrate.

As illustrated in FIG. 9, the display area 80 formed on the backplane component 81 of such a display 18 may be generally rectangular in shape and have a large aspect ratio, e.g., an aspect ratio where the length of the display area 80 is at least two times greater than the width of the display area 80, and, in some configurations, is at least five times greater than the width. The display area 80 includes any number of pixels or pixel elements, each of which may be connected to at least two connecting lines (e.g., electrical lines, lead lines, electrodes, connecting lines, connectors, etc.) for energization thereof. The electrical lines or connecting lines are disposed at the pixel elements and exit from the display area 80 via various sides of the display area 80. Generally, each line services a particular row or column of pixel elements. As such, in FIG. 9, the connection lines are illustrated as a first set of connecting lines 82 coming from one of the longitudinal sides and including a line 82 for each of y columns of pixels of the display area 80 (e.g., a set of longitudinal connecting lines), and a second set of connecting lines 84 coming from one of the transverse sides of the display area 80 and including a line 84 for each of x rows of pixels of the display area 80 (e.g., a set of transverse connecting lines). As is known, energization or connection between a particular connecting line 82 of a column $y_n$ and a connecting line 84 of a row $x_m$ of the display area will energize or turn on that corresponding pixel, and, as such, the corresponding pixel may be referred to using its two-dimensional coordinates, e.g., $(x_m, y_n)$ or $(y_n, x_m)$. In any event, as illustrated in FIG. 9, the sets of connecting lines 82, 84 exit from the display area 80 along the same backplane substrate 81 and are connected to one or more multiplexer or IC driving circuits 88, which may be formed, for example, on or near the edge of the backplane display substrate 81. The driving circuits 88 may be integral with the display driver 48 of the electronic suite 38, or the driving circuits 88 may be disposed separately from but nonetheless communicatively connected to the display driver 48, e.g., the driving circuits 88 are disposed on a flexible connector 90 connecting the backplane layer 81 to the electronics module 19. Typically, the flexible connector 90 is not integral with the backplane layer 81, but instead is a separate element that couples to the backplane layer 81 to communicate with the electronics module 19 and components included therein, such as the display driver 48.

A. Bending or Folding a Display

Figure 10:
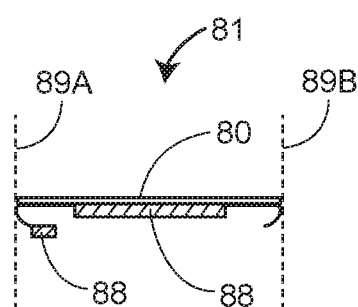
FIG. 10 illustrates a manner of bending the flexible display substrate of FIG. 9 to form a flexible display with a maximal display area on a surface.

FIG. 10 illustrates a manner of bending or folding a flexible display, e.g., of bending or folding of at least one substrate of a flexible display. The display may be, for example, the display 18 of FIG. 9 or another flexible display. Generally, referring to the display 18 as an illustrative but non-limiting example, the display 18 may be bent or folded so as to form a display that includes a maximum amount of display area 80 on the band 12 at which the display area 80 is viewable and to minimize the area of edges surrounding the display area 80 that are visible to the user. (For ease of viewing, the flexible connector 90 is not shown in FIGS. 10-11.) In FIG. 10 in particular, the bending may occur along the dotted line 89A, illustrated in FIG. 9, so as to fold over the backplane sections adjacent to the longitudinal side of the display area 80 at which the connecting lines 82 are disposed. This folding enables the connecting lines 82 to be bent down and under the display area 80, and enables the multiplexer or IC driving circuits 88 to be connected to the display driver 48 (disposed in, for example, one of electronics module 19 not shown in FIGS. 9 and 10) via separate electronics or electrical connections. Thus, as illustrated in FIG. 10, which depicts a cross-sectional end view of the flexible display 18, the flexible display 18 so formed and bent enables the separate longitudinal display lines 82 to be connected to different multiplexer or driving IC circuits 88, which are ultimately connected to the display driver 48 of FIG. 8, in order to energize the rows and columns of pixel elements of the flexible display 18 to thereby drive the display 18. As the fold 89A occurs along the edge of the display area 80, the areas of the backplane substrate of the flexible display 18 that are used to form the connecting lines 82 are disposed in a different plane than, and are disposed in some cases under the display area 80, and thus do not require the backplane substrate 81 to extend out towards the sides of the band 12 much beyond the edges of the display area 80. This configuration, in turn, enables the maximal amount of viewable display area to be disposed on the top portion of the band 12 which maximizes the viewable or usable area of the band 12 at which the display 18 can present viewable images. In some embodiments, the backplane substrate 81 may also be bent along the dotted line 89B along the opposite longitudinal side, even if the opposite longitudinal side does not support any electrodes or connectors thereon, e.g., for ease of manufacturing and/or for aesthetic considerations.

Figure 11:
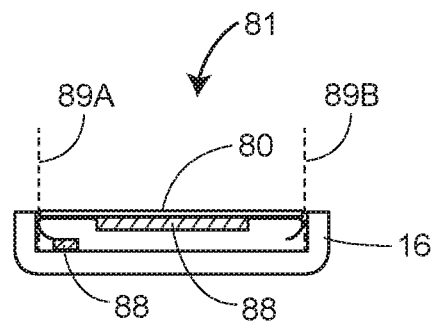
FIG. 11 illustrates an end view of a flexible display as provided in FIG. 10 disposed within a flexible support with side protection structure.

FIG. 11 illustrates a cross-sectional view of the display 18 bent as illustrated in FIG. 10 and disposed in or on a flexible support 16 of the band 12, with the display 18 having the maximal display area 80 thereon disposed up to the edges of the band of the device 10. In this case, the flexible support 16 is illustrated as having sidewalls to form a protective barrier to protect the display 18 at the edges thereof from side impacts. Of course, other manners of manufacturing the display 18 could be used and implemented to produce the dynamically flexible article or device 10.

In some cases (for example, due to the size of the display area 80, the material composition of the display 18, etc.), bending the backplane layer 81 so that the electrodes or connectors 82 are under the display area 80 may cause undesirable effects, such as interference between various electrical components of the backplane layer 81. Further, in order for the flexible display 18 to be as dynamically flexible as possible, the impact of the more rigid portions of the backplane layer 81 (e.g., the portions which support the less-flexible or rigid driving circuits 88) on the flexibility of the display area 80 is desired to be minimized. Still further, a minimum border extending from the display area 80 and viewable to a user may be necessary to seal the top and bottom layers of the flexible display 18, e.g., by using an environmental barrier material for the frontplane and backplane substrates and the seal, or by some other means. In electrophoretic displays, for instance, the required width of a border for sealing is typically around 2 to 6 mm.

Figure 12:
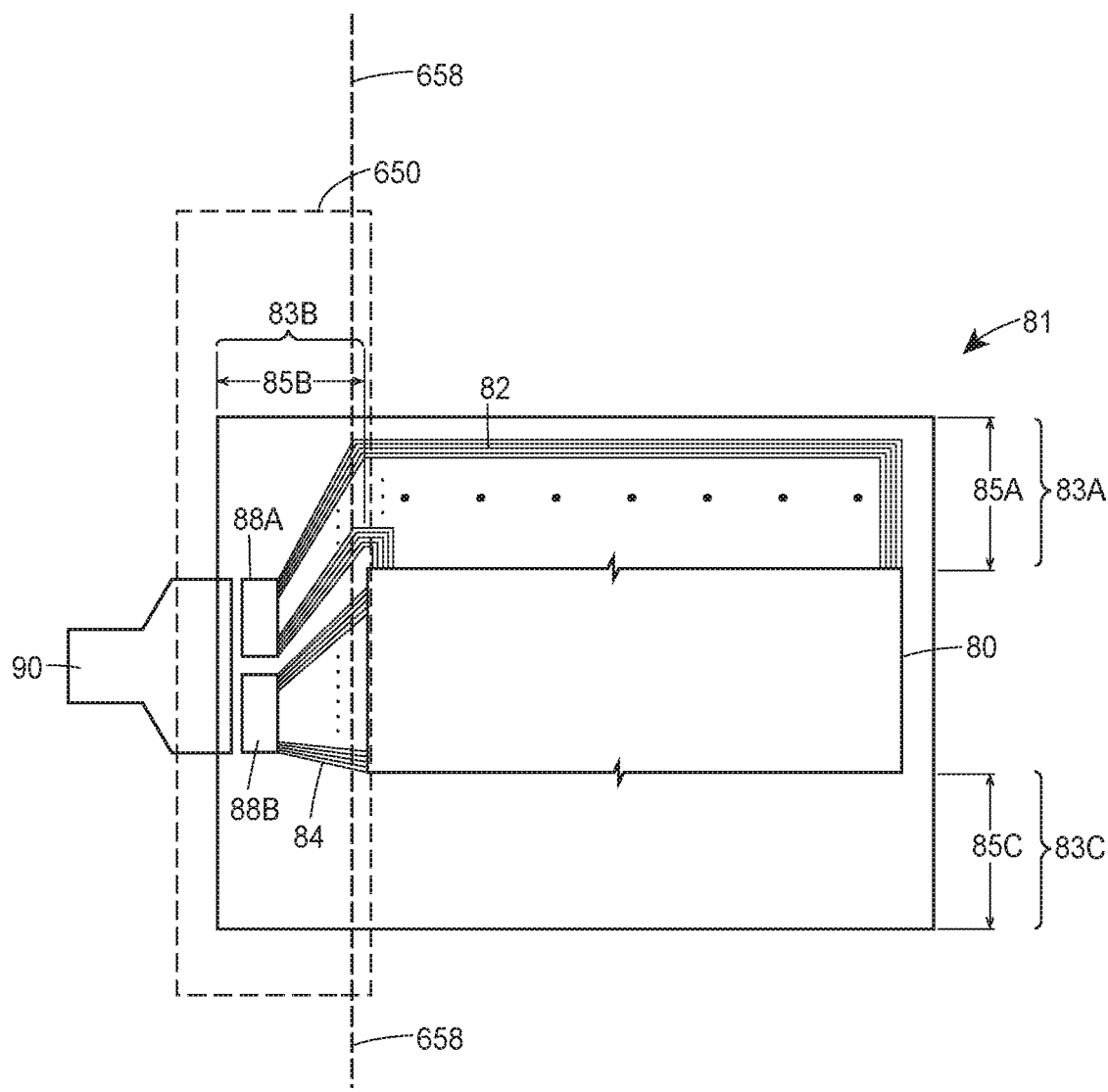
FIG. 12 illustrates a top view of a backplane layer of a flexible electronic display as formed on a flexible display substrate.

In such cases, an alternate configuration of the backplane layer 81 that maximizes the amount of area on the band 12 at which the display area 80 of the display 18 is viewable may be utilized. FIG. 12 illustrates such an example alternate configuration. Similar to the configuration illustrated in FIG. 9, the connecting lines 82, 84 and the driving circuits 88A, 88B are arranged on the backplane layer 81 in a single layer, and an optional flexible connector 90 couples the driving circuits 88 to the display driver 48 (which is not shown in FIG. 12). In FIG. 12, though, a transverse portion 83B of the backplane layer 81 supporting the driving circuits 88 is bent into a plane different from (and in some cases, underneath or parallel to) the display area 80, e.g., along the dotted line 658, while a longitudinal portion 83A of the backplane layer 81 supporting the longitudinal connectors 82 remains in the same plane as the display area 80. This bending configuration allows for maximum, continuous dynamic flexion of the display area 80, as the less flexible zone 650 of the band 12 corresponding to the relatively inflexible (e.g., rigid) driving circuits 88 is limited to a short end of the display area 80. Additionally, with this example configuration, undesired effects such as interference may be reduced.

B. Minimizing a Border Footprint of a Display

In FIG. 12, referring again to the display 18 as an illustrative but non-limiting example, the portion 83A of the backplane layer 81 supporting the routing of the connecting lines 82 between the display area 80 and the driving circuit 88A remains generally in the same plane as the display area 80, and is referred to as the longitudinal border area or footprint 83A of the backplane layer 81. Border area 83B of the backplane layer 81 is a transverse border area or footprint that has a width 85B and primarily supports the set of transverse connecting lines 84. Each connecting line of the sets 82, 84 supported by the borders 83A, 83B has a finite width, and spaces are required between the individual lines, e.g., to minimize interference. For example, the space or width of the backplane layer 81 that is required for each connecting line or electrode may be on the order of 4 to 25 microns (e.g., the sum of the individual electrode width and a corresponding required gap). Accordingly, for large aspect ratio flexible displays such as the flexible display 18 (e.g., where the length of the display is at least two times greater than the width of the display, and in some cases, is at least ten times greater that the width of the display), a width 85A of the longitudinal border 83A may be relatively large in order to support the total number of connecting lines 82 corresponding to the entire length of the display area 80. For example, for a display area 80 having a total number of 1200 pixels along its length (e.g., y=1200) and a total number of 200 pixels along its width (e.g., x=200), and in which each pixel is connected using a different individual connector 82, 84, the width 85A of the longitudinal border 83A may range from 6 to 18 mm (depending on the spacing between the connectors 82, e.g., 4 to 25 microns per individual connector 82). In some embodiments, the width 85C of the longitudinal border 83C along the opposite longitudinal side of the display area 80 is configured or manufactured to be equal to the width 85A, e.g., for ease of manufacturing, aesthetic, and/or other purposes, even though the opposite longitudinal border 83C does not support any electrodes or connectors thereon.

Accordingly, for the dynamically flexible article or device 10, to optimize a maximum amount of area on the band display area 80 on the top thereof that is viewable to the user (e.g., to maximize the amount of area on the band 12 at which the display area 80 is viewable while maintaining any minimum width necessary to maintain a seal between the top and bottom layers of the flexible display 18), the width 85A of the longitudinal footprint 83A may be optimized or minimized by reducing the number of longitudinal electrodes or connectors 82 that are supported by (e.g., routed through, included in) the footprint 83A. That is, the backplane layer 81 may be arranged or configured so that the width 85A of the longitudinal footprint 83A is less than the sum of the cumulative total of individual widths of the entirety of the set of longitudinal connectors 82 and any required spaces therebetween.

One example (not illustrated) of such an arrangement includes an embodiment in which the set of longitudinal connectors 82 is divided and supported by different driving circuits. For example, a portion of the longitudinal connectors 82 may be disposed on the border 83A, while another portion of the longitudinal connectors 82 is disposed on the border 85C. The portion of the longitudinal connectors 82 disposed on the border 85A may be driven the driving circuit 88A, and the portion of the longitudinal connectors 82 disposed on the border 85C may be driven by an additional driving circuit (e.g., an additional driving circuit 88C, not shown).

Figure 13A:
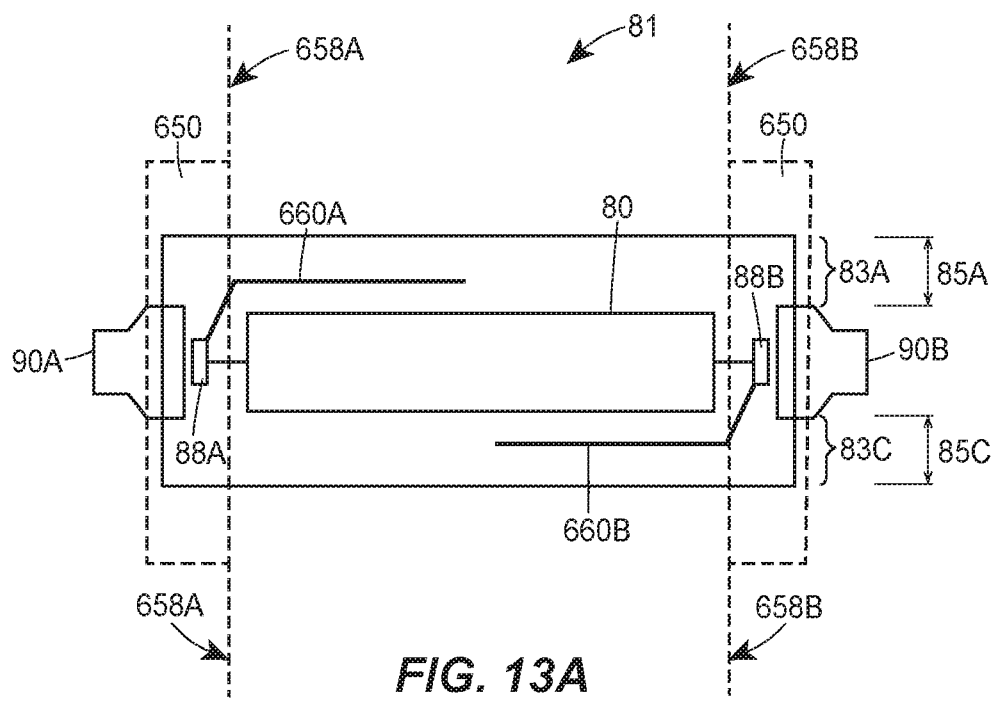
FIGS. 13A-13G illustrate top views of various example arrangements of elements on a backplane layer of a flexible electronic display as formed on a flexible display substrate to optimize or minimize the sizes, widths, or areas of one or more borders surrounding a display area.

In another example, FIG. 13A illustrates, in an exemplary but non-limiting manner, a block diagram of an arrangement of the backplane layer 81 of the display 18 that optimizes the longitudinal borders or footprints 83A, 83C of a dynamically flexible article or device 10 (e.g., minimizes the widths 85A, 85C of the longitudinal borders or footprints 83A, 83C of the device 10). In this arrangement, two driving circuits 88A, 88B are separately disposed on the backplane layer 81 at opposite short ends of the display area 80 (e.g., each along a respective transverse side of the display area 80), and connect to the display driver 48 (not shown) via respective flexible connectors 90A, 90B. Each of the driving circuits 88A, 88B drives half of the set of longitudinal connectors 82 and half of the set of transverse connectors 84, as generally denoted by the respective lines 660A and 660B, and each of the driving circuits 88A, 88B is bent into a respective plane different from (and in some cases, underneath or parallel to) the display area 80, e.g., as indicated by the dotted lines 658A, 658B, respectively, thus forming less flexible zones 650 of the band 12. Thus, in this arrangement, each longitudinal border 83A, 83C supports, at any given point along its length, a maximum of y/2 of the set of y longitudinal connectors 82, and accordingly, each of the widths 85A, 85C of the longitudinal borders 83A, 83C corresponds to a cumulative total of the individual widths of half of the set of y longitudinal connectors 82 and any required spaces therebetween. It is noted that in the arrangement of FIG. 13A, additional space for the driving circuits 88A, 88B on the backplane layer 81 is available (as compared to the arrangement of FIG. 12), and the two longitudinal border widths 85A, 85C are essentially symmetrical.

Figure 13B:
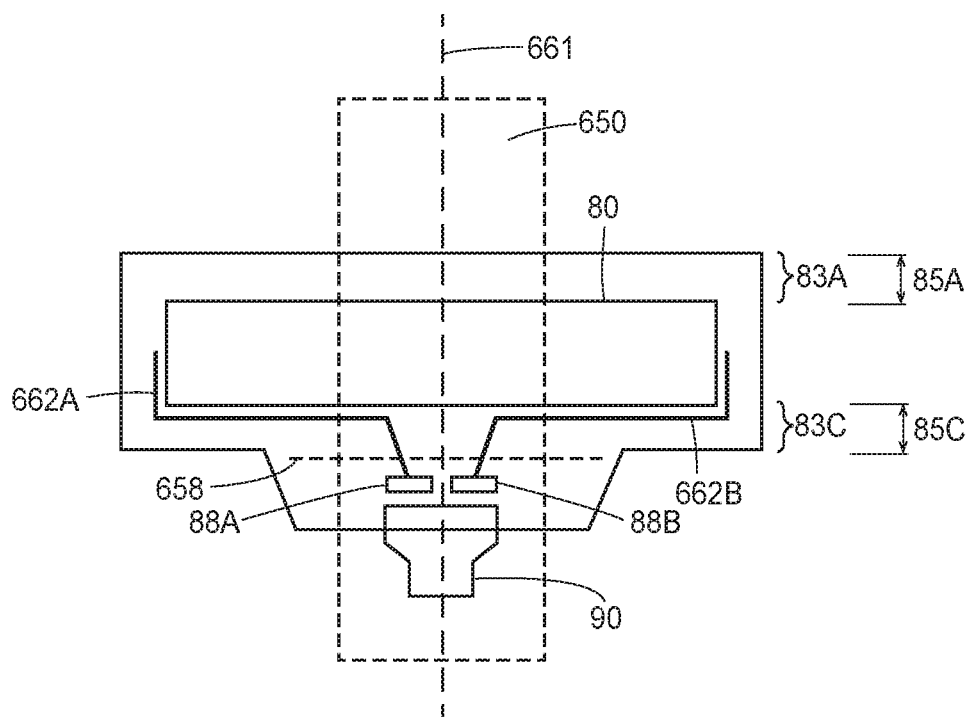

In another embodiment in which the longitudinal borders or footprints 83A, 83C are optimized, as illustrated in the block diagram of FIG. 13B, two driving circuits 88A, 88B are disposed along the length of the longitudinal side of the display area 80, e.g., straddling the transverse midline 661 of the display area 80, and connect to the display driver 48 (not shown) via a shared flexible connector 90. Each driving circuit 88A, 88B drives half of the set of longitudinal connectors 82 and half of the set of transverse connectors 84, as generally denoted by the respective lines 662A and 662B. Accordingly, in this arrangement, the longitudinal border 83C supports, at any given point along its length, a maximum of (y+x)/2 connectors 82, 84. Accordingly, the width 85C of the longitudinal border 83C corresponds to a cumulative total of the individual widths of (y+x)/2 connectors 82, 84 and any required spaces therebetween. However, it is noted that as the more rigid driving circuits 88A, 88B are bent into a plane different from (and in some cases, underneath or parallel to) the flexible display area 80 at the midline of the display area 80 (e.g., as denoted by the dotted line 658), a less flexible zone 650 is introduced into the display area 80, as indicated by the dashed outline. Furthermore, in some cases, the positioning of the driving circuits 88 in this arrangement may be offset or shifted along the longitudinal axis to a location other than at the transverse midline 661, thus resulting in each of the driving circuits 88A, 88B servicing different sized subsets of the longitudinal connectors 82. In these cases, the width 85C of the longitudinal border 83C corresponds to the cumulative total of the individual widths of the larger subset and any required spaces therebetween. In some embodiments, the width 85A of the longitudinal border 83A along the opposite longitudinal side of the display area 80 is configured or manufactured to be equal to the width 85C, e.g., for ease of manufacturing, aesthetic, and/or other purposes, even though the opposite longitudinal border 83A does not support any electrodes or connectors thereon.

Figure 13C:
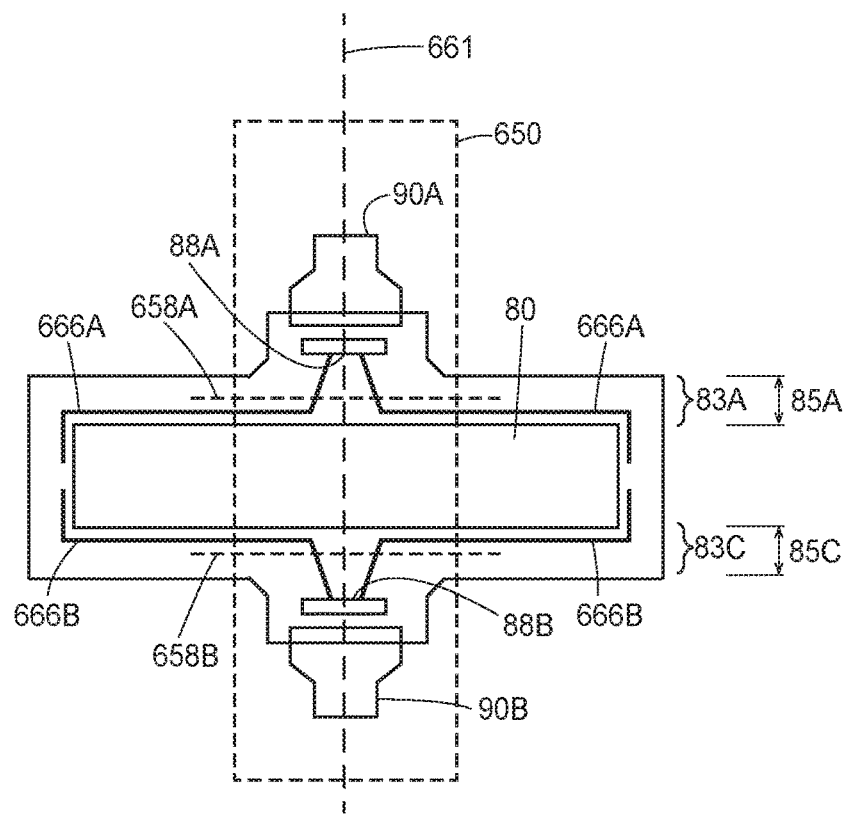

In yet another configuration, as illustrated in the block diagram of FIG. 13C, the driving circuits 88A, 88B are disposed on opposite longitudinal sides of the display area 80 at or near the transverse midline 661 of the length of the display area 80, and connect to the display driver 48 (not shown) via respective flexible connectors 90A, 90B. Each driving circuit 88A, 88B drives half of the set of longitudinal connectors 82 and half of the set of transverse connectors 84, however, as each driving circuit 88A is disposed at or near the midline of the longitudinal length of the display area 80, each longitudinal border 83A, 83C supports, at any given point along its length, a maximum of (y+x)/4 connectors 82, 84, as generally denoted by the lines 666A and 666B, respectively. As such, each of the widths 85A, 85C of the longitudinal borders 83A, 83C corresponds to a cumulative total of the individual widths of (y+x)/4 of the connectors 82, 84. Similar to FIG. 13B, as the more rigid driving circuits 88A, 88B are bent into respective planes different from (and in some cases, underneath or parallel to) the flexible display area 80 at the midline of the display area 80 (e.g., as represented by the dotted lines 658A, 658B, respectively), a less flexible zone 650 is introduced into the display area 80, as denoted by the dashed box. Also similar to FIG. 13B, in some cases, the positioning of the driving circuits 88 in this arrangement is offset or shifted along the longitudinal axis to a location other than at the transverse midline 661 of the display 80, thus resulting in each of the driving circuits 88A, 88B servicing different sized subsets of the longitudinal connectors 82. In these cases, each of the widths 85A, 85C of the longitudinal borders 83A, 83C corresponds to the cumulative total of the individual widths of the larger subset and any required spaces therebetween.

Figure 13D:
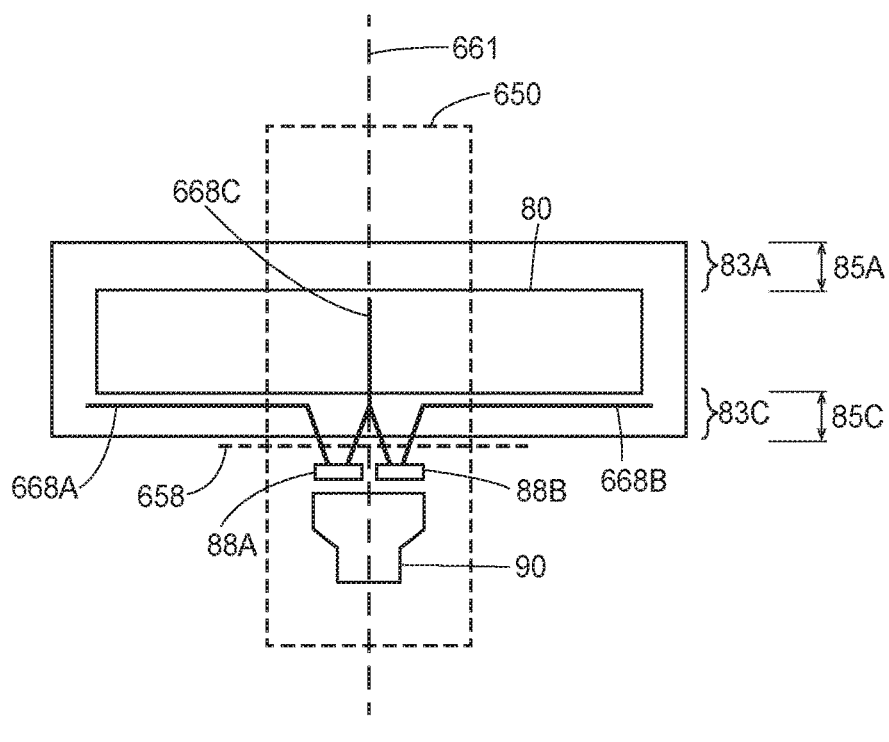

In still a further case in which longitudinal borders 83A, 83C are optimized, as illustrated by the block diagram of FIG. 13D, two driving circuits 88A, 88B are disposed along the length of the longitudinal side of the display area 80, e.g., straddling the transverse midline 661 of the display area 80, and connect to the display driver 48 (not shown) via a shared flexible connector 90. Each driving circuit 88A, 88B drives half of the set of longitudinal connectors 82, as denoted by the respective lines 668A, 668B. In FIG. 13D, the set of longitudinal connectors 82 is connected in pixel to the set of transverse connectors 84, as denoted by the line 668C. The pixel connection may be accomplished, for example, by adding another electrode layer in the display 18, by adapting the pixel design to accommodate an additional electrode line, or by using some other suitable technique. As shown in this arrangement, the longitudinal border 83C supports, at any given point along its length, a maximum of y/2 of the set of y longitudinal connectors 82, and thus the width 85C of the longitudinal border 83C corresponds to a cumulative total of the individual widths of half of the set of y longitudinal connectors 82 and any required spaces therebetween. This arrangement also includes a less flexible zone 650 as the more rigid driving circuits 88A, 88B are bent into a plane different from (and in some cases, underneath or parallel to) the flexible display area 80 at the midline of the display area 80 (e.g., as denoted by the dotted line 658). In some cases, the positioning of the driving circuits 88 may be offset or shifted along the longitudinal axis to a location other than at the transverse midline 661, thus resulting in each of the driving circuits 88A, 88B servicing different sized subsets of the longitudinal connectors 82. In these cases, the width 85C of the longitudinal border 83C corresponds to the cumulative total of the individual widths of the larger subset and any required spaces therebetween. In some embodiments, the width 85A of the longitudinal border 83A along the opposite longitudinal side of the display area 80 is configured or manufactured to be equal to the width 85C, e.g., for ease of manufacturing, aesthetic, and/or other purposes, even though the opposite longitudinal border 83A does not support any electrodes or connectors thereon.

Figure 13E:
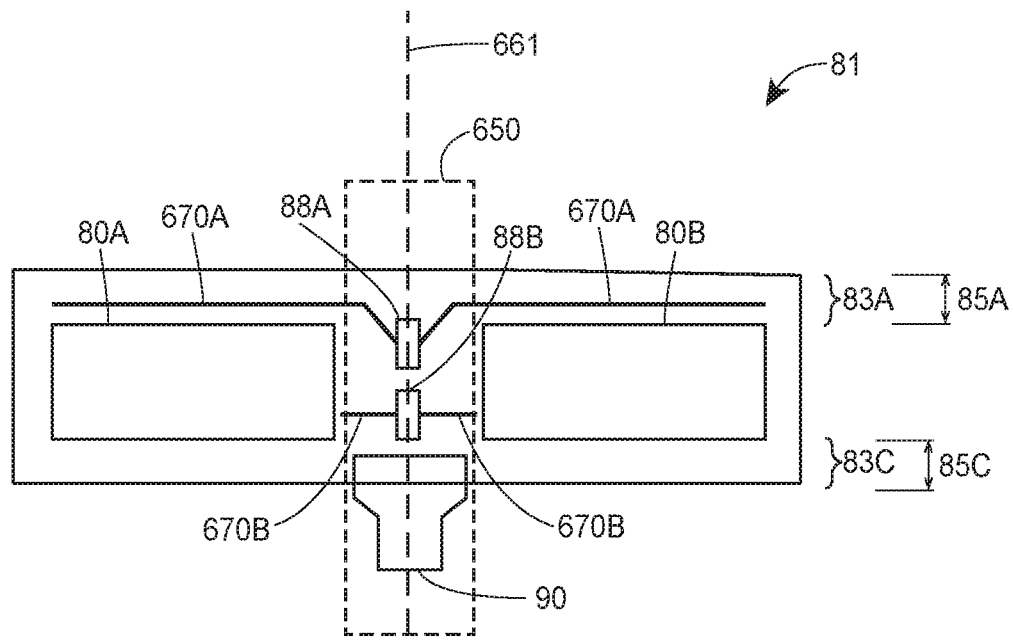

In another embodiment, as illustrated by the block diagram of FIG. 13E, the display area 80 is divided into two separated portions 80A, 80B. Two driving circuits 88A, 88B are disposed between the display area portions 80A, 80B at the transverse midline 661 of the length of the longitudinal side of the band 12, and connect to the display driver 48 (not shown) via a shared flexible connector 90. One of the driving circuits 88A drives the set of longitudinal connectors 82, as indicated by the lines 670A, and the other driving circuit 88B drives the set of transverse connectors 84, as indicated by the lines 670B. Accordingly, in this embodiment, the width 85A of the longitudinal border 83A corresponds to a cumulative total of the individual widths of half of the set of y longitudinal connectors 82 and any required spaces therebetween. However, it is noted that as the more rigid driving circuits 88A, 88B are disposed between the flexible display areas 80A, 80B, a less flexible zone 650 without any display are thereon is introduced, as denoted by the dashed box. In some situations, the positioning of the driving circuits 88 in this arrangement is offset or shifted along the longitudinal axis to a location other than at the transverse midline 661, thus resulting in the driving circuit 88A servicing two different sized subsets of the longitudinal connectors 82 corresponding to two display areas 80A, 80B of different longitudinal lengths. In these cases, the width 85A of the longitudinal border 83A corresponds to the cumulative total of the individual widths of the larger subset and any required spaces therebetween. In some embodiments, the width 85C of the longitudinal border 83C along the opposite longitudinal side of the display area 80 is configured or manufactured to be equal to the width 85A, e.g., for ease of manufacturing, aesthetic, and/or other purposes, even though the opposite longitudinal border 83C does not support any electrodes or connectors thereon.

Figure 13F:
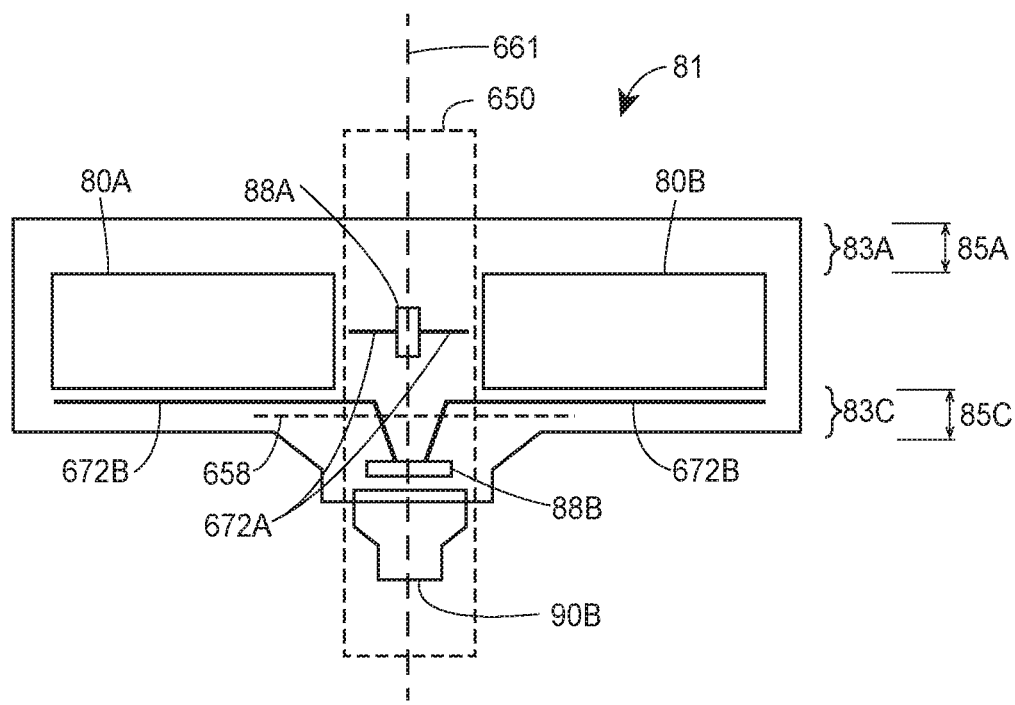

In yet another embodiment, as illustrated by the block diagram of FIG. 13F, the display area 80 is divided into two separated portions 80A, 80B. One driving circuits 88A is disposed between the display area portions 80A, 80B at the transverse midline 661 of the length of the longitudinal side of the band 12 and drives the set of transverse connectors 84, as indicated by the lines 672A. Another driving circuit 88B is disposed in a position adjacent to the endpoint of the transverse midline 661 of the band 12, and drives the set of longitudinal connectors 82, as indicated by the lines 672B. Both driving circuits 88A, 88B connect to the display driver 48 (not shown) via a shared flexible connector 90. Thus, in this embodiment, the width 85C of the longitudinal border 83C corresponds to a cumulative total of the individual widths of half of the set of y longitudinal connectors 82 and any required spaces therebetween. However, it is noted that as the driving circuit 88A is disposed between the flexible display areas 80A, 80B, and as the driving circuit 88B is bent into a plane different from (and in some cases, underneath or parallel to) the portion of the backplane layer 81 between the display areas 80A, 80B (e.g., as denoted by the dotted line 658), a less flexible zone 650 is introduced between the display areas 80A, 80B. In some situations, the positioning of the driving circuits 88 in this arrangement may be offset or shifted along the longitudinal axis to a location other than at the transverse midline 661, thus resulting in the driving circuit 88B servicing two different sized subsets of the longitudinal connectors 82 corresponding to two display areas 80A, 80B of different longitudinal lengths. In these cases, the width 85C of the longitudinal border 83C corresponds to the cumulative total of the individual widths of the larger subset and any required spaces therebetween. In some embodiments, the width 85A of the longitudinal border 83A along the opposite longitudinal side of the display area 80 is configured or manufactured to be equal to the width 85C, e.g., for ease of manufacturing, aesthetic, and/or other purposes, even though the opposite longitudinal border 83A does not support any electrodes or connectors thereon.

Figure 13G:
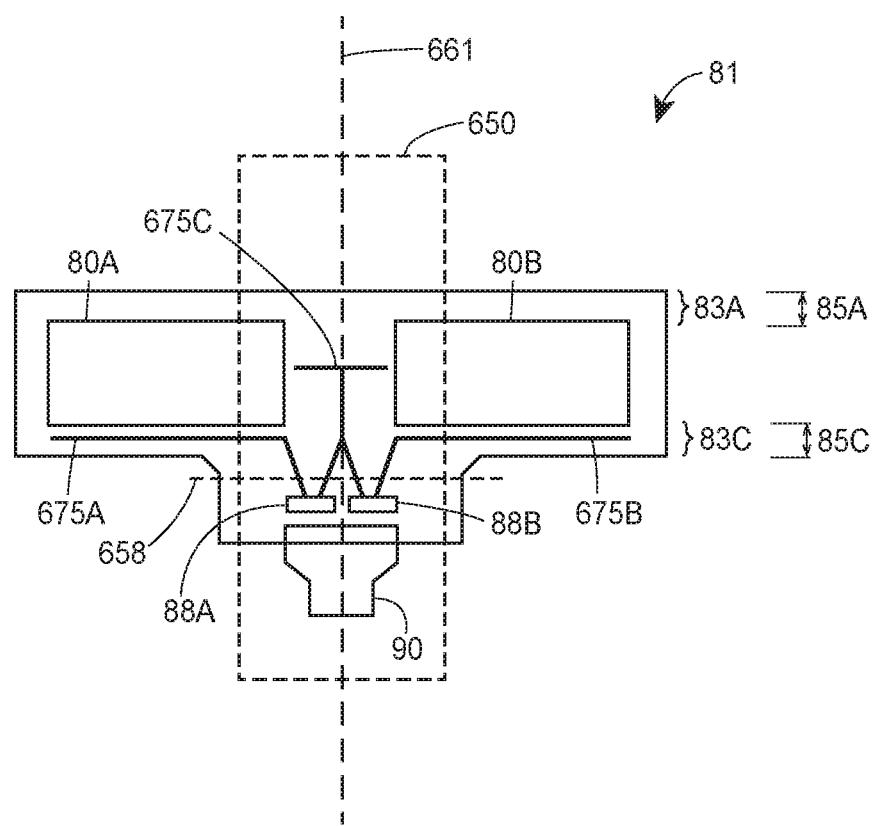

In still other cases, as illustrated by the block diagram of FIG. 13G, two driving circuits 88A, 88B are disposed along the length of the longitudinal side of the display area 80, which is divided into two separated portions 80A, 80B. The driving circuits 88A, 88B straddle the transverse midline 661 of the display 80, and connect to the display driver 48 (not shown) via a shared flexible connector 90. Additionally, each driving circuit 88A, 88B drives half of the set of longitudinal connectors 82, as denoted by the respective lines 675A, 675B, and each driving circuit 88A, 88B also drives half of the set of transverse connectors 84, as denoted by the line 675C. Thus, the longitudinal border 83C supports, at any given point along its length, a maximum of y/2 of the set of y longitudinal connectors 82, and accordingly, the width 85C of the longitudinal border 83C corresponds to a cumulative total of the individual widths of half of the set of y longitudinal connectors 82 and any required spaces therebetween. This arrangement also includes a less flexible zone as the driving circuits 88A, 88B are bent into a plane different from (and in some cases, underneath or parallel to) the flexible display area 80 (e.g., as indicated by the dotted line 658). If desired, the positioning of the driving circuits 88 may be offset or shifted along the longitudinal axis to a location other than at the transverse midline 661, thus resulting in each of the driving circuits 88A, 88B servicing different sized subsets of the longitudinal connectors 82. In these situations, the width 85C of the longitudinal border 83C corresponds to the cumulative total of the individual widths of the larger subset and any required spaces therebetween. In some embodiments, the width 85A of the longitudinal border 83A along the opposite longitudinal side of the display area 80 is configured or manufactured to be equal to the width 85C, e.g., for ease of manufacturing, aesthetic, and/or other purposes, even though the opposite longitudinal border 83A does not support any electrodes or connectors thereon. Furthermore, the principles illustrated by FIG. 13G may easily be applied to another example configuration in which each of the longitudinal footprints 83A, 83C supports, at any given point along its respective length, a maximum of y/4 of the set of y longitudinal connectors 82, e.g., by increasing the spacing between the display areas 80A, 80B to utilize for electrode routing.

As discussed above, each of the example arrangements illustrated in FIGS. 12 and 13A-13G includes a less flexible zone 650 at a location along the length of the band 12 of the dynamically flexible article or device 10, which generally corresponds to the placement of one or more driving circuits 88 along the band 12. In some embodiments, one or more electronic boards (e.g., that support one or more elements of the electronics suite 38), the battery 40, and/or other more rigid parts or elements of the device 10 may positioned in a layered manner with the less flexible zone 650 of the band 12. Additionally, if desired, the flexible support 16 included in any of the arrangements in FIGS. 12 and 13A-13G may have sidewalls to form a protective barrier to protect the folded edges 658, e.g., in a manner similar to that shown in FIG. 11.

C. Sharing Connecting Lines of a Display

Figure 14A:
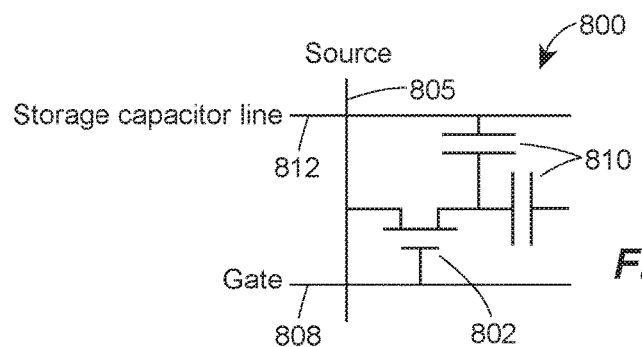
FIG. 14A is an electrical schematic diagram of an example typical display element or pixel element.
Figure 14B:
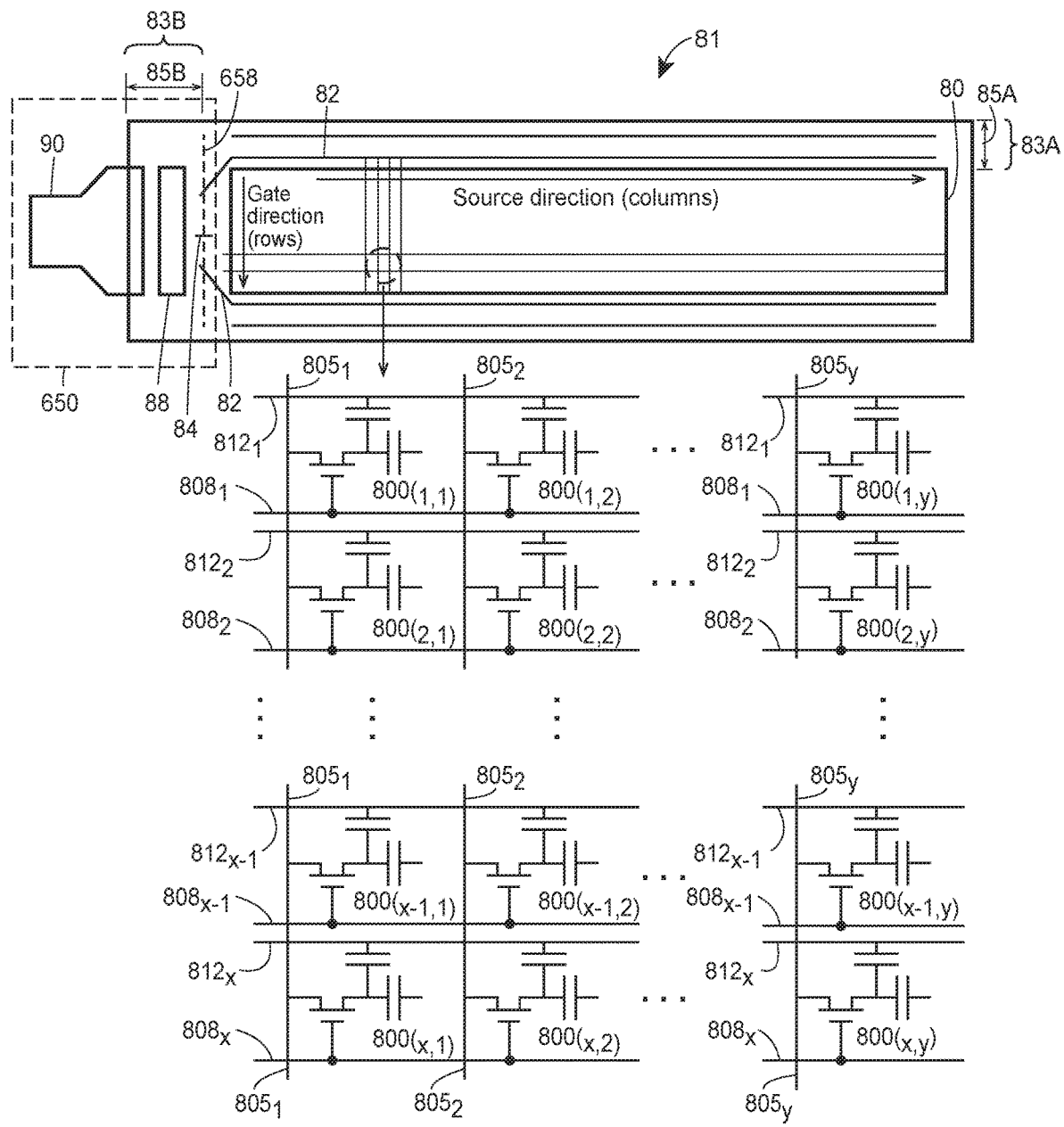
FIG. 14B illustrates an electrical schematic diagram of an example array of typical display or pixel elements used in a display in a typical manner, in which a single source line is associated with each of the pixel elements any particular column of the pixel array and a single gate line is associated with each of the pixel elements in any row of the pixel array.

Referring again to the display 18 as an illustrative but non-limiting example, another manner of maximizing the display area 80 of the display 18 and minimizing the widths of edges that surround the display area 80 and that are visible to the user includes utilizing pixel elements that share connecting lines (e.g., that share source connecting lines and/or that share gate connecting lines). Currently known pixel elements, such as those used in electronic paper displays (EPDs) or in liquid-crystal displays (LCDs), typically utilize one source line and one gate line per pixel element and do not share the same combination of source line and gate line with other pixel elements. FIG. 14A illustrates a schematic block diagram of an example of such a known, typical pixel element 800. As seen in FIG. 14A, the typical pixel element 800 includes a TFT (thin film transistor) 802 via which the pixel element 800 is addressed, and that is connected to a source line 805 and to a gate line 808. The pixel element 800 typically also includes a capacitor 810 which is in connection with a storage capacitor line 812. FIG. 14B depicts a plurality of the pixel elements 800 arranged in an array 820 of x rows and y columns to service a flexible display 18, e.g., which may be a part of a dynamically flexible article 10 having a flexible backplane 81. As seen in FIG. 14B, the array 820 includes a total number x*y of typical pixel elements $800_{(1,1)}$ to $800_{(x,y)}$ arranged in x rows and y columns, and the array 820 utilizes y source lines $805_1$-$805_y$, x gate lines $808_1$-$808_x$, and x storage capacitor lines $812_1$-$812_x$. Consequently, a total number of source lines $805_1$-$805_y$ that extend into a longitudinal border 83A of the display area 80 and that are routed to a driving circuit 88 (which is shown in FIG. 14B as being disposed on a transverse border 85A of the backplane 81) equals the total number of columns of pixels y. Thus, in FIG. 14B, the width 85A of the border 83A is equivalent to the cumulative widths of y source lines and any required spaces therebetween.

Figure 15:
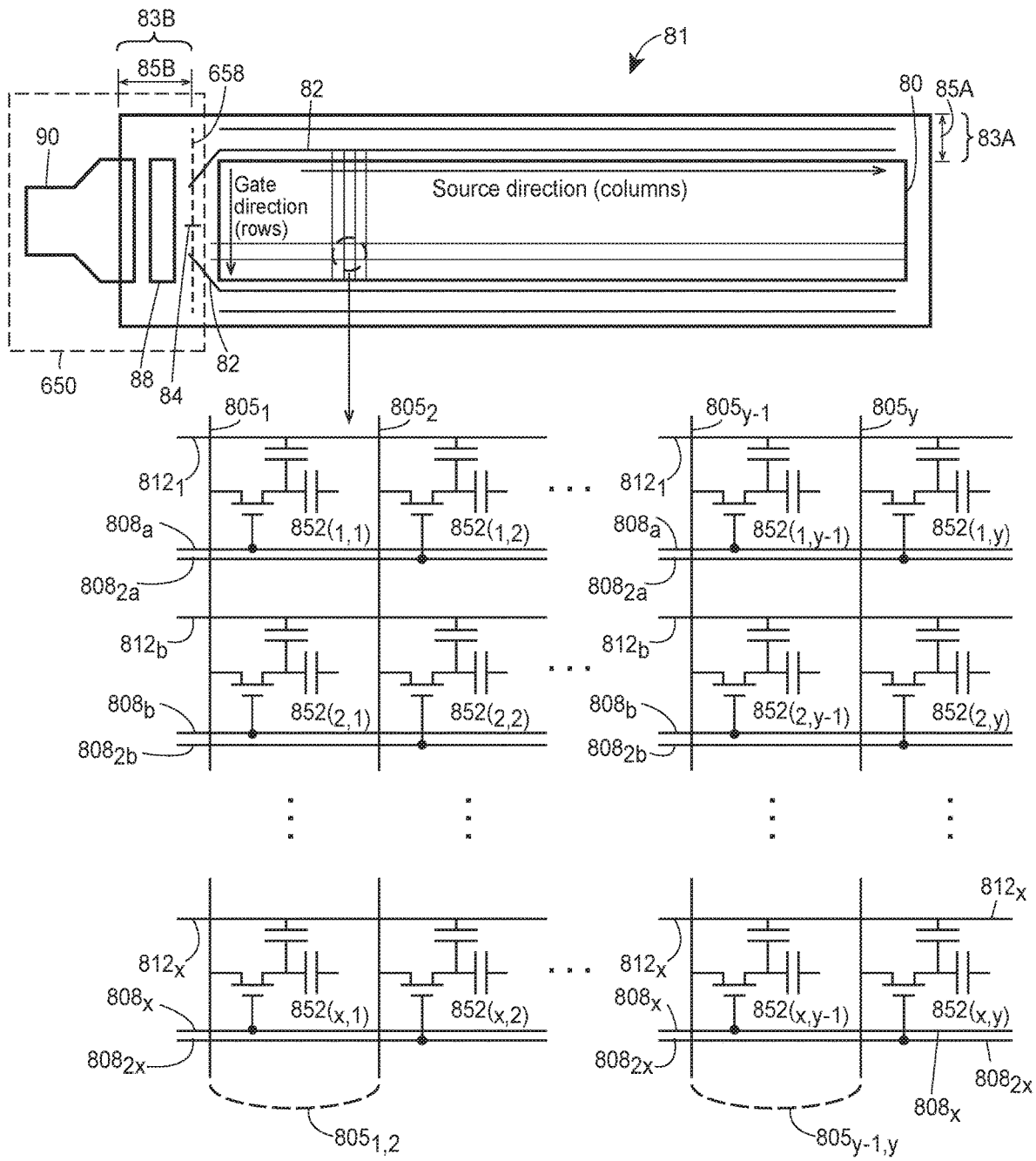
FIG. 15 illustrates a first example electrical schematic layout of an array of display or pixel elements that are configured to have multiple columns of pixel elements share the same source line, and each row of pixel elements to include two gate lines, to thereby decrease the edge profile on the pixel array along one dimension of the array.

On the other hand, FIG. 15 illustrates an array 850 having a number x*y of pixel elements $852_{(1,1)}$ to $852_{(x,y)}$ that are arranged in x rows and y columns and that utilize shared source lines across two or more columns of the array 850. Similar to FIG. 14B, the array 850 services a flexible display 18 of a dynamically flexible article 10 having a flexible backplane 81, and the pixels $852_{(1,1)}$ to $852_{(x,y)}$ are energized by one or more driving circuits 88. However, in FIG. 15, while each pixel 852 utilizes one source line and one gate line for energization, pairs of source lines within the array 850 are connected together (e.g., electrically connected) so that pairs of pixel columns share the same source line. For example, source lines $805_1$ and $805_2$ are connected to form a single source line $805_{1,2}$ to which pixel elements $852_{(1,1)}$-$852_{(x,1)}$ and $852_{(1,2)}$-$852_{(x,2)}$ each connect. Additionally, source lines $805_{y-1}$ and $805_y$ are connected to form a single source line $805_{y-1,y}$, to which pixel elements $852_{(1,y-1)}$-$852_{(x,y-1)}$ and $852_{(1,y)}$-$852_{(x,y)}$ each connect. To be able to drive each pixel element 852 individually, though, an additional x gate lines $808_{2a}$-$808_{2x}$ are included with the gate lines $808_a$-$808_x$, and different columns of pixels sharing the same source line are connected to different gate lines. For instance, pixel element $852_{(1,1)}$ connects to source line $805_{1,2}$ and to gate line $808_a$, pixel element $852_{(1,2)}$ connects to source line $805_{1,2}$ and to gate line $808_{2a}$, pixel element $852_{(2,1)}$ connects to source line $805_{1,2}$ and to gate line $808_b$, pixel element $852_{(2,2)}$ connects to source line $805_{1,2}$ and to gate line $808_{2b}$, pixel element $852_{(x,y-1)}$ connects to source line $805_{y-1,y}$ and to gate line $808_x$, and pixel element $852_{(x,y)}$ connects to source line $805_{y-1,y}$ and to gate line $808_{2x}$. Accordingly, as seen in FIG. 15, the array 850 of x rows and y columns of pixel elements 852 utilizes 0.5 y source lines $805_{1,2}$ to $805_{y-1,y}$, 2x gate lines $808_a$-$808_{2x}$, and x storage capacitor lines $812_1$-$812_x$. Consequently, a total number of source lines $805_{1,2}$-$805_{y-1,y}$ that extend into a longitudinal border 83A of the display area 80 and that are routed to the driving circuit 88 (shown in FIG. 15 as being disposed on a transverse border 85A of the backplane 81) equals half of the total number of columns of pixels y, .e.g., y/2. Thus, in FIG. 15, the width 85A of the longitudinal border 83A is equivalent to the cumulative widths of y/2 source lines and any required spaces therebetween, and as such, decreases the width of the border 83A by a factor of two over that of FIG. 14B.

It is noted that in FIG. 15, the width of the transverse border 85B increases by a factor of two over that shown in FIG. 14B. However, this increased transverse border width 85B may be tolerable for certain applications and configurations of the dynamically flexible article 10. For example, when the article 10 is attached around a user's wrist, the increased transverse border width 85B typically is covered by overlapping band 12 edges, e.g., on the bottom of a user's wrist. It is also noted that in some embodiments, which may be suitable for other applications, the source and the gate directions of the pixels 852 may be reversed so that the transverse border width 85B is reduced while the longitudinal border width 85A is increased. Still further, in some embodiments, the border width 85A or 85B may be decreased by more than a factor of two, e.g., when more than two source lines 805 are electrically connected.

Further, in light of the above, for an array of pixels having x rows, y columns, and n shared source connecting lines (where each shared source connecting line is shared by more than one column of pixels, and thus n is less than y), a total number of gate connecting lines to service the array of pixels can be represented by the expression x*(y/n) when the gate connecting lines are not shared between rows of pixels. Similarly, for an array of pixels having x rows, y columns, and n shared gate connecting lines (where each shared gate connecting line is shared by more than one row of pixels, and thus n is less than x), a total number of source connecting lines to service the array of pixels can be represented by the expression y*(x/n) when the source connecting lines are not shared between columns of pixels.

Still further, in embodiments in which pixels in different rows share gate connecting lines or pixels in different columns share source connecting lines, the addressing or supply of the image content data necessarily reflects the shared source lines 805 and the additional gate lines 808 (or vice versa, in embodiments in which gate lines 808 are shared). For example, the processor 42 may be converted to support energizing the appropriate pixels of the array 850, or the display driver 88 may convert image content data so that the appropriate pixels 852 are energized with the correct image data.

Figure 16:
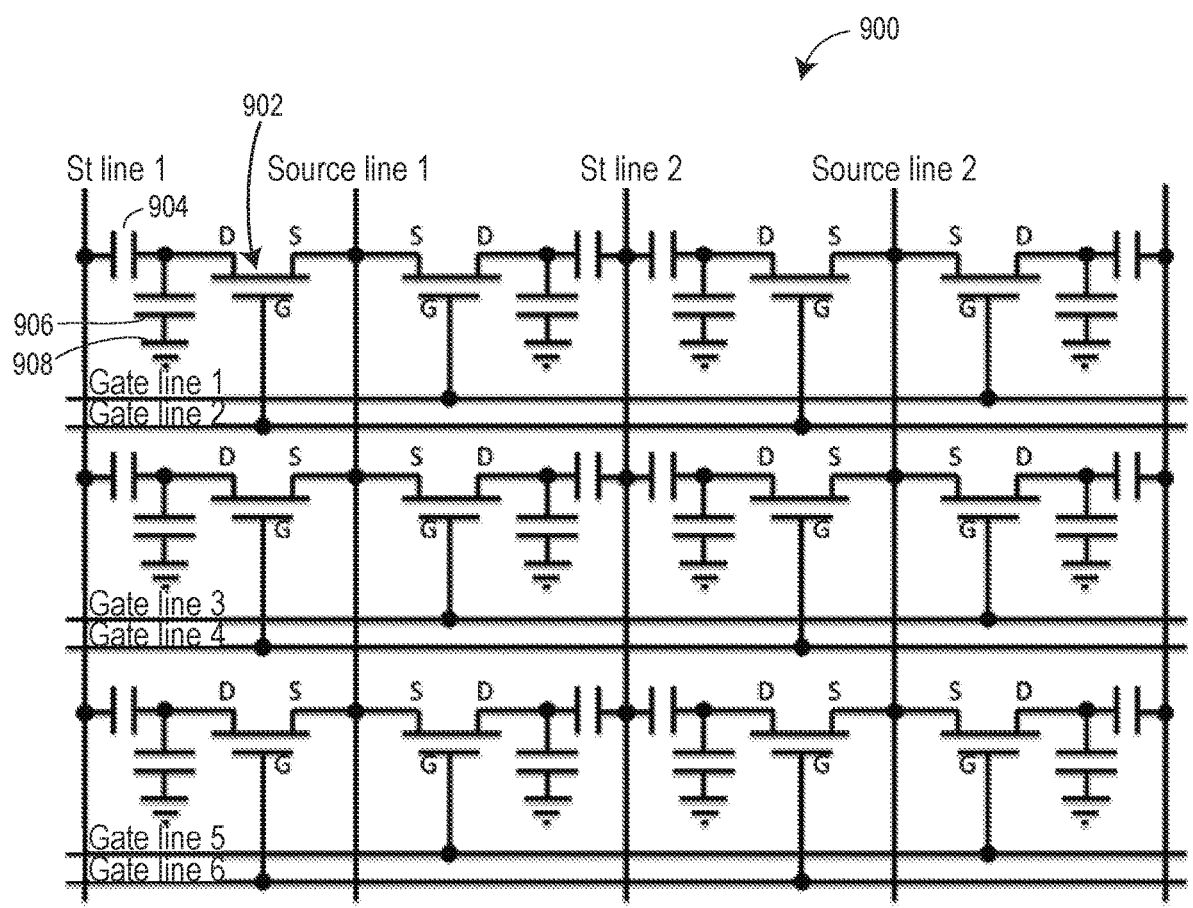
FIG. 16 illustrates a second example electrical schematic layout of an array of display or pixel elements that are configured to have multiple columns of pixel elements share a single source line and to have each row of pixel elements have two or more gate lines, to thereby decrease the edge profile on the pixel array along one dimension of the array.

FIG. 16 illustrates a further example of a pixel array configured to reduce the number of source lines, at the expense of increasing the number of gate lines, used in the pixel array to further minimize the edge profile along the edge of the display at which the source lines are connected to the driving circuit. In particular, FIG. 16 illustrates a further proposed configuration that exchanges gate lines for source lines to be able to reduce the footprint (inactive area outside the matrix used for routing the electrode lines) at two of the sides of the display (e.g., the top and bottom of the display). FIG. 16 provides a display design where the number of gate lines is doubled (over that of FIG. 14A), while the number of source lines is reduced by a factor of two, which is accomplished by running the source lines so that each source line is connected to the source electrodes of the transistors for each pixel in two adjacent columns of pixels. In this case, the adjacent columns of pixels may be formed as mirror images of one another (as depicted in FIG. 16) to reduce the number of source lines extending along the column dimension of the pixel array. This configuration reduces the footprint at the long side of the display by almost a factor of two, and is especially beneficial for displays with a large aspect ratio.

More particularly, FIG. 16 depicts an electrical circuit schematic (as well as a layout schematic) of a set of pixels in a pixel array 900 in which each source line is connected to the TFTs in each of two columns of pixel elements, and in which the storage capacitor lines (each labeled as an "St line") are disposed along or extend through the pixel array 900 along or in same direction as the source lines. As typical, each pixel element in the pixel array 900 includes a TFT 902, having a source electrode (S), a drain electrode (D) and a gate electrode (G), a storage capacitor 904, and pixel electrodes in the form of a pixel capacitor 906 and a top pixel electrode 908. This design uses twice the number of gate lines (as each pixel row in the pixel array 900 includes two gate lines, each of which is connected to one-half of the pixel element TFTs in the pixel row) and uses one-half of the number of source lines (as each source line is connected to each pixel element TFT in two adjacent columns of pixel elements) for the same row and column pixel count as the typical configuration of FIG. 14A. Moreover, in this case, the storage capacitor lines are disposed along the columns, or in the source line direction and also have been reduced to one-half the original number of storage capacitor lines, as each storage capacitor line is also connected to a storage capacitor electrode of the storage capacitors of each pixel element in two adjacent columns of pixel elements. This configuration results in the amount of crossings between electrode lines per pixel being identical to the typical manner of laying out pixel elements as illustrated in FIG. 14A, that is, in which each pixel column and each pixel row has a single source line, a single storage line and a single gate line associated therewith. The configuration of FIG. 16 also reduces the amount of source electrodes by a factor of two (as two adjacent pixels can share a single source electrode.) Moreover, because the storage capacitor lines are all connected together on one electrode outside the pixel matrix, the configuration of FIG. 16 does not add significantly to the edge footprint on the sides of the pixel matrix at which the source lines are connected.

Using this configuration in a display that uses a pixel array of 200 by 1000, for example, results in a substantial reduction of the footprint (inactive border area) at the long side by reducing the number of source lines that need to be separately connected to a driving circuit from 1000 to 500, while only increasing the number of gate lines from 200 to 400.

A pixel array using the configuration of FIG. 16 may be laid out in any desired or suitable manner. However, in one case, such an array may be configured to offset the pixel element TFT 902 from the pixel electrode for the pixel element, so that the TFT 902 is not directly beneath the pixel electrode that the TFT is controlling. This configuration reduces the interference or noise experienced by the pixel element when energized.

Figure 17A:
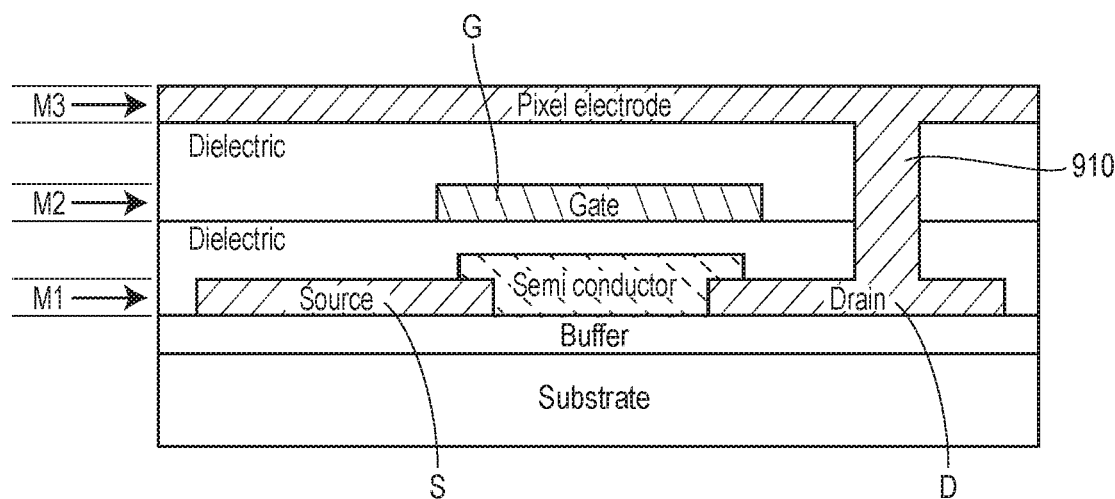
FIG. 17A depicts a partial layer diagram of a typical display or pixel element.
Figure 17B:
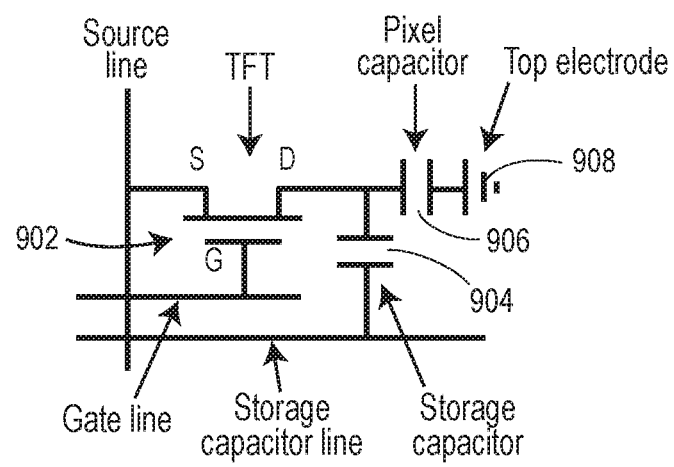
FIG. 17B depicts an electrical schematic diagram of the pixel element of FIG. 17A.

To illustrate one manner of offsetting the TFT for a pixel element from its associated pixel electrode when implementing the configuration of FIG. 16, it is useful to first understand a layer diagram for a typical pixel element. FIGS. 17A and 17B illustrate such a diagram and, in particular, FIG. 17A illustrates a partial layer diagram of a typical pixel element while FIG. 17B illustrates the electrical circuit schematic of the layer diagram of FIG. 17A. Generally speaking, the electrical schematic of an active-matrix display element shown in FIGS. 17A and 17B is a simple 1T1C schematic that is typically used by electrophoretic (E Ink) displays, LCDs, electrowetting displays, etc. OLED displays have a more complex electrical schematic, where typically more TFTs per pixel are used (and sometimes also more capacitors). In any event, the layout schematic of FIG. 17A illustrates the so-called top gate—bottom contact configuration, and has the gate electrode G disposed on top of the source electrode S and the drain electrode D, which are separated from each other and from the gate electrode G by a semiconductor material. By way of construction, the layer diagram of FIG. 17A includes three metal layers, M1, M2 and M3, separated by various other materials such as dielectric and semi-conductor materials. The first metal layer M1 includes the source S and the drain D electrodes, the second metal layer M2 includes the gate electrode G disposed on top of or over the source S and drain D electrodes, which are separated by a semi-conductor material, and the third metal layer M3 includes the pixel electrode, which, in this case, is the bottom electrode of the pixel capacitor 906. The other components of the pixel capacitor 906 and the pixel top electrode 908 are not shown in FIG. 17A, but would be disposed on top of the third metal layer M3. In this case, the drain D is connected to a via 910 which is a metal (conductive) material that extends up through the layer stack and connects the first metal layer M1, the second metal layer M2 and the third metal layer M3, at which the bottom layer of the pixel electrode is formed. Of course, the semiconductor material is formed or deposited between and/or over the source and drain electrodes and dielectric material layers are disposed between the first and second and between the second and third metal layers, as illustrated in FIG. 1.

Thus, FIG. 17A depicts the layer stack up to the pixel electrode layer (not showing the top of the pixel electrode and the top electrode layers) and FIG. 17B illustrates an electrical schematic of a typical LCD or electrophoretic pixel, where the pixel capacitor is formed by the pixel electrode and the top electrode. As illustrated in FIG. 17A, the source (S) and drain (D) are in the first metal layer (M1), the gate and storage capacitor lines (not shown) are in the second metal layer (M2), and the bottom electrode of the pixel capacitor is in the third metal layer (M3). The storage capacitor (not shown in FIG. 17A) is created between the metal layers M1 and M2. Alternative layer stacks that are also used in the industry include, amongst others, the bottom gate—bottom contact and the bottom gate—top contact configurations. The concepts described herein are applicable to these and other layer configurations as well.

Figure 18A:
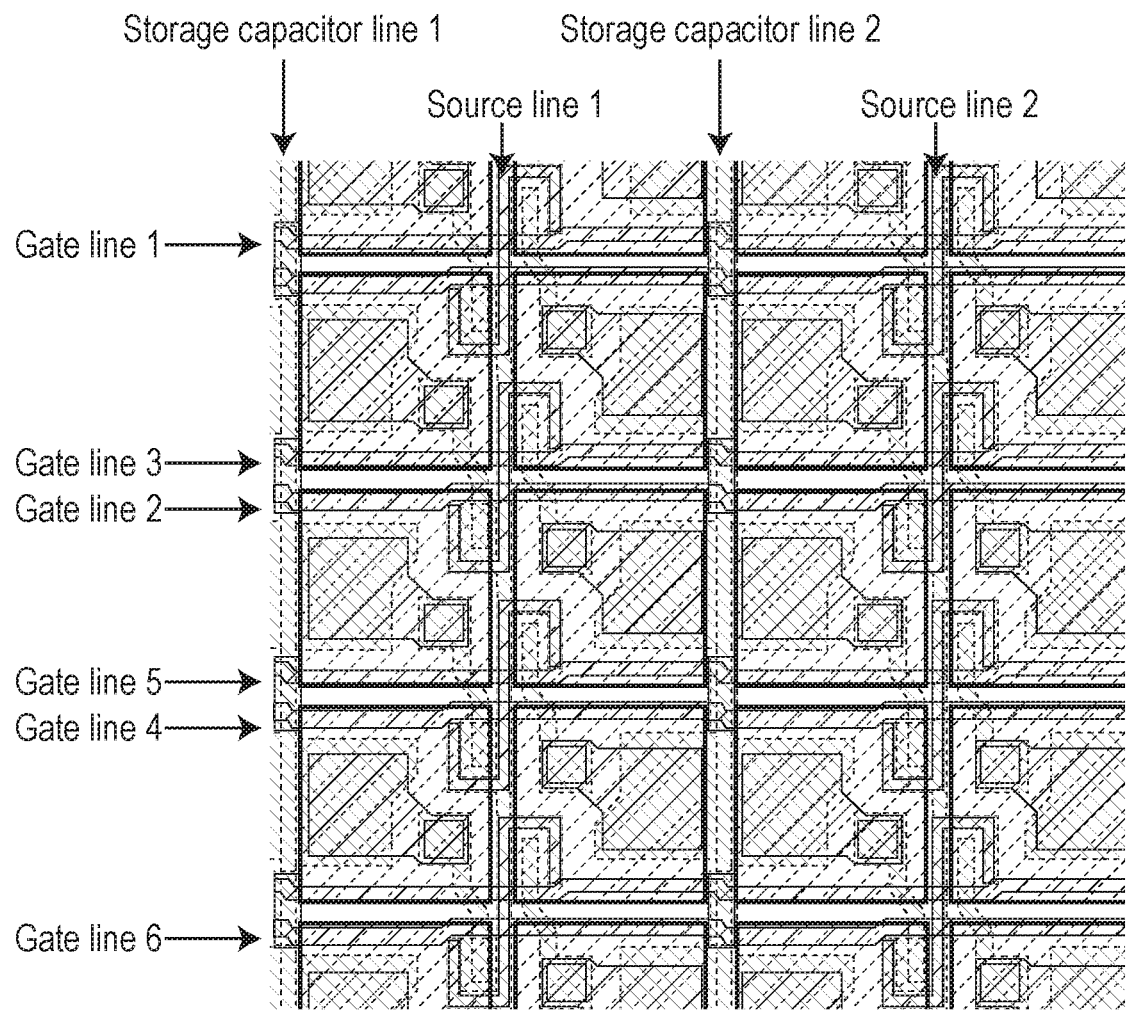
FIG. 18A illustrates an example layer diagram for a portion of a pixel array that may be used for the pixel array of FIG. 16 having TFTs spatially offset from their associated pixel electrodes.
Figure 18B:
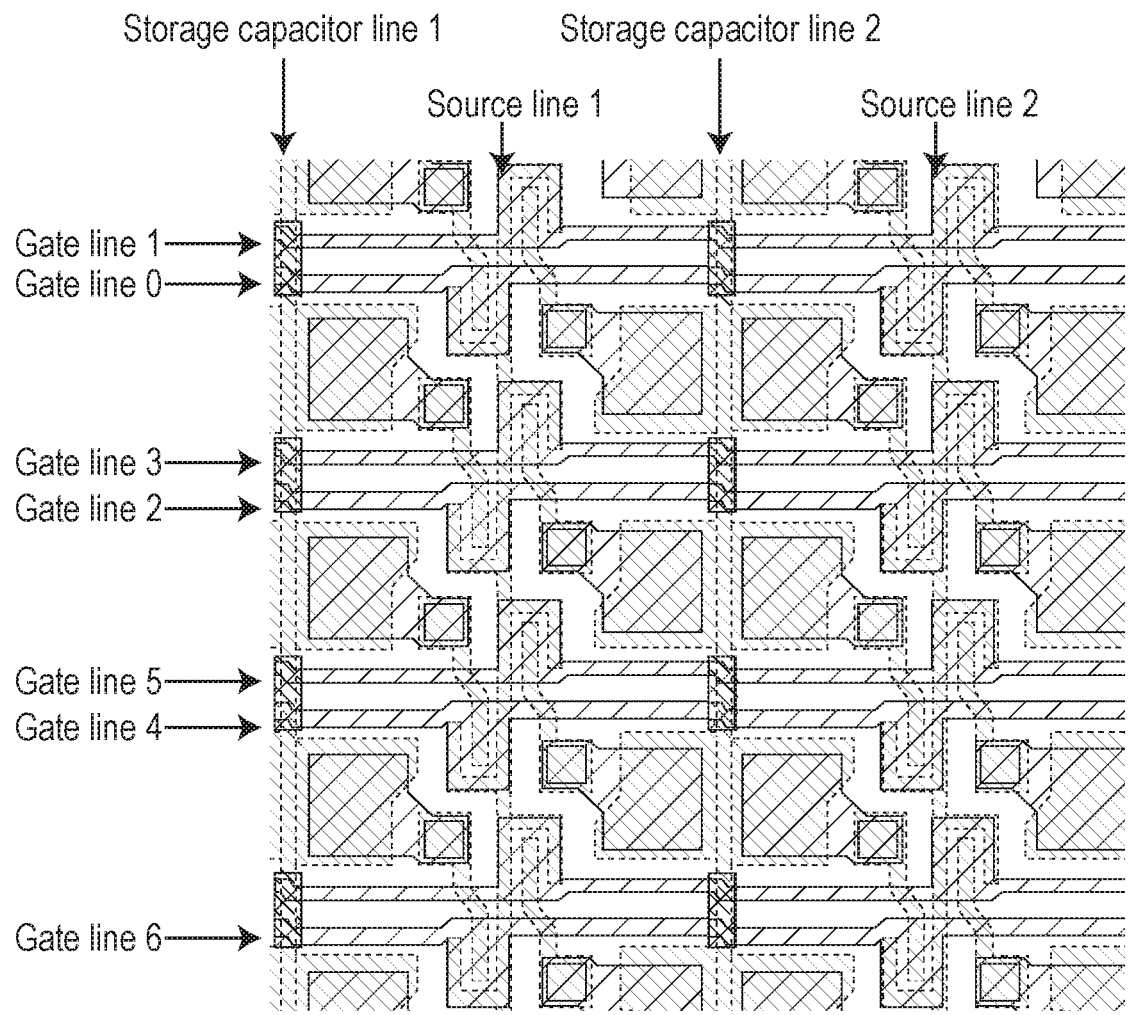
FIG. 18B illustrates the layer diagram of FIG. 18A, with the top metal layer removed.
Figure 18C:
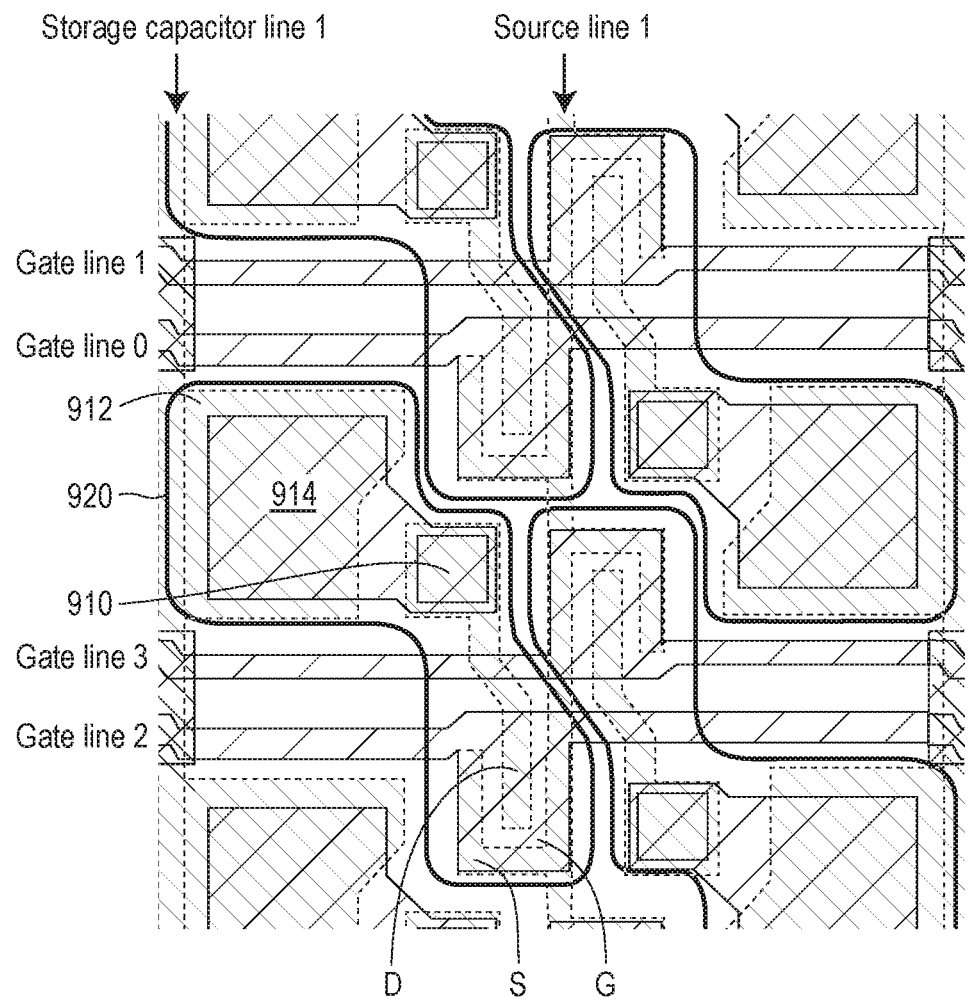
FIG. 18C illustrates an annotated blowup of a portion of the layer diagram of FIG. 18B to illustrate the manner in which the TFT of a pixel is offset from the pixel electrode for that pixel.

FIGS. 18A-18C are top views of the layer stacks used to form an array of pixels according the configuration of FIG. 16, but in which the TFT of a pixel element is offset from the pixel electrode that it controls. In particular, FIG. 18 depicts a top view of a portion of a layer stack (about 4×3 pixels) of a display design implementing the design of FIG. 16 showing the various metal layers. However, in the design of FIG. 18, the position of the TFT is shifted away from the pixel electrode that the TFT is controlling, so that the pixel electrode is not influenced by capacitive coupling of voltage pulses on its own TFT. This configuration generally improves the optical performance and reduces the voltage swing required to drive the display. The penalty for offsetting the TFT from its associated pixel electrode is that the drain of the TFT has to cross a gate line for each pixel, which may increase the amount of pixel defects in the display.

In particular, FIG. 18A illustrates a layer diagram of a complete pixel design with three metal layers, while FIG. 18B illustrates the same design with the pixel electrode layer, i.e., the third or top metal layer M3, removed. FIG. 18C illustrates a blow-up of a portion of the diagram of FIG. 18B, annotated to illustrate the components associated with each of various pixel elements. In these drawings, the first metal layer M1 (including the source and drain electrodes, the bottom plate of the storage capacitor, the storage capacitor lines and the source lines) is shown in tighter crosshatching with a small dotted outline, the second metal layer (including the gate electrode, the top plate of the storage capacitor and the gate lines) is shown in solid outline with lighter crosshatching, and the third metal layer (including the pixel electrode) is shown in with a bold outline with dotted line crosshatching. The semiconductor is shown as blue squares in the transistor region and covers the crossings between the gate lines and the source lines (where, in this case, it acts as an insulator). Every pixel element has a via 910 extending up from the page between the metal layers M1, M2 and M3, and is shown as a darker square. Here, as will be noted, each set of two adjacent columns of pixels elements is formed as an inverted mirror image of one another around the source line connected to and disposed between the two pixel columns. Moreover, as illustrated best in FIG. 18B, the gate line numbers match the gate line numbers of FIG. 16. However, the gate lines sequenced differently along the side of the pixel array to accommodate or to implement the placement of a TFT under a pixel electrode that is not controlled by that TFT.

As a more particular example, FIG. 18C illustrates the components of FIG. 18B for a couple of pixels. In particular, the pixel element having a pixel electrode (which is not shown in FIG. 18C) disposed between gate line 0 and gate line 3 and between storage capacitor line 1 and source line 1 is marked as pixel element 920, with the components of this pixel element being circled. Here the TFT for this pixel element is disposed below the gate line 2 and just to the left of the source line 1. The source electrode S (which is formed as a U shaped element) and the drain electrode D (which is disposed in the middle of the U shaped element) are formed in the first metal layer M1 while the gate electrode (disposed over the source and drain electrodes) is formed in the second metal layer M2. As illustrated for this pixel element, the drain electrode D is electrically connected to the via 910 by crossing gate line 2 and gate line 3. The storage capacitor has a first or bottom plate 912 (formed in the first metal layer and overlapping the storage capacitor line 1) and a second or top plate 914 formed in the second metal layer and connected to the via 910. The pixel electrode, not shown in FIG. 18C, is also connected to the via 910 and overlays the area formed between the storage capacitor line 1, the source line 1 (on the left and right) and between gate line 0 and gate line 3 (on the top and bottom). Moreover, as illustrated in FIG. 18C, the TFT for the pixel 920 has the gate electrode G connected to the gate line 2 in FIG. 18C and has the source electrode S connected to the source line 1. Still further, the drain electrode D crosses the gate lines 2 and 3 to connect to the via 910 disposed beneath the pixel electrode layer within the third metal layer M3. As indicated above, the via 910 connects all three metal layers. Moreover, the storage capacitor for the pixel element 920 includes plates formed in the first metal layer M1 which is connected to the storage capacitor line 1 and in the second metal layer which is connected to the via 910 and thus to the drain D of the TFT. As will be noted, other pixel elements in the pixel array have similar layouts (with the same components being formed in the same metal layers), but are offset either rotationally or symmetrically, or both. Thus, while the pixel electrode of the pixel 920 is controlled by a TFT disposed beneath the pixel electrode in the row below the pixel 920, the pixel to the immediate right of the pixel 920 (in the same row as the pixel 920) has a pixel electrode controlled by a TFT disposed beneath the pixel electrode of a pixel in the row immediately above that pixel (instead of immediately below as is the case for the pixel 920).

Figure 19:
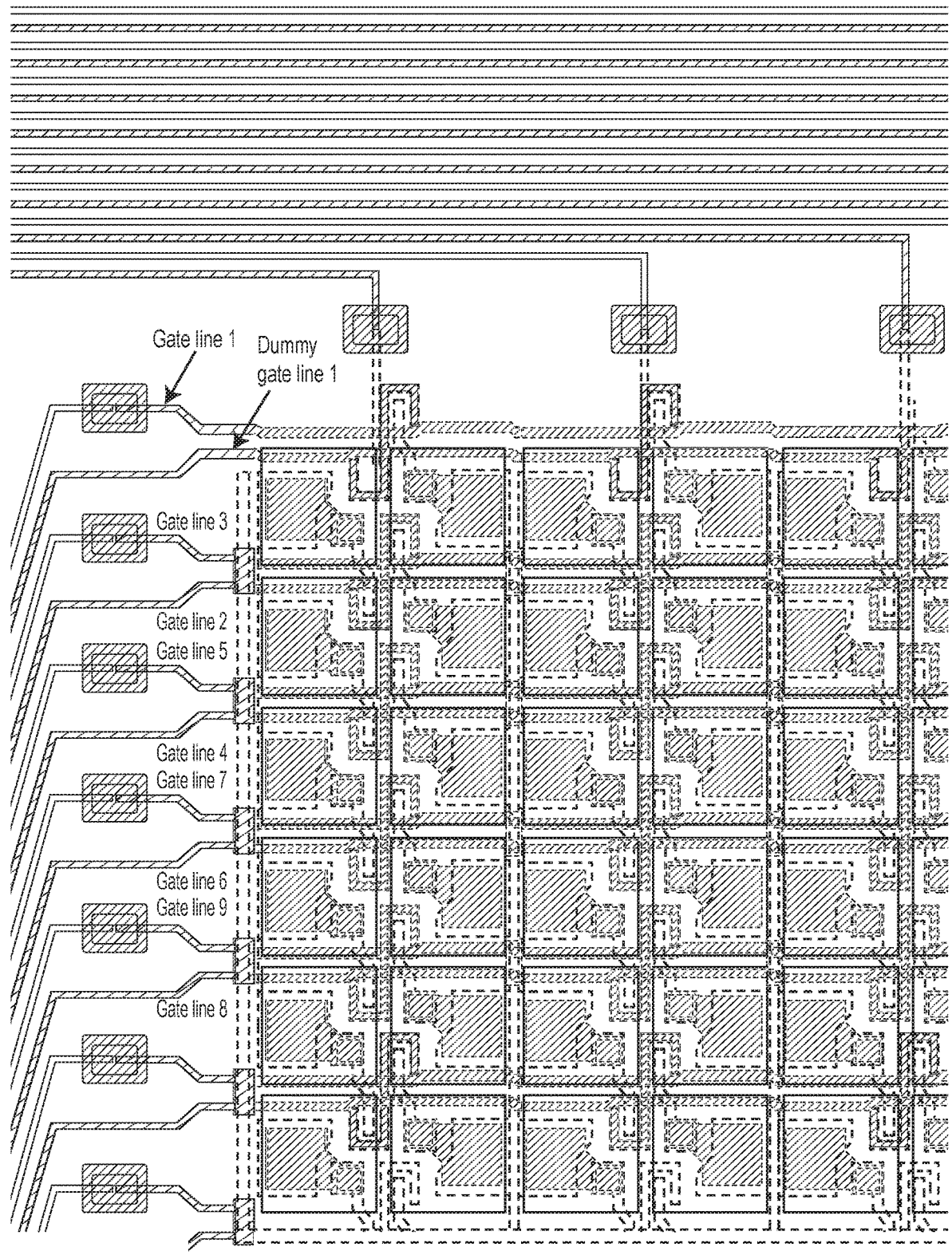
FIG. 19 illustrates an edge of a pixel array as formed in FIGS. 18A-18C including a dummy gate line and TFTs used to assure similar electrical characteristics of each of the pixel elements in the pixel array.

As an additional detail of this configuration, the layout design of FIG. 18A-18C needs to include two dummy gate lines, one at either end of the pixel array, with a single dummy gate line disposed between the last and the second to last actual gate line. One of these dummy gate lines is illustrated in FIG. 19. In particular, as illustrated in FIG. 19, the first gate line (gate line 1) in the pixel array is actually connected to TFTs that are not disposed beneath any pixel electrode, and yet control pixel electrodes in the first row of pixels. The dummy gate line marked as such in FIG. 19 is a gate line connected to TFTs that are disposed beneath pixel electrodes in the first row but do not connect to any pixel electrodes. A similar dummy gate line would be disposed at the other end of the pixel array and would be connected to TFTs that would normally control a set of pixel elements below the last row of the array (which of course do not exist). Moreover, the last gate line in the array would also be connected to TFTs that control pixel electrodes in the last row, but are not disposed beneath any pixel electrode. While the dummy gate lines do not control or turn on actual pixel electrodes, they should be included to give the pixel elements at the edges (e.g., the top and bottom edges) of the pixel array the same electrical characteristics as the other pixel elements, i.e., to ensure that the electrical properties of all pixels in the display are identical. These dummy gate lines therefore also should be driven by the gate driver IC. If the TFT for a pixel element is placed under its own pixel electrode, there is no need for the dummy gate lines and associated TFT components.

While FIGS. 16, 18 and 19 illustrate a configuration that decreases the number of source lines at the expense of increasing the number of gate lines while offsetting the TFT from its own pixel electrode, other configurations are also possible, such as placing the TFT under its own pixel electrode (a more straightforward design), having the storage capacitor lines running parallel to the gate lines, having the gate lines not disposed close together but spaced apart as far as possible (which can remove the crossings between the drain and the other gate line), having a design (especially for LCD) without a field shield (M3) electrode (in which case the top electrode of the storage capacitor (M2) is also the pixel capacitor), etc.

Figure 20:
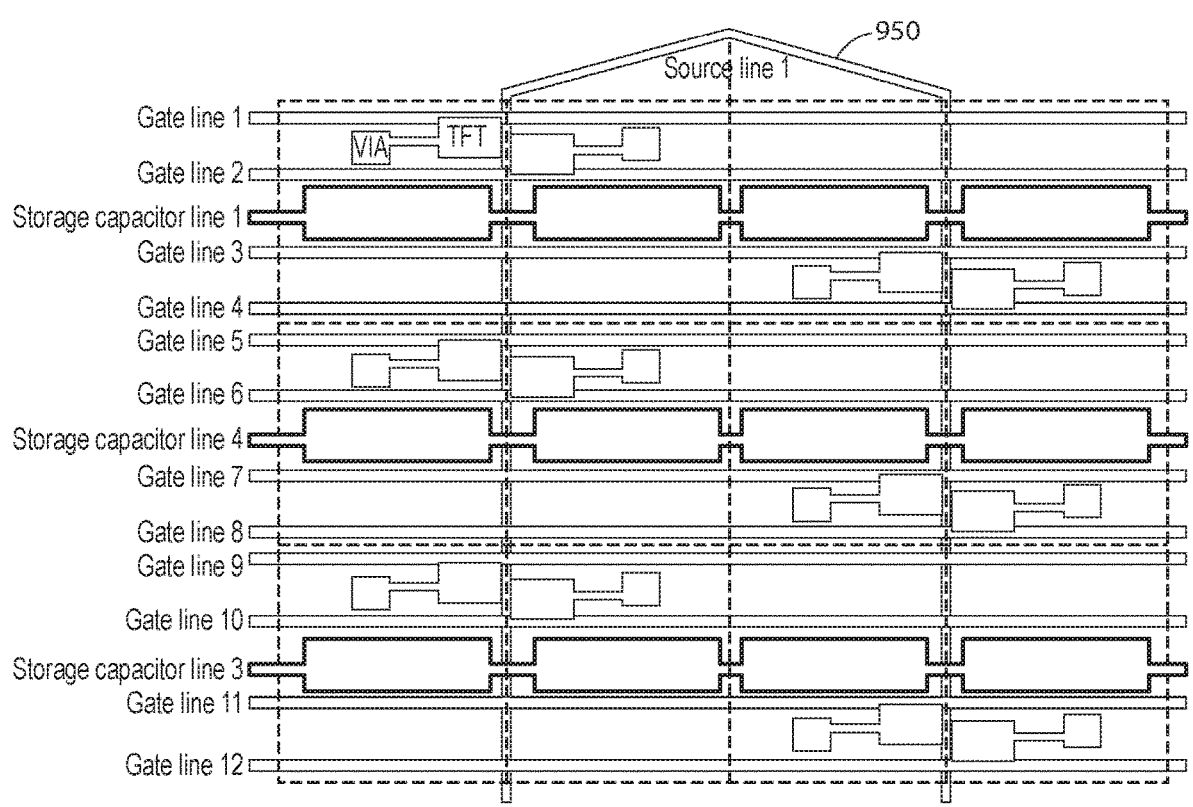
FIG. 20 illustrates a further example of a pixel array having a further reduced number of source lines and an increased number of gate lines per row.

Also it is possible to further optimize these designs to create other types of reductions, such as a four times reduction in the number of source electrodes or lines, and a four times increase in the number of gate electrodes or lines. Such a configuration is illustrated in FIG. 20. Here source lines run between and are connected to the source electrodes of the TFTs of pixels in adjacent columns and each set of two neighboring (for example) source lines are connected together, as shown by the connection line 950 in FIG. 20 to form a single source line connected to the pixel elements in each of a set of four columns of pixels. As shown in FIG. 20, each row of pixel elements includes four gate lines (with each of the four gate lines connected to a different one of the four pixels in the row connected to the same source line 950.) In the example of FIG. 20, the outlines of the TFT and the via 910 are illustrated within the various pixel elements to show relative positioning. However, the details of the layer diagrams for this embodiment are not shown for clarity purposes. Still further, in this case, the storage capacitor lines and associated storage capacitor electrodes are disposed along each row, i.e., in the same direction as the gate lines.

As will be understood, the schematic layout of the design of FIG. 20 has a four times reduction in the number of source electrodes or connecting lines and a four times increase in the number of gate electrodes or lines. As illustrated in FIG. 20, this four times reduction in source lines is accomplished by using a two times reduction on source lines as described above for FIG. 16 for example, in combination with connecting two adjacent source lines just outside of the pixel matrix to create a single source line from these two lines. However, for this configuration, four gate lines are running through each pixel, while one storage capacitor line per pixel is used. In this case the storage capacitor line runs parallel to the gate lines. For clarity, only the first two metal layers are shown in FIG. 20 (source M1, and gate and storage M2), while the pixel electrode at metal layers M2 and M3 is left out.

Figure 21A:
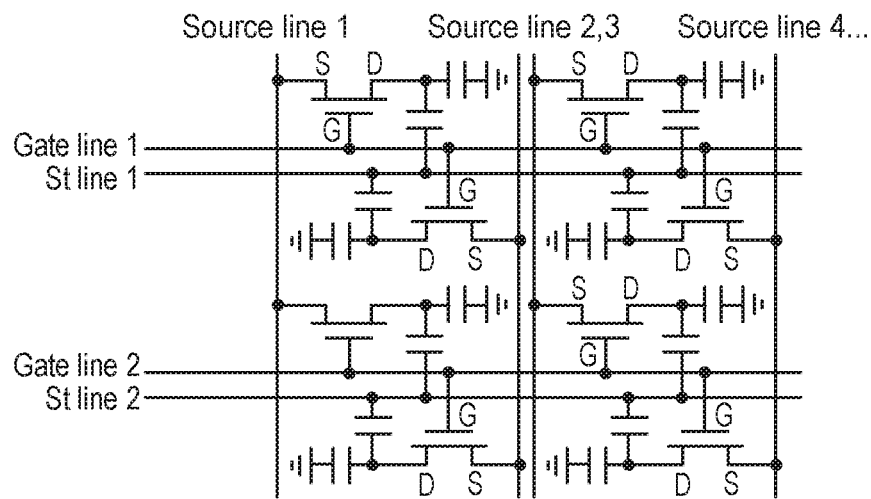
FIGS. 21A and 21B illustrate an electrical schematic diagram and a layout diagram, respectively, of a pixel array having a reduced number of gate lines and an increased number of source lines used to drive pixel elements within a pixel array to reduce the edge profile in the direction of the pixel rows.
Figure 21B:
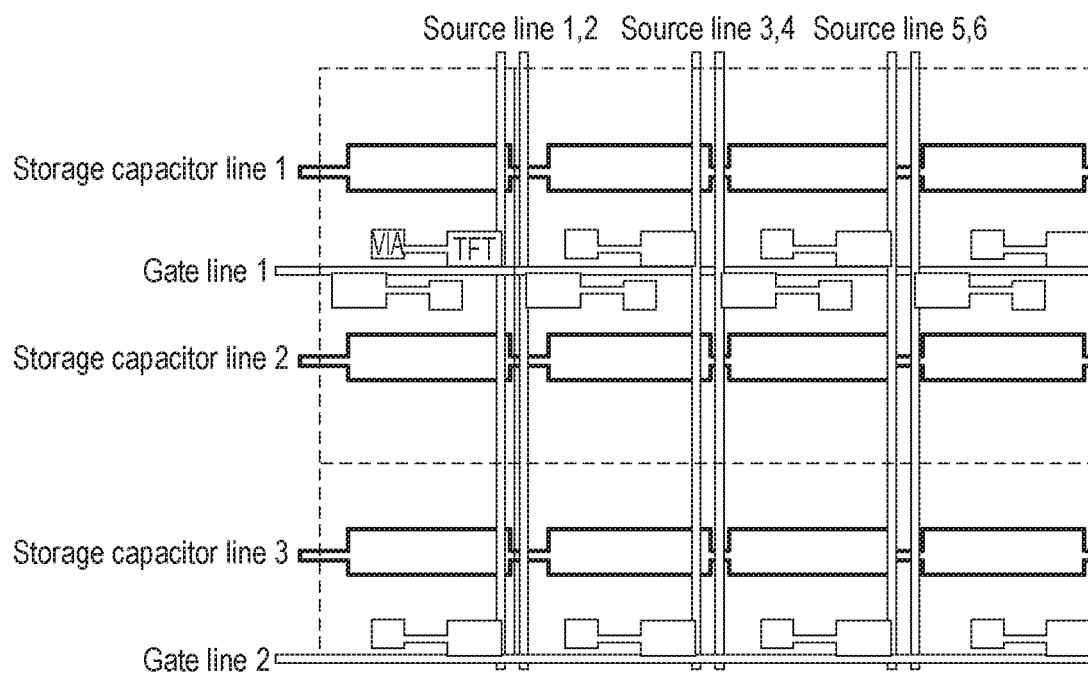

Still further, it is possible to reduce the number of gate lines while increasing the number of source lines. This configuration is illustrated schematically in FIG. 21A and as a layout diagram in FIG. 21B. As will be understood, the same basic concepts that were used to decrease the source lines of FIGS. 16 and 17 (with the attendant increase in gate lines) could be used to alternatively decrease the number of gate lines while increasing the number of source lines. In particular, the electrical schematic of FIG. 21A shows a doubling of the number of source lines with a halving of the number of gate lines. In the layout diagram, the of FIG. 21B, a storage capacitor line has been separately provided for every row of pixels. However, this feature does not add to the footprint, as the storage capacitor lines are all connected together just outside the matrix. Of course, the other configurations or techniques described and illustrated herein with respect to increasing the number of gate lines to decrease the number of storage lines by a factor of 2, 4, 8, etc., could just as well be applied to decrease the number of gate lines by increasing the number of storage lines by a factor of 2, 4, 8, etc. Additionally, in all of these embodiments, a driver must address the pixel array using the multiple source and/gate lines for each row/column pair of pixel elements.

Additionally, although the techniques described herein for minimizing edges of a flexible display that are visible to the user are discussed with respect to dynamically flexible displays, any number of these edge minimization techniques may easily be applied to statically flexible displays, e.g., displays that are flexed in a static configuration, and/or displays that are rigid. Moreover, one or more techniques for minimizing edges of a flexible display may be used in combination. For example, shared connecting lines may be utilized in conjunction with bending edges under the display, and/or dividing the disposition of longitudinal and/or transverse connecting lines amongst different borders may be utilized in conjunction with shared connecting lines.

Examples of Display Images and Functionality of Article

FIGS. 22A-22E illustrate various different types of displays or images which may be provided on an optimized display area of a display at various different times or even at the same time. In an embodiment, the displays or images shown in FIGS. 22A-22E may be presented on the flexible display 18 of the device 10, or on another display having an optimized display area. Referring to the display 18 of the device 10 for illustrative but non-limiting purposes, in one scenario illustrated in FIG. 22A, the display 18 may depict a pattern, an artistic rendition or other image that is particularly expressive of the wearer or user, including for example, an image provided by the user, a picture or a photo, an image of a hand-drawn sketch, a team, corporate or other organizational logo, a message of some sort, or some other image that expresses some interest or personality trait of the user. Such an image might be displayed whenever the device 10 is in a sleep mode, that is, when the device 10 is not being actively used in other modes. Moreover, such an image could be resident on the display 18 for long periods of time whenever the display 18 is not in use, if the flexible display 18 is a bi-stable display, such as an e-ink display, which requires no power to hold the image in place once image is been formed.

As illustrated in FIG. 22B, in another mode referred to herein as an office mode or a calendar mode, the device 10 displays a calendar screen and an e-mail screen or other images associated with or set up to provide office or business related functionality. Such a mode may provide images that enable the user to easily view e-mails, calendars and to use other business related applications. Thus, for example, the display as shown in FIG. 22B may provide a calendar of events, and may also display one or more e-mail icons, text messaging icons, etc., indicating e-mails or text messages that may be available and viewable to the user.

FIG. 22C illustrates the device 10 in an alarm/clock mode in which the flexible display 18 provides an alarm or clock display that may be generated by an alarm or clock application. An alarm may ring by sounding a speaker (e.g., one of the electronic devices 53 of FIG. 8) at a particular time according to a preset alarm notification and/or the device 10 might use a gyroscope or accelerometer to vibrate the device 10 to cause a vibration indicating an alarm. Still further, as illustrated FIG. 22D, the device 10 may be placed in an exercise or training mode in which the flexible display 18 displays a stopwatch, a distance traveled or other indications of various athletic parameters that have been met or associated with an exercise routine including, for example, use of the step counter to determine the number of steps that have been taken, to determine the number of lifts that have been performed when, for example, lifting weights, etc. Likewise, in such a mode, the display 18 may display a distance traveled by a runner or walker, the time since the beginning of a run or other exercise, etc. Still further, as illustrated in FIG. 22D, a portion of the display 18 may be used to indicate the current song that is playing via a music application implemented on the article 10.

In a still further mode, illustrated in FIG. 22E, the wristband device might be a slave display to another computer device, such as a navigation device within a car, a phone, a laptop computer, an e-reader. In this case, the display 18 may display, for example, a map, a route, directions, etc. on a map as provided by a navigation device to the device 10 via, for example, a Bluetooth communication module or other communication module that provides communication between the device 10 and the navigation device (not shown). Such a slave display might enable the device 10 to be more visible to the user in a driving situation. Of course, other types of visuals and displays can be provided with other types of applications stored on the device 10 or in other communicatively coupled computer devices, such as phones or computers that communicate with the device 10 to provide images or information for display to the user.

As part of one of these or other uses, the device 10 may be separately connectable to magnetic strips or other exteriorly located magnetic or metallic devices to which the magnets 20 and 22 within the end pieces 14 are magnetically attracted. In this case, the strips may have communication modules therein or associated therewith that communicate with and enable the device 10 to determine the location of the device 10 and to thus control the default functionality of the device 10. That is, the device 10 may be placed around someone's wrist and used in various different modes to provide information to the user as it is wrapped around the wrist. However, the device 10 might also be taken off the wrist and applied to other surfaces, such as on tables, desks, car dashboards, refrigerators, nightstands, or any other surface. In this case, the device 10 may automatically operate to detect its current location and provide various default or automatic functionality based on the determined location. As an example, FIG. 23 illustrates a device 10 having magnets disposed in the clasps 14, which are magnetically coupled to magnetic strips 100 which are separately disposed on a different surface or surfaces to cause the device 10 to have the flexible display 18 laid out horizontally or straight along the surface. In a similar manner, FIG. 24 illustrates the device 10 disposed in a curved manner between two magnetic strips 100 to create a curved display for viewing by a user.

Here, in addition to include a metal, magnet or other magnetic material, one or more of the magnetic strips 100 may include a location detection mechanism 101 therein, such as an RFID tag, a Bluetooth or near field communication module, or any other kind of passive or active communication technology that communicates with the communication module 46 within the device 10, to indicate the location or a unique identifier of the strip 100 and thus the current location of the device 10 when the device 10 is disposed near or adjacent the strips 100. In this case, each or at least one of the strips 100 may include a unique RFID tag, Bluetooth communication identifier or other identifier that identifies itself and/or its precise location. An application executed within the device 10, such as one of the applications 60 of FIG. 8, may operate to obtain, via the communication module 46 (which may be an RFID communication module, a Bluetooth communication module, an NFC module, etc.), the tag number or the identity of the strip 100 and may locate that tag number within its memory as being associated with a particular functionality. The application 60 may then configure the device 10 to operate in a default manner based on the detected strip identity or location, such as by running one or more other applications 60. Of course, the strips 100 need not be magnetic in nature but could instead be any type of device having an RFID tag, a Bluetooth module (such as Bluetooth tiles) or other communication module therein that is detectable by the device 10 whenever the device 10 is in a certain range of or near the strip 100. That is, the device 10 need not be magnetically connected to the strip 100 to perform the location detection described herein.

Once the RFID tag or other identifier of the strip 100 is determined via communication with the module 101, the device 10 and, in particular, the microprocessor 42 thereof, may execute a particular application indicating or providing certain functionality associated with the location or positioning of the device 10 at that strip 100. Thus, the strips 100 may be placed on a refrigerator, and when so used, may disclose particular information necessary or generally associated with kitchen usage, such as a shopping list, a calorie count of particular foods that the user might be eating, a clock or other type of alarm mechanism for timing the cooking or refrigeration of certain food items, etc. On the other hand, the device 10 may be removed from a strip 100 on the refrigerator, and placed next to a different strip, such as that located in bedroom, and there default to operate as alarm clock. In a still further usage, the device 10 may be removed and taken to an office and, when set on or near strips associated with or pre-identified with the office, automatically display e-mail accounts or calendar information that is typically more useful and associated with an office environment. Still further, the device 10 might be then taken off and put on a car dashboard having strips thereon which identifies the wristband device as being located on the car dashboard. In this case, the device 10 might provide information more useful within a car, such as executing an application that interfaces with a navigation device and acts as a slave display to the navigation device, to thereby display information provided by the navigation device to a user in a more easily accessible manner up on the dashboard. The device 10 may also or instead operate as a compass and show cardinal directions, as a clock, etc.

Figure 25:
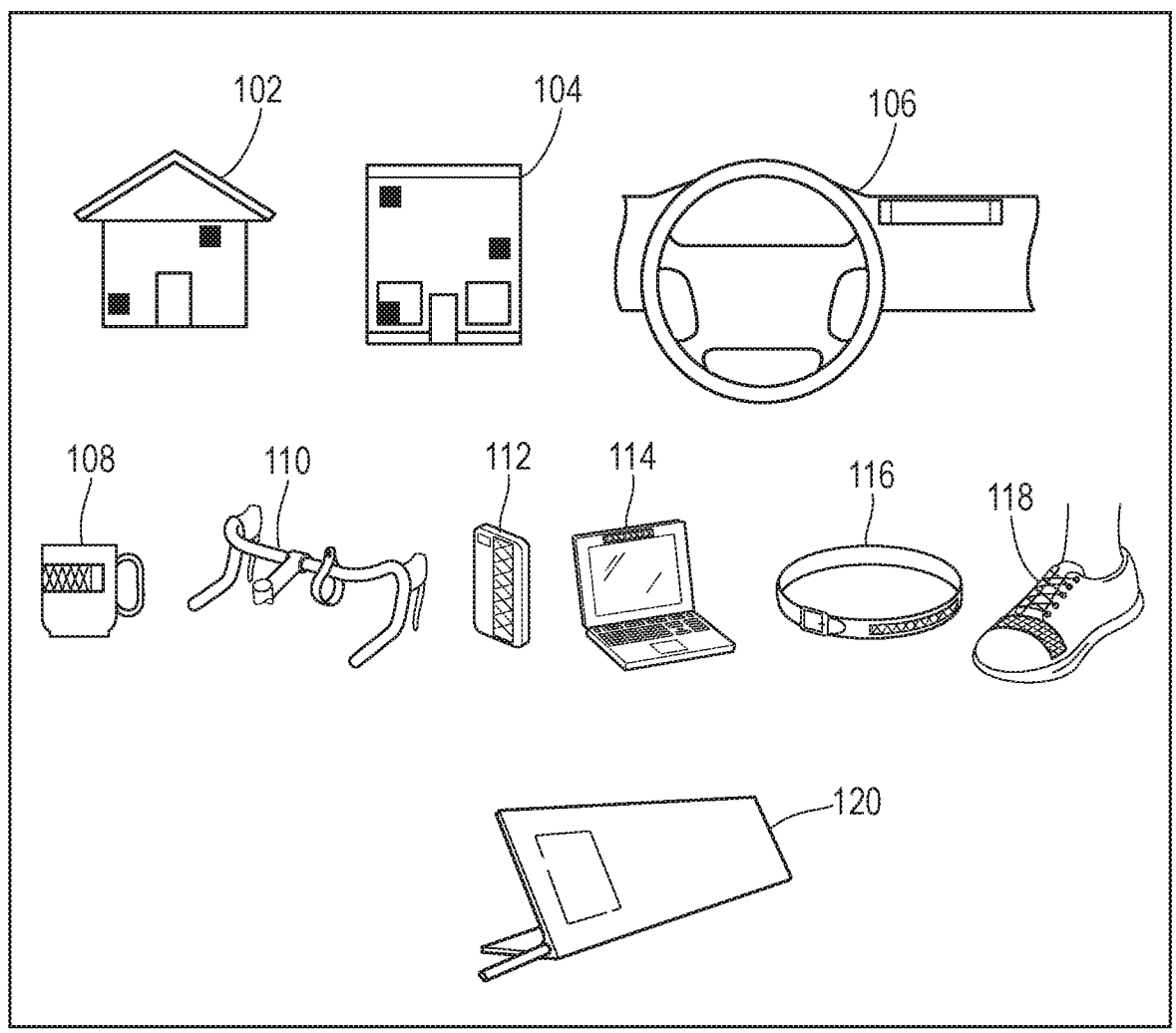
FIG. 25 illustrates the use of the band device detection system of FIGS. 24 and 25 in various different places or attached to various different articles to change the default functionality of the band device.

FIG. 25 illustrates, for example, various different environments in which the device 10 may be placed and associated with different strips 100 as described above, including a home environment 102, an office environment 104, and an automobile 106 to provide different automatic or default functionality of the device 10. Additionally, as illustrated in FIG. 25, the article or device 10 can be attached to any other devices such as a coffee cup or mug 108 or other drinking vessel, a bicycle handlebar 110, a phone case 112, a computer 114, a belt 116, a shoe 118, a docking or charging stand 120, or any other device on which or near which a strip 100 having a communication module is located. Of course, the default functionality may be provided by placement of the device 10 close to the strips and the identification of those strips. However, the user could still change the functionality of the device 10 to other functionality associated with other applications or displays that might be necessary or desirable at the time, instead of the default functionality associated with the detected location. Moreover, different default functionality might be associated with different locations within each environment. Thus, for example, FIG. 25 illustrates two different locations within the home environment 102 and three different locations within the office environment 104, with each location having a different detectable strip 100 and thus a potential different default functionality.

Of course, it will be understood, that the use of the strips 100 and the identifiers associated with the strips 100, which might communicate via, for example, RFID, NFC, Bluetooth or any other desired communication hardware and protocols, enables the device 10 to have automatic default functionality based on its location. The sensors 52 and other electronic devices 53 within the device 10 may also be used to provide default functionality. For example, the gyroscopes or accelerometers may be used to detect the orientation of the device 10, e.g., whether the device 10 is located more horizontally or vertically, and this orientation may be used to control the manner or direction in which information is displayed on the flexible display 18. The sensors 52 and devices 53 may also detect whether the device 10 is undergoing movement or acceleration, which might cause the device 10 to have different functionality or to change a display in some manner.

Figure 26:
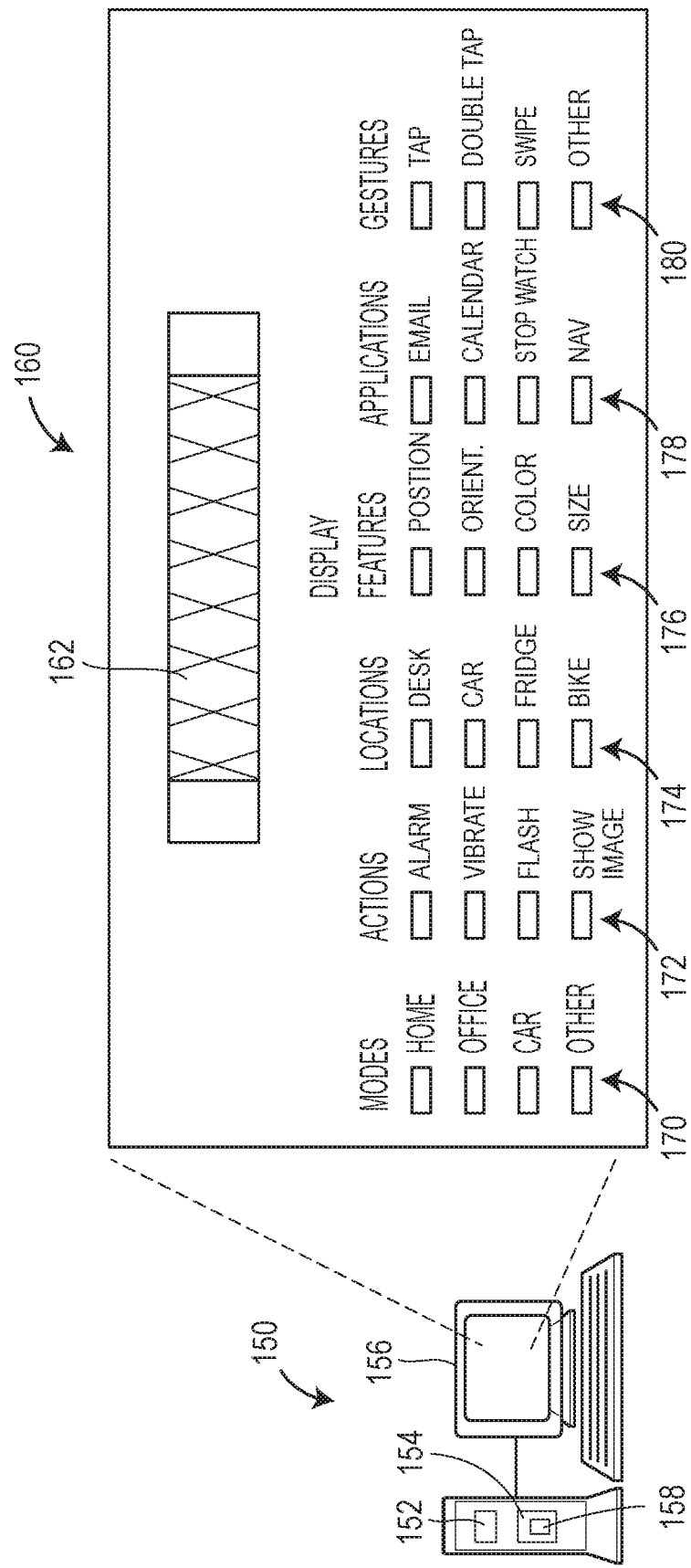
FIG. 26 illustrates an example computer system with a configuration screen that may be used to implement or specify the configuration of a band device having a flexible display.

The user may be able to program or configure the device 10 to operate in any desired manner, including any desired default manner, based on the detected location, position, orientation, or movement of the device 10. In this case, a configuration application may be executed in a processor of a computer device to develop or configure the operation of the device 10, including the various operational modes of the device 10, the various default settings based on the mode of the device 10, the motions or actions or locations that may trigger particular modes of the device 10, inputs or gestures associated with each mode or application of the device 10 and what those inputs or gestures may mean in the context of the device 10, etc. As an example, FIG. 26 illustrates a computer 150 having a processor 152, a memory 154 and a display 156. The memory 154 stores a configuration application 158 that may execute on the processor 152 to enable a user to configure the operation of the device 10. In particular, the configuration application 158, when executed, may produce a configuration screen such as the configuration screen 160 illustrated in FIG. 26. The configuration screen 160 may display an image of the wristband device 162 to illustrate what will be displayed on the display 18 of the device 10 at various times, and the manner in which this information will be displayed, such as the orientation, position on the display 18, etc.

In addition, as illustrated in FIG. 26, the configuration screen 160 may present a number of boxes or drop down menus, etc. which can be used to define various modes or other operational settings of the device 10 and the default operation of the device 10 during each such mode. For example, a user may select one of a set of mode boxes 170 to define the configuration of a particular mode of the device 10. The user may select a sleep mode box, an office mode box, an exercise mode box, a home mode box, a car mode, or may select an "other" box to define a new mode for which the device 10 is to be configured. Upon selecting the appropriate mode box 170, the user may be presented with information or options about the default and other operations of the device 10 during the selected mode. For example, the user may be able to define the actions 172, locations 174, e.g., as defined by the exterior strips 100 (e.g., of FIGS. 23-24) that might be used to enter a particular mode. Thereafter, another set of menus or drop down boxes or windows may be used to enable a user to define the placement, content, orientation, etc. or other display features 176 of information to be displayed on the flexible display 18. Still further, the user may select one or more applications 178 to execute during a particular mode, the placement, size and area of the screen associated with the application display, the orientation of the display on the screen, the background features, borders features or other screen indicia, etc. Likewise, the user may define one or more RFID tag ids or other ids to define exterior locations that are to be associated with or that cause the device 10 to enter or operate in a particular mode. In this manner, the configuration application 158 enables the device 10 to have default functionality based on the functions to be provided, based on the location of the device 10, based on its orientation or position around the wrist or not being connected around the wrist, based on movement of the device 10, etc.

In another case, the configuration screen 160 may enable the user to define one or more gestures 180 associated with a particular mode or a particular application on the device 10. Thus, for example, the user might define a gesture that, when detected on the touch screen interface 26 of the device 10, such as a swipe gesture, a pinch gesture, a double tap gesture, etc. causes the device 10 to operate in a certain manner, such as to switch between modes, to change orientation of the image on the display 18, to cause portions of the displayed information to move to or to appear or disappear, or to cause a particular action within an application, such as to pull up new information, etc. Additionally or alternatively, the user might define one or more gestures that are detectable by one or more of the sensors 52, such as a rapid shaking, or such as a magnitude, duration, and/or a number of squeezing forces applied to the outer faces of the device 10 when the device 10 is in a looped configuration. Thus, using the configuration application screen 160, the user may define various different gestures or may preprogram various gestures to define desired device functionality, such as switching between modes, turning on and off the device or applications, switching applications, moving images or content of particular applications on the display 18, taking actions within an application, etc. As a further example, one gesture may be defined by the user to unlock the device 10 or allow operation of the device 10 such as implementing a locking or security feature. In this case, is not necessary that the device 10 display numbers or have the user pick a set of numbers but instead, gestures might enable the user to define an action that will unlock device, such as a swipe in one direction, two taps and a swipe in a particular direction, etc. Of course, the same gesture could be used for different types of operations in different modes of the device 10 or with different applications implemented by the device 10, and any combination of gestures might be used with any combination of applications or modes to enable different functionality or to enable the functionality of the device 10 be programmed in various manners. Once configured as such, the configuration data as selected by the user via the configuration application 158 on the computer 150 can be downloaded to the device 10, either wirelessly or via a wired connection, and stored in the memory 44 thereof and then be used by the operating system of the device 10 to operate.

Thus, the various different electronic devices or components disposed in or shown in the electronic suite 38 of FIG. 8 may be used in conjunction with one another in various different manners to provide a whole host of functionality for the dynamically flexible article or device 10, which might be beneficial in various different uses of that article. However, only some of these uses are described in detail herein, and other uses may be possible.

Examples of Connection Mechanisms for Dynamically Flexible Articles or Devices

Figure 27A:
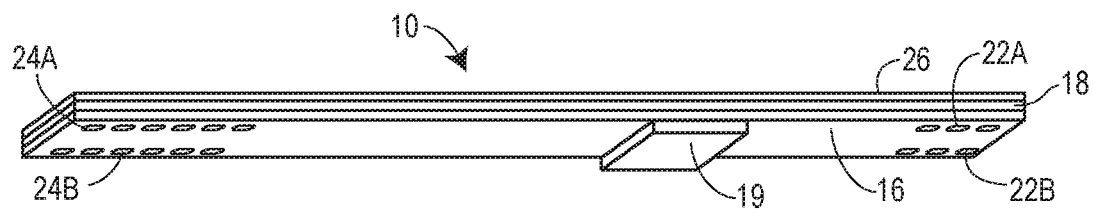
FIGS. 27A-27C illustrate various sensors disposed on a band device similar to that of FIGS. 7A and 7B.
Figure 27B:
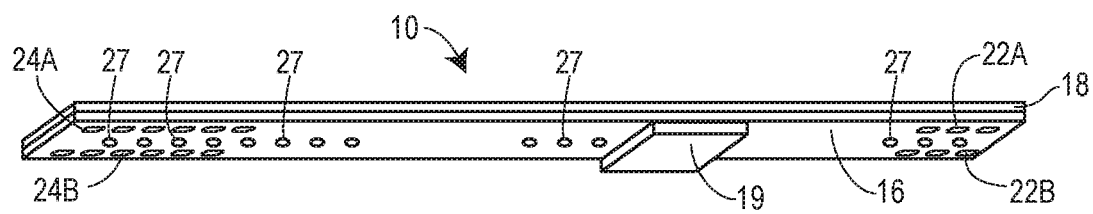
Figure 27C:
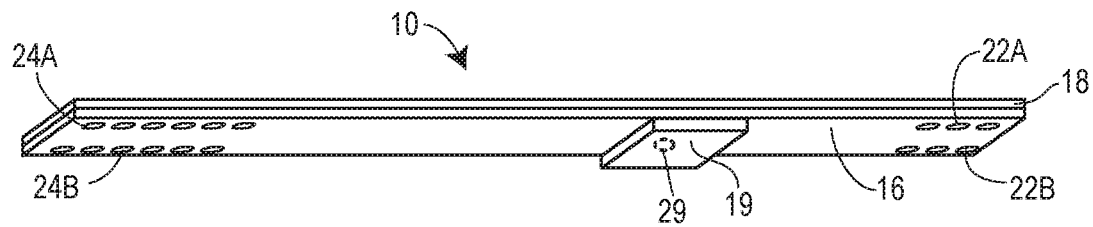

With reference again to FIGS. 7A and 7B, FIGS. 27A-27C illustrate articles similar to that of FIGS. 7A and 7B but including various different types of sensors that may be used for various purposes, including in detecting the orientation of the band, such as whether the band is wrapped around a user's wrist or other element. In particular, FIGS. 27A-27C illustrate various examples of an article in the form of a device 10 that includes an adjustable clamp or connection mechanism for enabling the ends of the band of the device 10 to overlap one another by different distances when worn so as to enable the device 10 to be used on wrists of different sizes. In addition, however, each of the various devices in FIGS. 27A-27C include mechanisms for determining or enabling the electronics module 19 of the device 10 to determine the orientation of the band with respect to the user's wrist when being worn to enable better operation of the display features of the device 10. While a magnetic connection or clamping structure is illustrated in each of the devices 10 in FIGS. 27A-27C, other types of adjustable clamping or connection structure could be used instead and allow the electronics module 19 to be able to determine the orientation or positioning of the band or the display 18 when on the arm or wrist of a user.

More particularly, FIG. 27A illustrates an example article in the form of a device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band 16 from one end of the band 16 and two-thirds of the length of the band 16 from the other end of the band 16. In addition, the device 10 of FIG. 27A includes a flexible touch screen interface 26 disposed over the flexible electronic display 18.

FIG. 27B illustrates another example article in the form of a device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band support 16 from one end of the band 16 and two-thirds of the length of the band 16 from the other end of the band support 16. However, in this case, one or more pressure sensors 27 are disposed in or on the band support 16 and are electronically connected to the electronics module 19 to provide signals to the module 19 indicative of pressure, strain, or force applied to those locations of the band 16. While the pressure sensors 27 are indicated to be disposed at various points along the length on the band support 16 on both sides of the band support 16 near the ends of the support 16, these sensors may be disposed along the entire band support 16, only on one side of the support 16, or on any suitable portion of the support 16 for the purpose of detecting pressure or force applied to the band support 16 or display screen 18. Still further, the pressure sensors 27 may be any desired or suitable pressure sensors including piezoelectric sensors, strain gauges, etc. Additionally, any desired number of sensors 27 may be used and these sensors 27 may be spaced apart from one another any suitable distance along the length of the band support 16. Likewise, the sensors 27 may be disposed in the center of the band support 16 (from side to side) or offset from the center. Also, more than one sensor 27 may be located at any longitudinal location along the band support 16. Alternatively, the sensors 27 of FIG. 27B could be magnetic sensors which sense magnetic field strength, for example. In this case, the magnetic sensors 27 may detect whether one or more magnets on one end of the band (used a part of the coupling mechanism) are near to or are interacting with magnets or magnetic material on the other end of the band. Here, the magnetic sensors 27 may be used to detect the amount of overlap of the ends of the band.

FIG. 27C illustrates another example article in the form of a device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band support 16 from one end of the band 16 and two-thirds of the length of the band 16 from the other end of the band support 16. However, in this case, a gyroscopic detection element 29 is dispose in the electronics module 19 and operates to detect the orientation of the band (or at least the electronics module 19 or other location at which the gyroscopic element 29 is disposed). The gyroscopic element 29 operates to detect the orientation of the band with respect to gravity or other acceleration force to which the element 29 is subjected. While a single gyroscopic element 29 is illustrated as being disposed in the electronics module 19 of FIG. 27C, this or similar elements could be disposed at other locations along the band (e.g., within the support 16 of the band) and/or multiple gyroscopic elements 29 could be disposed at various locations along the support 16.

Generally speaking, the embodiments of FIGS. 27A-27C include structure or elements, such as a touch screen interface 26, pressure or magnetic sensors 27 or gyroscopic elements 29 that can be used to assist the electronics module 19 in determining the orientation or positioning of the display support 16 or the display 18 with respect to one or more fixed locations on a user's wrist when the device 10 is wrapped around the user's wrist. This operation enables the module 19 to then calibrate the display 18 to place or center display information such as display screens at particular locations with respect to the user's wrist, such as being centered on the top of the wrist, on the bottom of the wrist, on the inner side of the wrist, on the outer side of the wrist, etc. Likewise, these elements or sensors may be used to detect user inputs and band orientation or location.

Moreover, while FIGS. 1-6, 7A-7B, 27A-27C illustrate magnetic based connection structures, other connection structures, such as one or more mechanical connectors (e.g., buckles, snap components, etc.), any desired hook and loop connection material, like Velcro, or some other connection means, etc. could be used instead of or in addition to any of the above-described magnetically coupled connection structures. In the embodiments in which the article 10 includes a connection structure that utilizes one or more mechanical connectors in combination with one any of the above-described magnetically coupled connection structures, the connection structure can provide both a magnetic connection and a mechanical connection, and, thus, the connection structure provides a stronger and more durable connection between the end pieces 14 of the article 10 or between the various portions of the band or support 16. In these cases, the magnetic connectors can, but need not, be disposed near or proximate to the mechanical connectors.

Figure 28:
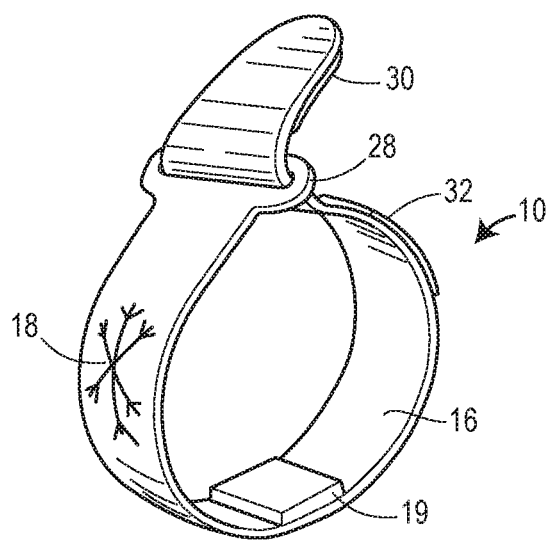
FIG. 28 illustrates an example article in the form of a band having an electronics module disposed in the center of the article with a non-magnetic connection structure used at the ends of the flexible support to secure the article in a loop.

As an example, FIG. 28 illustrates an example dynamically flexible article 10 in the form of a band having an electronics module 19 disposed in the center of the band 12 with a non-magnetic clasp arrangement used at the ends of the flexible support 16 to secure the article 10 to a wrist of a user or other mounting member, such as a bike handle. In this case, a loop or buckle member 30 is attached to one end of the flexible support 16 and hook and loop pads 30 and 32 (one being hook material and the other being loop material) are attached to the end portions of the band 12. Here, one end of the band portions 12 may be looped through the buckle 28 and bent back to enable the hook and loop material pads 30 and 32 to contact each other and thus secure the band 12 to a user's wrist or other structure. Of course, while the electronics module 19 is illustrated as being located in the center of the band portion 12, the module 26 could be located on one of the ends as well, such as near the buckle 28. Moreover, use of the buckle 28 in FIG. 28 is not necessary. Instead, hook and loop pads may be placed at opposite ends of the band 12 to enable a connection between the two ends of the band 12.

Figure 29A:
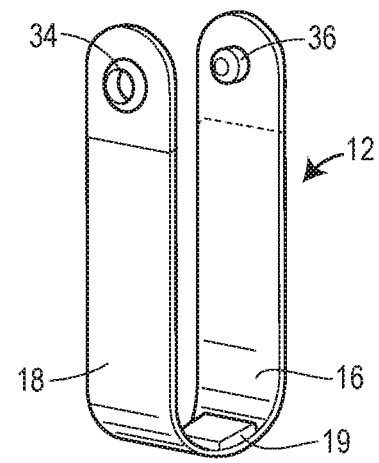
FIGS. 29A-29C illustrate an example article in the form of a band having a flexible display and a further connection structure in the form of a snap-on connector.
Figure 29B:
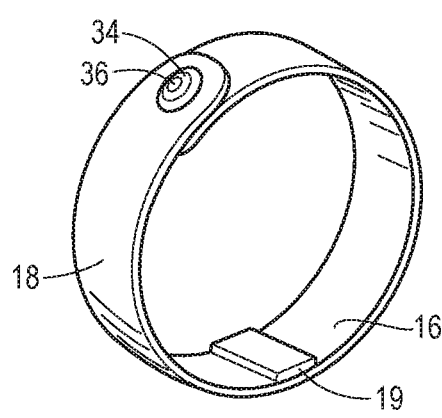
Figure 29C:
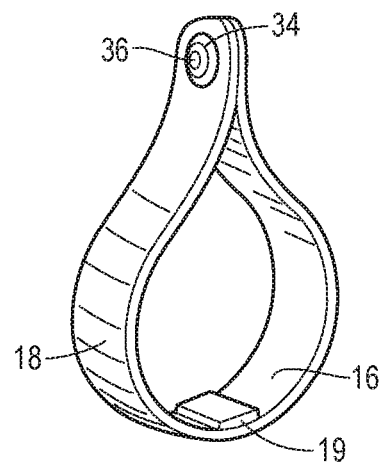

FIGS. 29A-29C illustrate a dynamically flexible article or device 10 having yet another type of mechanical connection structure in the form of a button based or snap-type connection structure. As illustrated in FIG. 29A, the device 10 includes a band 12 having a flexible display 18 disposed on a flexible support 16. In this case a hole member 34 forming one side of a snap-fit connector and a snap member 36 forming the other side of a snap fit connector are disposed on opposite ends of the band portion 12. The snap member 36 snaps or slides into the hole member 34, which may have flexible material such as rubber disposed around a center hole to better interact with the snap member 36 and retain the snap member 36 therein. As illustrated in FIGS. 29B and 29C, the band 12 may be bent to enable the snap member 36 to side into either side of the hole member 34 to thereby create a circular band as illustrated in FIG. 29B or a tear-drop shaped band as illustrated in FIG. 29C. In this case, the electronics module 19 that drives the display 18 could be located near one of the ends or in the center of the band portion 12 of FIGS. 29A-29C or at any other desired location on the band 12. As will be understood, the embodiments of FIGS. 7 and 27-29 are provided to illustrate that other connection structure, besides or in addition to a magnetic based connection structure, can be used on the ends of the band 12 to enable connection of the ends of the band 12 around a wrist or other mounting member, if so desired, as well as to illustrate that the electronics module 19 can be located in any desired position on the band 12. Of course, other connection structure could be used as well including, for example, a slide in snap-fit buckle.

Examples of Limiting the Bending of Dynamically Flexible Displays

Figure 30A:
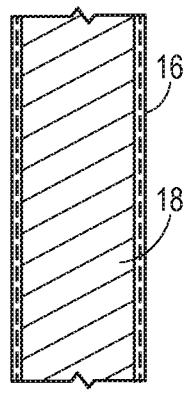
FIGS. 30A-30B illustrate a top and a cross-sectional view of a flexible band device having a structure or support that protects the edges of a flexible electronic display disposed thereon.
Figure 30B:
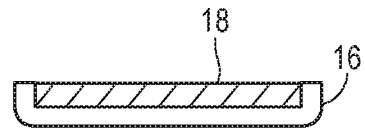
Figure 31:
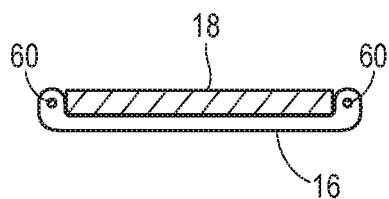
FIG. 31 illustrates a cross-sectional view of a flexible band device illustrating further side protection structure for protecting the edges of a flexible electronic display.

It may be important to limit in the manner in which the flexible support 16 can bend or flex so as to protect the flexible display 18 and/or the touch screen interface 26 of FIGS. 1-29, as well as to provide or protect the edges of those devices, which might be subject to impact if the dynamically flexible article or device 10 is hit from a lateral side. FIG. 30A illustrates a top view of the flexible support 16, showing the flexible display 18 disposed thereon. In this case, the flexible display 18 is disposed on top of the flexible support 16 over the center portion of the support 16, while the edges of the support 16 extend out transversely towards the sides of the device 10 beyond the flexible display 18 at least a little bit. This additional area of material of the support 16 may be used to protect the flexible display 18 from being bent or torn in the case of a side impact to the device 10, as this material will operate to blunt or absorb some of that impact. As illustrated in FIG. 30B, which provides a cross-sectional view of the device 10 of FIG. 30A, the flexible support 16 can be thicker in the area at the edges of the device 10 and may extend upward to be even with or disposed above the lateral or transverse sides of the flexible display 18, to provide additional side impact protection for the flexible display 18. In this case, as illustrated in FIG. 30B, the display 18 is seated in a space or crevice formed within the center of the support 16, wherein the support 16 has sidewalls that extend above or up against the edges of the flexible display 18, in order to provide side impact protection to the display 18. In some cases, the edge or sidewalls of the support 16 that extend upward to protect the edges of the flexible display 18 and/or the touch screen interface 26 (if present) may be formed with stitching when the support 16 is made of leather for example. In another embodiment, illustrated in FIG. 31, additional side impact protection is provided by a wire or other harder, rigid or semi-rigid material 60 (having a density greater than that of the flexible support material 16, but that is still flexible) disposed within or along the flexible support 16 along the edges of the flexible display 18 near or adjacent to the sides of the flexible display 18. As illustrated in FIG. 31, the wires 60 are provided within the flexible support material 16 and extend along the edge of the band portion 12 next to or adjacent the transverse sides of the flexible display 18 to provide superior support or edge protection for the display 18 in the case of a side impact to the device 10. Of course, other types of edge protections besides those illustrated in FIGS. 30 and 31 can be used to protect the edges of the of the flexible display 18.

FIGS. 32-42 illustrate structures that can be used to protect the flexible display 18 and the touch screen interface 26 (if it exists) by limiting the certain flexing, bending and/or torsional movement of the flexible support 16, and thus the display 18 disposed thereon, to certain predefined bending motions or ranges. In particular, because the flexible display 18 is formed as a set of separate substrates having different electronic components formed or etched thereon, as will be described herein, certain types of movement or bending motions may cause damage to the flexible display 18 by causing these layers to delaminate or come apart from one another. In particular, while it is generally possible to flex or bend the band portion 12 in one direction (e.g. around a wrist to form a circular band such as that shown in FIGS. 2 and 4) without delaminating, buckling, cracking or otherwise damaging the separate layers of the flexible display 18, it is typically not generally desirable to be able to flex or bend the display 18 in multiple different directions, such as forming a circular band with the flexible display 18 facing the inside of the band and twisting the band, as doing may cause the layers of the flexible display to delaminate from one other and thus stop functioning, or may be undesirable for usability of the article 10.

More particularly, while it is desirable to bend the flexible support 16, as illustrated in FIGS. 2 and 4, such that the display 18 faces towards the outside of a circular ring (i.e., wherein the display surface of the flexible electronic display through which the image content is viewable is bent to be convex and the surface of the flexible electronic display disposed near or adjacent the support structure is bent to be concave), it would be disadvantageous, in some embodiments, to bend the device 10 too far in the opposite manner (referred to herein as a counter-rotational direction), i.e., with the display 18 on the inside of the ring (wherein the display surface of the flexible electronic display through which the image content is viewable is bent to be concave and the surface of the flexible electronic display disposed near or adjacent the support structure is bent to be convex). Still further, it would be undesirable to provide too much flexing of the sides of the flexible display 18 around the longitudinal axis of the band 12 or too much torsional bending on the flexible display 18, wherein such torsional bending rotates one of the clasps 14 around the longitudinal center line of the band 12 with respect to the other of the clasps 14, thus forming a helical structure in the band 12. In this case, torsional rotation would occur when one end of the flexible display 18 is rotated in one direction while the other end of the flexible display 18 is rotated in the other direction, such as by rotating one of the end pieces 14 about the center longitudinal axis of the band 12 in a clockwise direction while simultaneously rotating the other end piece 14 about the center longitudinal axis of the band 12 in a counter-clockwise direction simultaneously. Again, as will be understood, too much of such a bending movement could delaminate the flexible display 18 and/or otherwise damage the flexible display 18.

FIGS. 32-42 illustrate various mechanisms for limiting the bending or flexing motion of the flexible support 16 of the device 10 to the desired bending motions like those illustrated in FIGS. 2, 4, 28 and 29, while limiting undesirable bending motion such as, for example, longitudinal flexing and torsional or counter-rotational flexing of the display 18. In particular, these or other mechanical structures can be used to limit the bending motion of the flexible substrate to a minimal radius of curvature (e.g., in the rotational direction, such as when the display surface of the flexible electronic display through which the image content is viewable is bent to be concave and the surface of the flexible electronic display disposed near or adjacent the support structure or flexible band is bent to be convex) to be greater than or equal to the minimum critical bending radius of the flexible electronic display. Here, the minimum critical bending radius of the flexible electronic display is the minimal or smallest bending radius at which further bending will impair or destroy the functionality of the flexible electronic display by, for example, breaking the electronic connections or other components in the flexible electronic display.

Figure 32A:
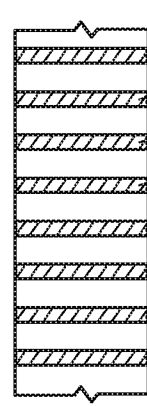
FIG. 32A illustrates a top view of a flexible support of a band device having a torsional and transverse bending limiting structure in the form of a number of transverse spacers.
Figure 32B:
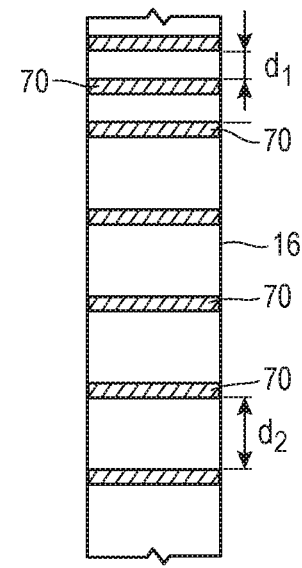
FIG. 32B illustrates a top view of a flexible support of a band having a torsional and transverse bending limiting structure in the form of a number of transverse spacers spaced at different distances from one another.

As shown in FIGS. 32A and 32B the support 16 can include a series of spacers or bars 70 disposed between sections of the band portion 12 from one side of the band 12 to another side of the band 12 (i.e., oriented transversely) across the band portion 12. The spacers 70 operate to limit or reduce the amount of torsional rotation that is able to be applied to the substrate 16 and also limit the amount of longitudinal rotation that can be applied to the band 12. More specifically, the material, size, number, and/or spacing of the spacers 70 within the flexible support 16 may be varied to define, and thus limit, the amount of torsional motion that can be applied to the support 16. To this end, the spacers 70 can be made of a material, such as a rigid or semi-rigid material like hard plastic or metal that is stiffer or more inflexible than the material from which the band 12 is made. In other embodiments, the spacers 70 and the support 16 can be made of the same material, but the spacers 70 may comprise a thicker or denser configuration of that material. In yet other embodiments, the support 16 may be made of a bendable metal that bends easily at large radii of curvatures (i.e., small bending angles) but that increases in stiffness or non-elasticity at smaller radii of curvatures (i.e., larger bending angles). The spacers 70 may be separately formed and then disposed within or on the support 16 or may be manufactured as part of the support 16. For example, the spacers 70 can be molded on the underside of the band portion 12. In FIG. 32A, the spacers 70 are evenly spaced across the band portion 12, such that all portions of the band portion 12 are subject to the same bending or flexing limit. Alternatively, one or more of the spacers 70 can be spaced at different distances from one another across the band portion 12. In FIG. 32B, the spacers 70 are spaced at different distances across the band portion 12 (i.e., d2 is greater than d1), such that different portions of the device 10 (e.g., the sides) can be bent or flexed more than other portions of the device 10 (e.g., the top and the bottom). The spacers 70 may also operate to absorb side impacts to the band 12. For example, the support 16 can have a width that is at least slightly larger than the width of the flexible display 18, such that the spacers 70 also act as side impact protection structure.

Figure 33:
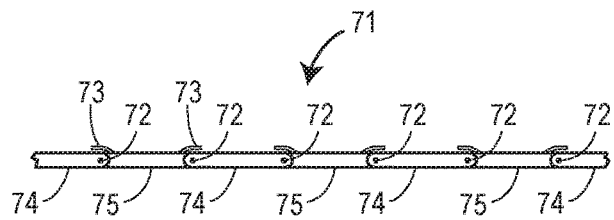
FIGS. 33-39 illustrate views of various bending limiting members that limit the flexing motion of a flexible support in at least one direction while allowing particular flexing motion in another or opposite direction.

In FIG. 33, the interconnected slats or bars have alternating flat members 74 and flat members 75 with wings or protrusions 73 on the edges thereof, wherein the wings 73 are disposed above the adjacent flat members 74. The flat members 74 are pivotally connected to the flat members 75 so that the wings 73, when disposed above a flat member 74, prevent or at least limit rotation about the pivot point 72 in one direction while allowing such rotation in the opposite direction.

Of course, if desired, the shape and/or curvature of the wings 73 can be varied to permit more or less rotation about the pivot point 72. In some cases, it may be desirable to vary the shape and/or curvature of only some of the wings 73. For example, wings 73 that permit greater bending can be used at or along sections of the band 12 (e.g., the sections disposed along the sides of the wrist) where more curvature is desirable.

Figure 34:
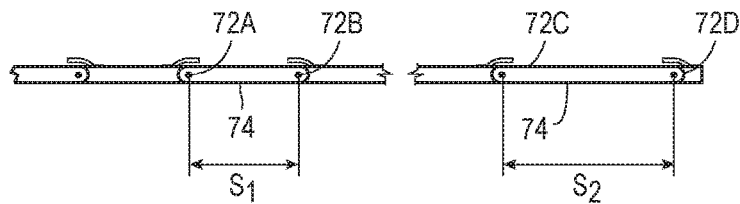
Figure 35:
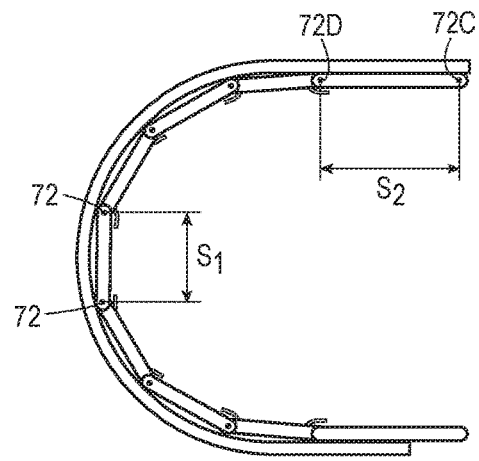

In some cases, the spacing between the pivot points 72 may be adjusted to control (e.g., adjust) the minimum radius of curvature at which the band 12 can be bent, and, in turn, provides a more comfortable oval-shaped band 12 when worn (in contrast to a less comfortable circular-shaped band 12). As shown in FIG. 34, the spacing between the pivot points 72 can be different at different points along the band 12. In other words, the pivot points 72 in one section of the band 12 may be a distance of d1 apart from one another, while the pivot points 72 in another section of the band 12 may be a distance of d2 apart from one another, d2 being greater or less than d1. For example, the spacing between pivot point 72A and 72B ($S_1$ in FIGS. 34 and 35) is less than the spacing between pivot point 72C and 72D ($S_2$ in FIGS. 34 and 35). As such, different sections of the band 12 (e.g., the sections disposed along the sides of the wrist) can be bent or flexed more than other portions of the band 12 (e.g., the sections disposed along the top and the bottom of the wrist), thereby facilitating the formation of a more oval-shaped band 12, as illustrated in FIG. 35.

Figure 36:
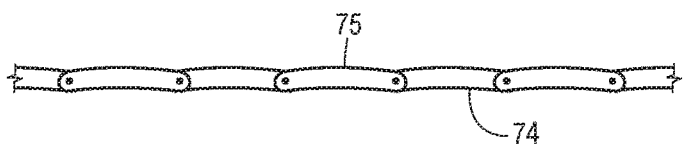
Figure 37:
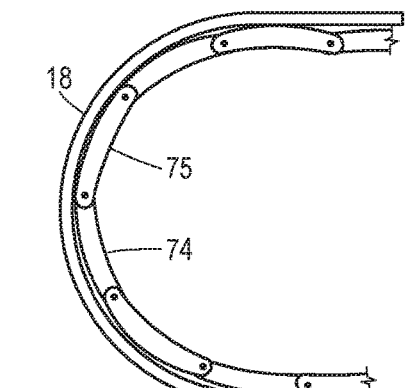

As shown in FIG. 36, the interconnected bars 74 and 75 can be arched or curved. As illustrated in FIG. 37, such a configuration serves to reduce, or even eliminate, the sharpness of the bending at the pivot points 72, thereby providing a more continuous shape when the band 12 is bent. In some cases, it may be desirable to arch the bars 74 and 75 so that the local display bending radii at the pivot points 72 are equal and opposite when the band 12 is both flat and bent (e.g., disposed around the wrist).

Figure 38:
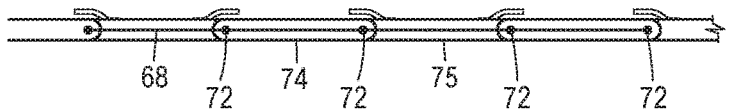

In some instances, it may be desirable to limit the number of configurations that the device 10 can take on, such as, for example, cheap-looking configurations, configurations that provide a confusing user experience, or configurations in which the device 10 is likely to be damaged. To this end, one or more of the pivot points can be connected together with or using an interconnecting wire. As shown in FIG. 38, the pivot points 72 are connected together with or using an interconnecting wire 68. In some cases, several interconnecting wires 68 may be needed to connect different groups of pivot points 72. For example, one wire 68 may be utilized to interconnect pivot points 72 disposed along one side of the band 12, while another wire 68 may be utilized to interconnect pivot points 72 disposed along the opposite side of the band 12. In any event, the interconnecting wire(s) 68 serve(s) to synchronize the movement of the pivot points 72 that are connected to one another, which, in turn, fixes the angle between interconnected bars 74 and 75 for those pivot points 72 that are connected together.

Figure 39:
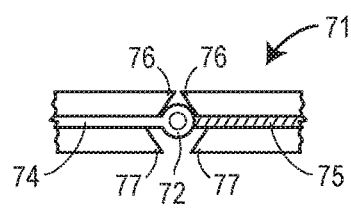

In FIG. 39, interconnected bars 74 and 75 are connected at pivot points 72 and each includes a protrusion 76 that extends at least partially above the pivot point 72. In this case, the protrusions of adjacent bars 74 and 75 contact each other very soon (in response to minimal rotation about the pivot point 72) when rotated in one direction, to thereby limit or prevent such rotation, and allow rotation in the opposite direction. Moreover, the interconnected bars 74 and 75 may additionally include protrusions 77 that extend below the pivot point 72 but that are spaced further apart and thus allow more rotation than the protrusions 76. The protrusions 77 will thus enable the member 71 to bend in one direction (i.e., the down direction in FIG. 39) more than in the other direction (i.e., the up direction in FIG. 39). However, the protrusions 77 will still prevent bending or flexing at large angles of curvature and the spacing and interaction of the protrusions 76 and 77 can be configured to limit the minimal bending radius of the support element 71 to the greater than or equal to the minimum critical bending radius of the flexible electronic display 18 disposed on the support element 71, to thereby protect the flexible electronic display 18. In any event, the spacing and size of the protrusions 76 and 77 can be adjusted to obtain the desired amount of flexing in each direction.

Figure 40:
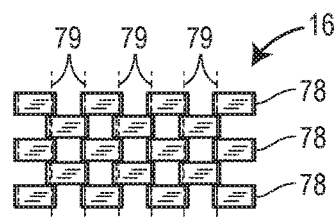
FIG. 40 illustrates a top view of a bending or flexing limiting structure forming a flexible support, formed as a series of transversely interconnected longitudinal members, each longitudinal member made up of a set of longitudinally disposed links.

Still further, FIG. 40 illustrates a top view of a bending or flexing limiting structure forming a flexible support, formed as a series of transversely interconnected longitudinal members 78, each longitudinal member made up of a set of longitudinally disposed links. Here, the various sets of rotatably interconnected links are rotatably interconnected by pivot members disposed along the dotted lines 79 of FIG. 40. The various sets of links as illustrated in FIG. 40 may be used as or may be part of the flexible support 16, and may operate to limit the bending motion of the flexible support 16 in each of the longitudinal, counter-rotational and torsional directions described above. Of course, the interconnected links illustrated in FIG. 40 could additionally have wing or protrusion structure such as that of FIGS. 33, 34, 35, 38 and 39, or other structure that limits rotation of adjacent links about the transverse pivot points 79 interconnecting the links, to provide superior bending or flexing limiting structure.

Figure 41:
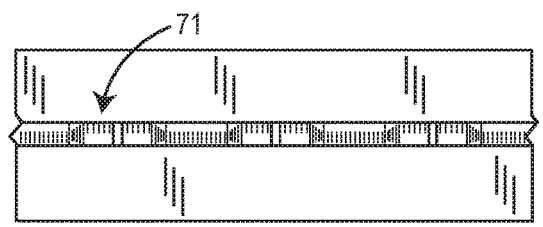
FIG. 41 illustrates a top view of a flexible support of a band device having bending limiting structure of any of FIGS. 33-39 disposed therein.

In any event, the configuration of the members 71 of FIGS. 33-40 allow or enable movement of the adjacent slats or flat members 74, 75 and 78 with respect to one another in one direction, e.g., the down direction in FIGS. 33 and 34, limited to a particular minimum bending radius, while limiting the rotational movement of the slats or bars 74 and 75 in the opposite direction, such as the up direction in FIGS. 33 and 34, to the same or a different minimum bending radius. In this case, the member 71 with the alternating flat members 74 and flat members 75 or the interconnected support of FIG. 40 may be disposed along a longitudinal axis or in the longitudinal direction of the support 16, as illustrated in FIG. 41, to allow the bending motion illustrated in FIGS. 2 and 4 while limiting counter rotational bending motion. While only one member 71 is illustrated in FIG. 41 as being disposed longitudinally in the center of the flexible support 16, more such members could be disposed at other locations along the length of the flat support 16, such as on either or both lateral sides of the support 16. Moreover, while only one member 71 is illustrated in FIG. 41, multiple such members could be used to limit the counter-rotational movement of the flexible support 16. Of course, if desired, a bending limiting member similar to that of FIGS. 33 and 34 could be disposed along the edge of the flexible support 16 instead of or in addition to the wire 60 of FIG. 31, so as to both protect the edge of the flexible display 18 (by providing a rigid or semi-rigid structure at the edges of the display 18) and to limit the counter-rotational movement of the flexible support 16, while allowing some rotational movement of the support 16 in the manners described herein. Thus, for example, in FIG. 31, the wire 60 could be replaced with a series of links forming a bar member 71 in accordance with the principles of FIG. 33 or 34, for example, wherein the links 74 and 75 are rotationally connected to one another and are disposed such that they allow rotation or movement in one direction a certain amount while not allowing or at least limiting movement relative to one another in the other direction. Of course, the flat interconnected longitudinal members of FIGS. 33 and 34 could be used in conjunction with the slats or bars of FIG. 32 to limit both the torsional and the counter rotational movement of the flat support 16 in the manners described above.

Figure 42:
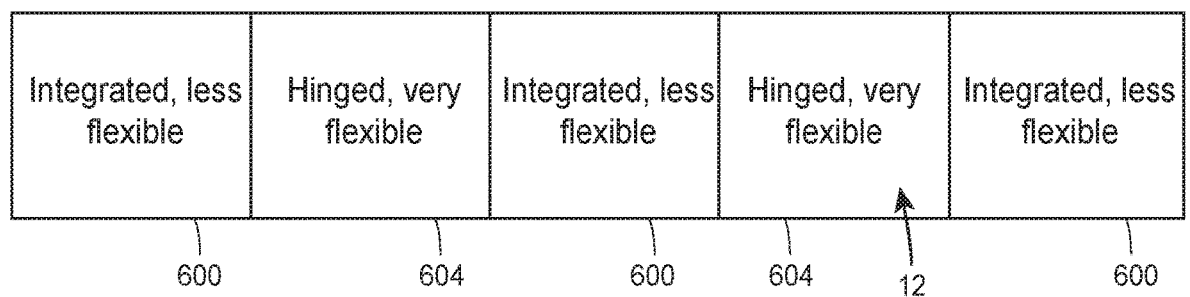
FIG. 42 illustrates a top view of a flexible support of a band that includes a combination of uniformly constructed portions and hinged portions with each portion have a different flexibility from an adjacent portion, to provide a support for a flexible electronic display that includes various different bending characteristics at different locations or sections of the flexible support.

In the embodiment illustrated in FIG. 42, the band 12 includes or is formed of one or more monolithically integrated, less flexible portions 600 combined with one or more hinged, more flexible portions 604. In other words, the band 12 depicted in FIG. 42 can include one or more portions constructed in accordance with different configurations of any one of the bands 12 described in FIGS. 1-6, 7A-7B, 27A-27C, 28-29, 30-42, to provide generally uniformly constructed or configured bending structure at different portions or sections of the band.

Generally speaking, the position of the less flexible portions 600 corresponds to portions of the article 10 where the required amount of flexing is limited (e.g., the portions of the article 10 disposed on the top and bottom of a wrist), while the position of the more flexible portions 604 corresponds to portions of the article 10 where the required amount of flexing is greater (e.g., the portions of the article 10 disposed adjacent the sides of the wrist). In any event, as illustrated in FIG. 42, the band or support member 16 can have any number of different sections of portions that allow or enable more or less bending (e.g., that have different minimum radii of curvature in either or both the rotational and counter-rotational directions) to effectuate different degrees of bending in these directions.

Examples of Statically Flexed, Optimized Display Areas

As previously discussed, in some configurations, the display area of a flexible display that is statically flexed may be optimized. Generally, any or all of the concepts discussed above with respect to dynamically flexible displays may be applied to statically flexed displays. A statically flexed display may be formed, for example, from an integrally statically-flexed display having a dynamically flexible backplane and a rigid frontplane. In another example, a statically flexed display may be formed from a dynamically flexible backplane and a dynamically flexible frontplane disposed on or proximate to a rigid support. Indeed, any one or more of the concepts or techniques described above with respect to FIGS. 1-44 may be included in an article or device having a statically flexed display with an optimized display area. For illustrative and non-limiting purposes, though, examples of statically flexed, optimized display areas are now specifically discussed.

Figure 43:
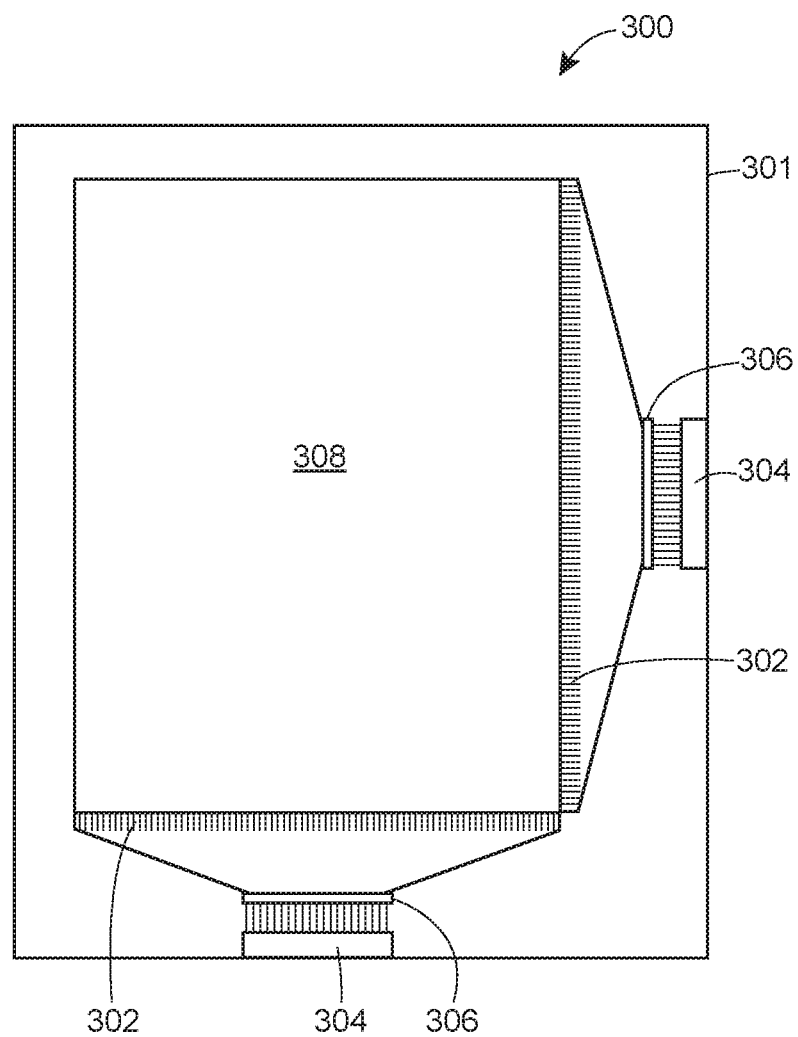
FIG. 43 illustrates an example backplane component with electronically energizing components.

FIG. 43 illustrates an example backplane component 300 with electronically energizing components for energizing a frontplane component (not shown) of an electronic display, e.g., an integral display. The backplane component 300 includes a flexible backplane substrate 301 which may be constructed from a flexible plastic or polymer base film, or other suitable material. Electronically energizing components may be printed, formed, or etched, as known in the industry, onto the backplane substrate 301 such that the backplane substrate 301, including the energizing components disposed thereon, may flex or bend.

The example backplane component 300 includes electronic leads 302 and flexible printed circuits (FPC's) 304, or pin connection modules, on the backplane substrate 301. In addition, the backplane component 300 may include driving integrated circuits (IC's) 306 attached to the electronic leads 302 and/or FPC's 304. The FPC's 304 may be operatively connected to a printed circuit board (PCB) of an attached computing device (not shown), as discussed further with respect to FIG. 44, to receive electronic current or voltage signals for charging and/or controlling an integral display. Further, the FPC's may direct the electronic current or voltage signals to the input of the driving IC's 306 to transform the control signal into display signals that include signals to render one or more pixels on a, for example rectangular, display area 308. For example, the driving IC's may send display signals to an array of transistors disposed on the display area 308.

Figure 44A:
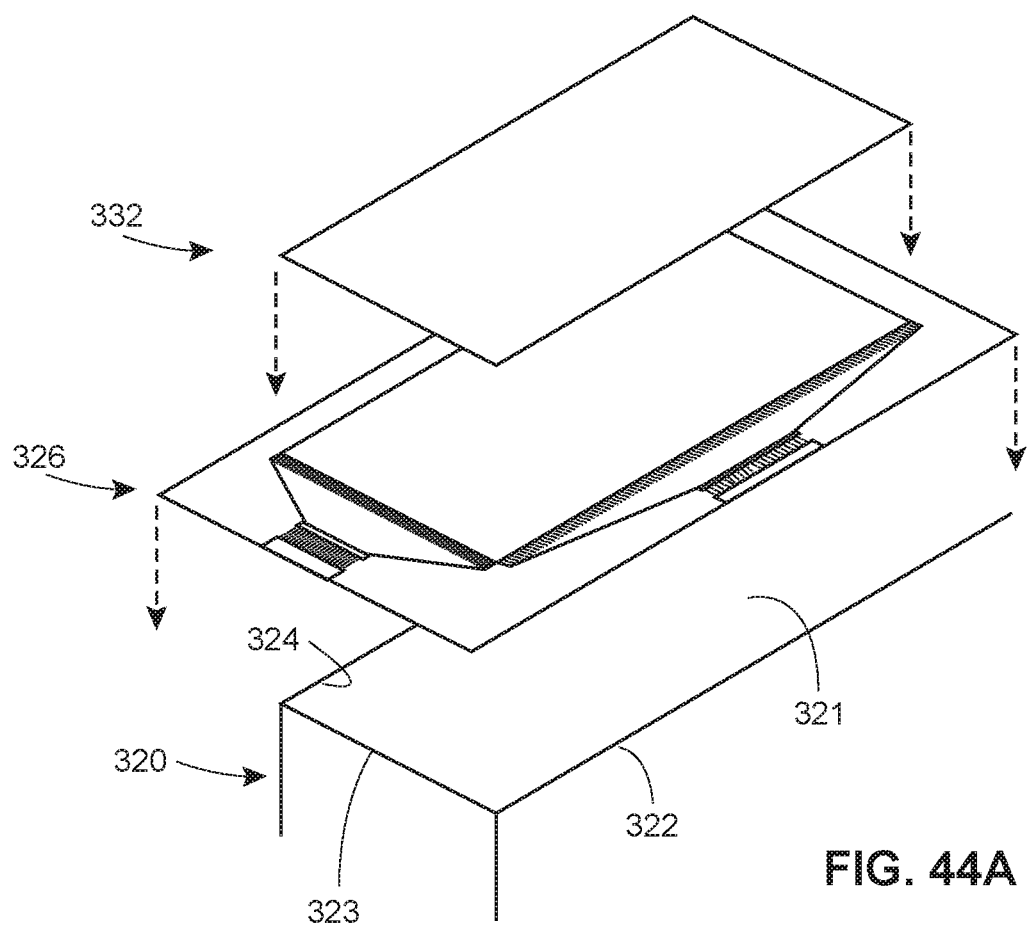
FIGS. 44A, 44B, 44C and 44D are expanded, perspective, and cutaway views of example integral displays in which the example backplane component of FIG. 43 can be implemented.
Figure 44B:
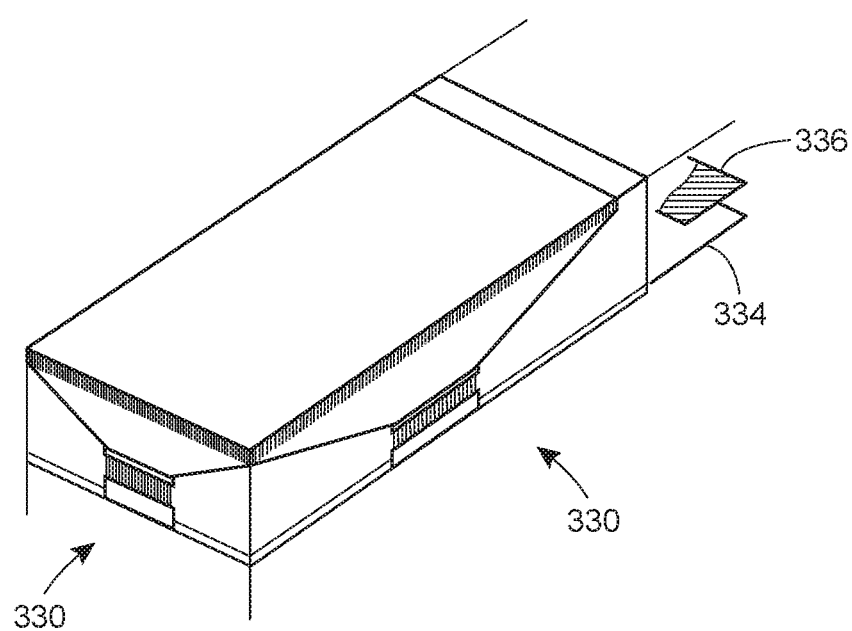

FIG. 44A and FIG. 44B are expanded and perspective views, respectively, of an integral display disposed on a display support 320, which may be an essentially rigid display support. To make use of the available flat surface area of the display support 320, the display area of an integral display may cover a flat surface 321 of the display support 320 up to one or more edges 322, 323, and 324. The flexible backplane substrate 301 of a backplane component 326, and the electronically energizing components disposed thereon, may wrap, bend, or fold such that they are oriented along the non-parallel surfaces 330 adjacent to the flat surface 321, and a frontplane component 332 containing electronically energizable components may be disposed on top of a display area of the backplane component. Components formed, for example, on a flexible backplane substrate of the backplane component 326 may wrap, bend or fold in a manner which allows the components, such as electronic leads, to avoid overlapping or interfering.

To charge and/or control the example integral display, one or more electronic connections 334 may connect FPC's, or pin connection modules, to a PCB controller 336, where the PCB controller 336 is part of a computing device, such as a smartphone, tablet computer, laptop computer, personal digital assistant (PDA), etc. In some cases, the PCB controller 336 may be designed particularly for controlling the integral display, and in other cases the integral display may connect to a generic display PCB via any suitable video or display connector/adaptor, such as Video Graphics Array (VGA), High Definition Multimedia Interface (HDMI), Digital Visual Interface (DVI), etc.

Figure 44C:
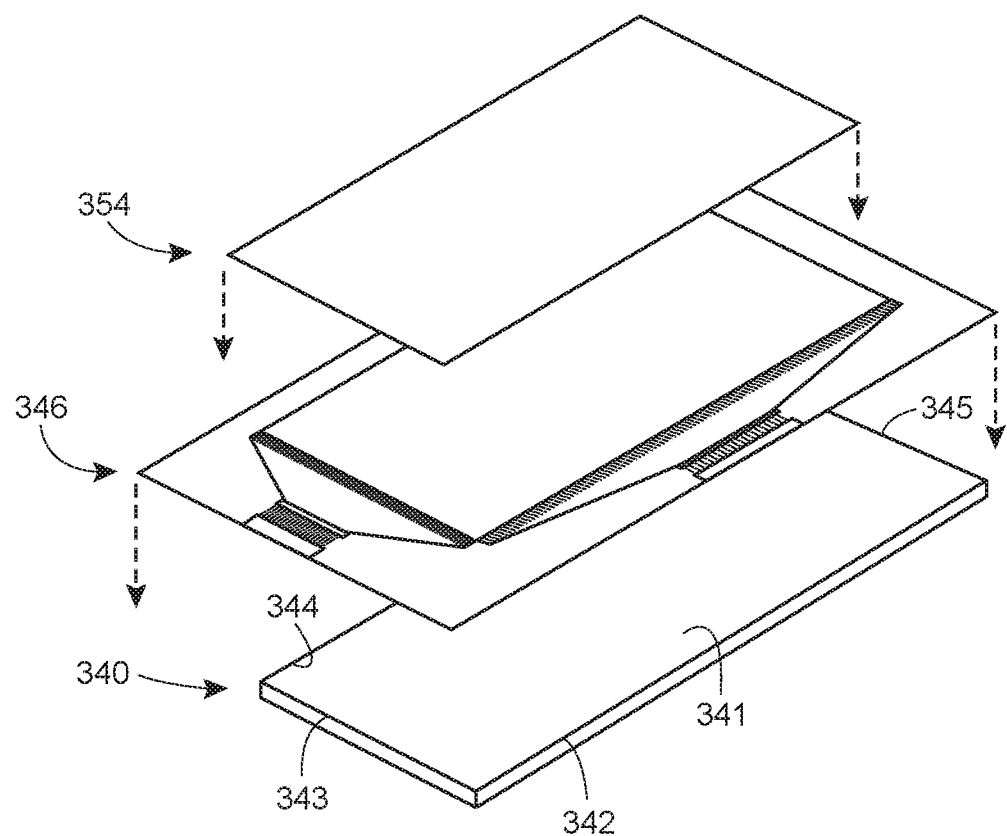
Figure 44D:
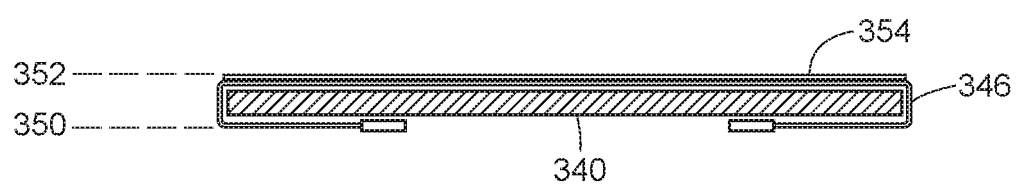

Similarly, FIGS. 44C and 44D are expanded and cutaway views, respectively, of an integral display disposed on another display support 340. To make use of the available flat surface area of the display support 340, the display area of an integral display may cover the flat surface 341 of the display support 340 up to one or more edges 342, 343, 344, and 345. The flexible backplane substrate 301 of a backplane component 346, and the electronically energizing components disposed thereon, may wrap, bend, or fold such that they are oriented along the plane 350 (e.g., the "bottom" of the display support 340) opposite the plane 352 (e.g., the "top" of the display support 340). Thus, the backplane component 346 may wrap around a thin support (e.g., from the top, around the sides, and onto the bottom of the thin support) such that portions of the backplane component 346 are "tucked" underneath a display support. In general, a backplane component may wrap or bend from the top to the bottom of a display support on all sides of the support or only on some of the sides of the support. Further, a frontplane component 354 containing electronically energizable components may be disposed along the plane 352 on top of a display area of the backplane component 346.

In some scenarios, the portions of the backplane component 346 or display support 340 that are non-parallel to or are disposed at least partially on a different plane than the frontplane component 354 are covered by a layer of protective opaque material such that the electronically energizing components are not visible to a user. For example, an integral display on a smartphone may include a backplane substrate with electronically energizing components, where the backplane substrate is bent or wrapped to the sides of the smartphone and covered with a material such as glass, plastic, or metal to protect and conceal the electronically energizing components on the backplane substrate. Also, some integral displays include a transparent protective material covering the display area of an integral display (e.g., covering a frontplane component).

Although FIGS. 44A-44D illustrate examples of display supports of a certain shape, flexible displays, as described above, may be integrated with any suitable display support. For example, a smartphone, tablet computer, laptop computer, wearable electronic device, or other computing device may utilize an integral display having edges of a display area congruent with edges of the computing device. A smartphone, for example, may thus utilize the entire width of the smartphone, or even an entire user-facing surface, for displaying content to a user. In another scenario, device accessories, such as cases, covers, clips, removable monitors, etc., may include integral displays.

Due to the fact that integral displays are not restricted to cover an area within a certain distance of the edges of a display support, integral displays may maximize, optimize, or otherwise preferentially utilize the space available on a display support. For example, integral displays may allow images to be displayed from one edge of a device to another edge of a device without the need for bordering regions between the display and the case edge. In some configurations, integral displays may allow images to be continuously or contiguously displayed across multiple planes, curves, and/or other contours of a display support (e.g., across multiple perpendicular surfaces or across multiple surfaces that are not disposed in the same plane) thus maximizing the display area that is visible to a user. Integral displays may have a size that is preferable for specific application needs, available surface areas, aesthetic considerations, etc. without strict requirements or constraints related to edges or boundaries.

Figure 45:
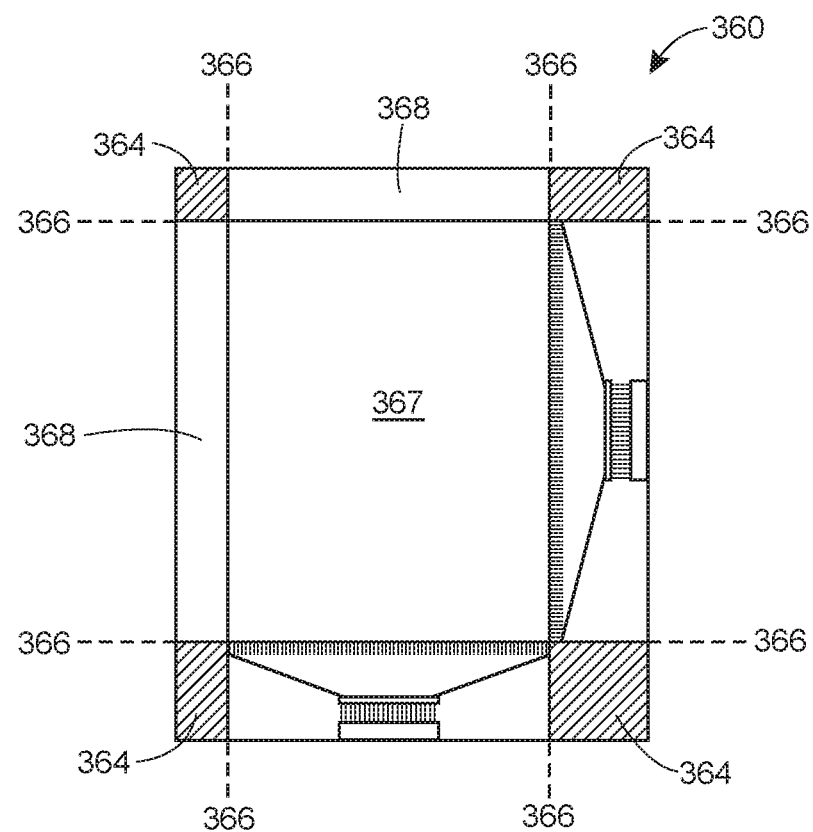
FIG. 45 illustrates an example backplane component modified to be easily bent along edges of a display substrate, such as the display substrate illustrated in FIGS. 2A and 2B.

To aid in wrapping or bending a backplane component to a different plane, as illustrated in FIG. 44B or 44D, some backplane substrates may be cut or trimmed such that they easily wrap around edges of a display support. FIG. 45 illustrates an example backplane component 360 with a backplane substrate 362 having one or more cutout areas 364 removed to aid in bending or wrapping the backplane component 360. Upon removing the one or more cutout areas 364, the backplane component 360 may easily bend along one or more lines 366 without any overlapping or folding of the corner portions of the backplane component 360. Thus, the edges of a display area 367 may be congruent with the edges of a display support of the same size while the remaining portions of the backplane component 360 (outside the display area 367) may be easily oriented along a plane other than the plane of the display area 367.

Although the example backplane 360 may be folded or bent along the lines 366, any suitable portions of backplanes may be removed such that any number of edges of display areas may be aligned with edges of display supports. By way of example, portions of a backplane may be removed or formed such that edges of a display surface are aligned with all edges, two adjacent edges, two opposite edges, or three adjacent edges of a rectangular or square display support, thus allowing a display to appear "edgeless" along those certain aligned edges. In some cases, one or more excess portions 368 of the backplane 360, that do not include electronically energizing components disposed thereon, may also be removed. Moreover, the flexible electrically energizing components of backplanes may be printed on a backplane in an arrangement that allows only part of a display area edge to be congruent with an edge of a display support.

Further, backplanes may include any number of suitable electronically energizing components, such as driving IC's and FPC's. In a certain scenario, only one edge of a display area connected therewith may be aligned with one edge of a display support. In such a case, a backplane may include one driving IC and one FPC for the edge of the display area congruent with the edge of the display support and another IC and FPC for the remaining edges of the display area.

Integral displays, such as those illustrated in FIGS. 44A-44D, may be manufactured as a flexible display, such as an e-paper display, an organic light emitting diode (OLED) display, etc. Generally speaking, integral displays may include any or all of the display aspects and features described herein.

To illustrate a use of an integral display, FIG. 46 is a perspective view of an example mobile device case 370 that may be attached to smartphone or smart device 374, where the mobile device case 370 includes an integral display 372. The mobile device case 370 includes a shell 376, one or more holes 378 for access to mobile device components, and a two way connector 380 for charging/synchronization of the smartphone 374 and for connecting the integral display 372 to the smartphone 374. A user may attach the mobile device case 370 to the smartphone 374 by aligning the two way connector 380 with a connection jack (not shown) on the bottom of the smartphone 374 and sliding, or pushing, the mobile device case 370 onto the smartphone 374, as indicated by arrows 382. Mobile device cases with integral displays may attach to any suitable mobile device, such as a tablet computer, personal digital assistant (PDA), electronic reader (eReader), digital camera, personal navigation device, etc. in any suitable way, such as snapping together disjoint pieces, extending or compressing components, etc.

FIGS. 47A and 47B are front and back perspective views, respectively, of another example mobile device case 390 with an integral display 392. The integral display 392 may completely cover the width of the mobile device case 390 from one edge to the other edge such that an image, or other graphical representation as discussed below, may be displayed on the integral display 392 across the entire width of the mobile device case 390. The integral display 392 may utilize flexible components, as previously discussed, to achieve maximum coverage of the back of the mobile device case 390 or coverage of multiple surfaces of the mobile device case 390. In some scenarios, the integral display 392 may not completely cover the entire height of the back of the mobile device case 390 to leave room for an access hole 394. However, the integral display 392 may cover one entire surface of the mobile device case 390 and/or extend over multiple surfaces of the mobile device case 390.

A mobile device may charge and control the example integral display 392 via a two way connector 396. For example, the integral display 392 and a mobile device, to which the case is attached, may both be operatively connected to the two way connector 396 such that the mobile device may charge the integral display 392. In addition, the integral display 392 may receive imagery via the two way connector 396 to be displayed on the integral display 392. For example, a mobile device, such as the smartphone 374, may send a rendering of a photo to the integral display 392, via the two way connector 396, for display on the back of the mobile device case 390.

In some scenarios, the integral display 392 may display imagery received from applications executed by a mobile device attached to the mobile device case 390. For example, a mobile device may store various applications, such as calendar, web browser, email, news, chat, social media, photo sharing, etc. applications, as computer executable instructions in memory, as further discussed with reference to FIG. 49. The mobile device attached to the mobile device case 390 may send images generated by these applications, such as calendar views, photos, rendering of news stories, etc., to the integral display 392 such that a user may view the images on the back of the mobile device case 390. A user may trigger the communication of images to the integral display 392 via user interaction with the mobile device.

In an example scenario, a user of a mobile device, to which the mobile device case 390 is attached, clicks, taps, or otherwise communicates, via a user interface, a request that a photo, or other imagery, be sent to the integral display 392. The mobile device may send, via the two way connector 396, the photo to the integral display 392, and the integral display 392 may display the photo until the mobile device is powered off, a pre-defined length of time, or until further imagery is sent to the integral display 392. The photo may be, for example, a personal photo with which the user would like to personalize the mobile device case 390, for example.

Thus, the mobile device case 390 may be easily personalized at any time by displaying photos, artwork, doodles, etc. on the integral display 392. When a user desires a change in the personalization of the mobile device case 390, the user need only request that another image be displayed on the integral display 392.

In another example scenario, a user of a mobile device, to which the mobile device case 390 is attached, may synchronize the integral display 392 with an application executed by the mobile device or indicate that content from the application is to be displayed on the integral display 392. For example, a user may send calendar content, such as a "To-do" list, and subsequent updates to the calendar content to the integral display 392, via user interaction with a user interface of the mobile device. As such, the mobile device case 390 may allow a user to simultaneously display content from certain applications on the integral display 392 and interact with other applications on a user interface of the mobile device attached to the mobile device case 390. For example, a user may receive a mobile airline boarding pass, via an email client application, and may send the boarding pass to the integral display 392. While the boarding pass is displayed on the integral display 392 the user may continue to browse email, open other applications, or make phone calls, for example, thus allowing easy access to important content (e.g., the airline boarding pass) without reducing productivity.

Figure 48A:
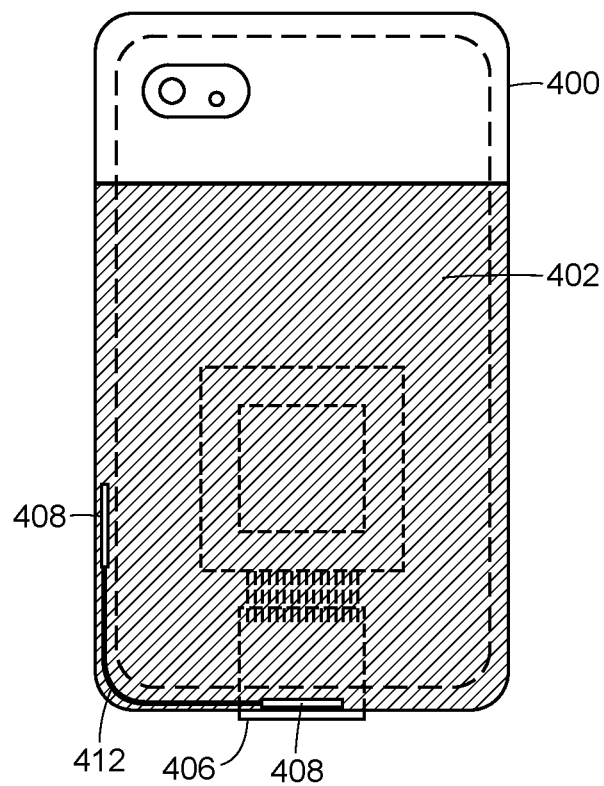
FIGS. 48A-48C are cutaway views of an example mobile device case with an integral display connected to a mobile device via a two way connector.
Figure 48B:
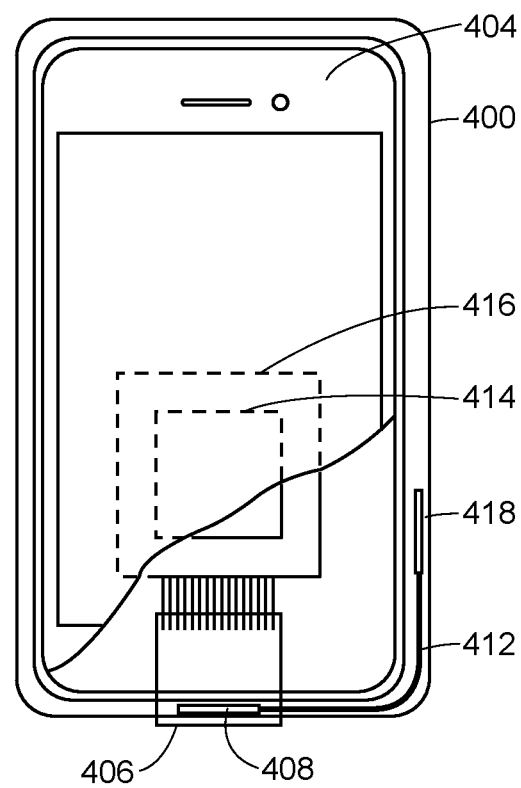
Figure 48C:
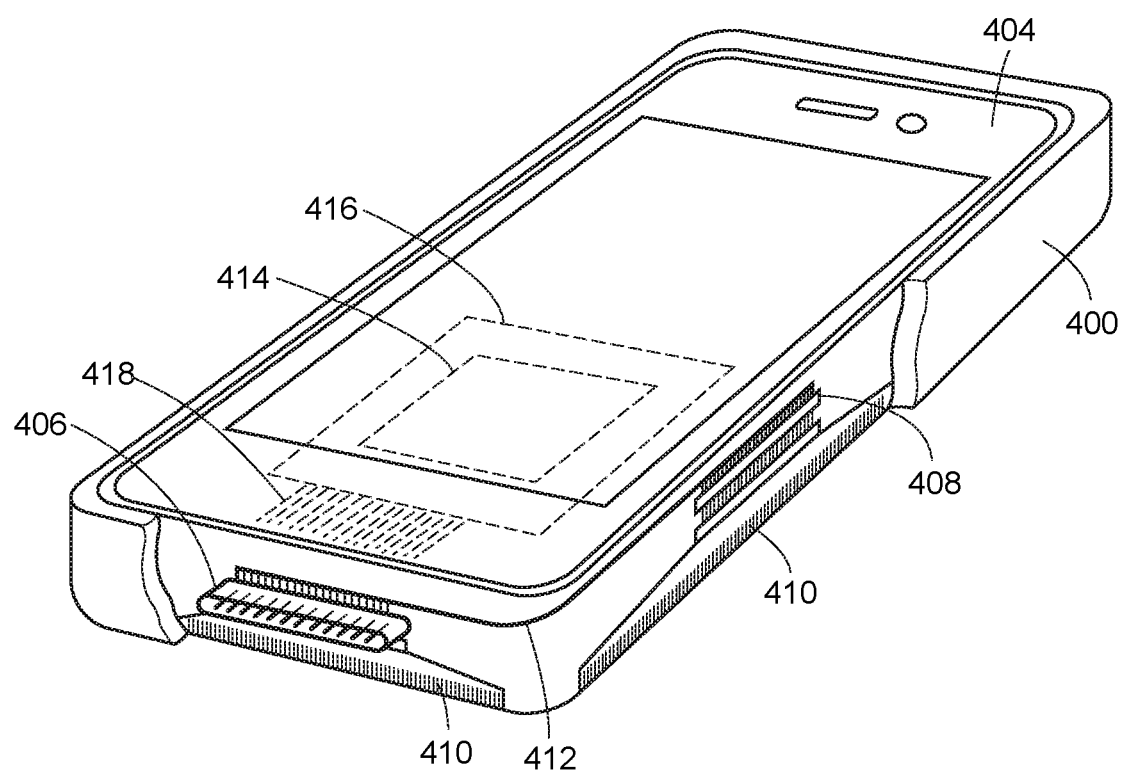

To illustrate example connectivity of an integral display and a mobile device, FIGS. 48A-48C are cutaway views of an example mobile device case 400 with an integral display, where the mobile device case 400 is attached to a mobile device 404. The mobile device case 400 is attached to the mobile device 404 via the two way connector 406. The two way connector 406 may include a proprietary male connection on interior side of the two way connector 406 and a proprietary female connection on the exterior side of the two way connector 406. The male connection may, for example, allow a smartphone, or other suitable mobile device, to be connected to the mobile device case 400 via a proprietary connection jack on the bottom of the smartphone used to charge the smartphone and/or synchronize (e.g. copy or backup the contents of) the smartphone with a computing device, such as a laptop or desktop computer. By way of example, commonly used propriety connections include Lightning™ connectors, 30-pin dock connectors, universal serial bus (USB) connectors, etc.

Also, the two way connector 406 may allow a proprietary charge/synchronization cord (e.g. provided with the mobile device from the manufacturer) to connect to the mobile device case 400 via the female connector. For example, a charge/synchronization cord with a male Lightning™ connecting end may connect to the exterior of the mobile device case 400. In such a way, charge/synchronization signals from a charge/synchronization cord may be transferred from the female end of the two way connector to the male end of the two way connector and may be subsequently provided to a connected mobile device. Thus, the mobile device case 400 may allow a user of a connected mobile device to charge/synchronization the mobile device without removing the mobile device case 400.

Moreover, the two way connector 406 may facilitate the communication of control signals from the connected mobile device 404 to the integral display 402 on the back of the mobile device case 400. One or more FPC interconnects 408, or pin connection modules, may be operatively connected to the integral display 402 via a plurality of electronic leads 410, as illustrated in FIG. 48A, on a backplane substrate wrapping from the back on the mobile device case 400 to within the side walls of the mobile device case 400. Further, the FPC interconnects 408 may be operatively connected to the two way connector via display connect leads 412. In some scenarios, the display connect leads 412 may include a specific number of electronic leads corresponding to a proprietary mobile device connection, and in other cases the display connect leads 412 may include any number of electronic leads connected an adaptor (not shown), where the adaptor converts signals from the display into a signal carried by electronic leads of a proprietary connection.

The two way connector 406 may allow control signals from the mobile device 404 to be passed from the mobile device 404 to the integral display. For example, display control signals may be generated by a controller 414 within a display PCB 416 of the mobile device 404. Subsequently the display control signals may be passed from the display PCB 416 through the two way connector 406 via one or more PCB leads 418 and to the integral display 402 via the display connect leads 412 and the electronic leads 410. At the same time, the two way connector 406 may allow a proprietary charge or synchronization cord to be connected to the mobile phone via the female connection of the two way connector 406. Thus, the mobile device case 400 provides the increased functionality of the integral display 402 while maintaining simple and convenient charging/synchronization connectivity.

Figure 49:
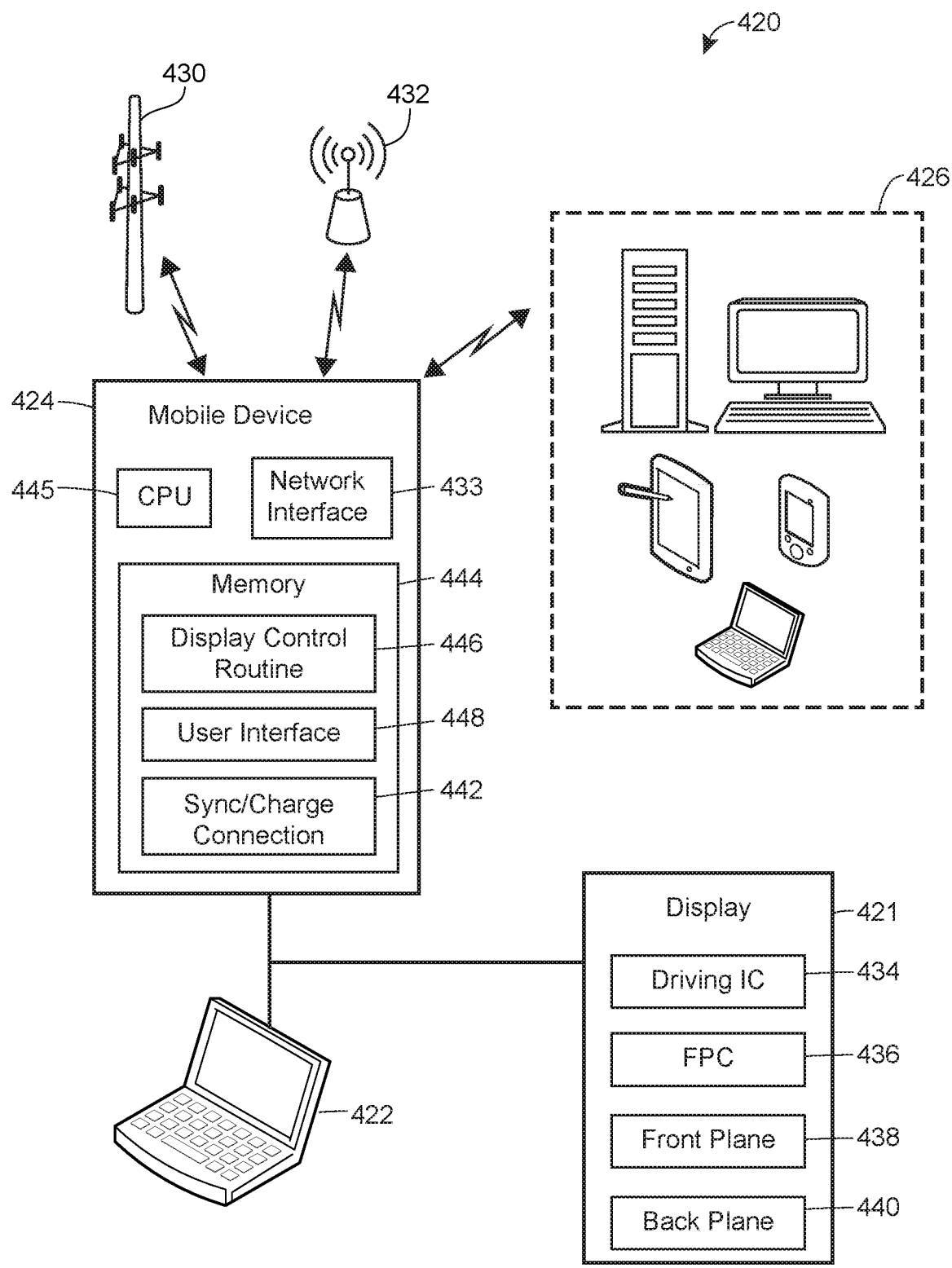
FIG. 49 illustrates an example environment in which a display can be integrated with a mobile device.

FIG. 49 illustrates an example environment 420 in which an integral display 421 may display content from a mobile device 424. This environment 420 is illustrated as including a computer 422, the mobile device 424, and one or more wirelessly connected mobile devices 426. Each of the one or more wirelessly connected mobile devices 426 may communicate directly with the mobile device 424 via, for example, Bluetooth communications, Wireless Local Area Networks (WLAN), cellular networks, or any other wireless communication protocol. Such wireless protocols may be direct or line of sight communication protocols or indirect or non-line of sight communication protocols. The environment 420 may also or instead include, for example, a cellular data communication connection 430 and/or a Wi-Fi connection 432 which may enable remotely situated devices to communicate with the mobile device 424 using any cellular or Wi-Fi based communication protocol, such as any of the IEEE 803.11 protocols, or any other wireless communication protocol. In any or all of these cases, a network interface 433 will be programmed or configured to perform such communications.

The integral display includes a driving IC 434, an FPC 436, a frontplane component 438, and a backplane component 440. The display components and the mobile device 424 may be connected via various electronic leads or cords, as previously discussed with respect to FIGS. 43-48C. As will be understood, the mobile device 424 may communicate directly (via the synchronization/charge connection 442) with the integral display 421 to perform various configuration and display functions. The mobile device 424 may have circuitry or may store and execute one or more applications within a memory 444 that perform communications with the integral display 421 to perform different display functions. For example, the mobile device 424 may execute, with CPU 445, a display control routine 446 to change display, configuration and communications settings of the integral display 421 in any desired manner. The display control routine 446 may, for example, also enable a user to send, via a user interface 448, new data, images or videos to the integral display 421 for storage and display. Of course, applications on the mobile device 424, such as email, calendar, web browser, social, etc. applications, may automatically communicate with the integral display 421 via the synchronization/charge connection 442.

In one scenario, a calendaring application, such as an Outlook® application, stored in the memory 444 and executing by the CPU 445 may display, via the charge/synchronization connection 442, a user calendar on the integral display 421. In a similar manner, one or more social networking applications, such as a Facebook® application, may interface with a user's Facebook account to provide or display recent updates, requests, information, etc. on the integral display 421. Still further, one of the applications may tie into one or more Twitter® feeds accessed via a Wi-Fi network and a server (not shown) to display these types of messages to the user on the integral display 421.

In still another case, an application executed on the mobile device 424 may enable advertisers to send advertisements to be displayed on the integral display 421. If desired, the user may be able to opt-in or opt-out of receiving particular advertisements or advertisements from particular sources and this information may also be stored within the memory 444. In any event, advertisements may be displayed on the integral display 421 as full advertisements taking up a substantial portion of the display surface, as a ticker tape scrolling across the top or bottom of the integral display 421, or in any other manner.

In yet another case, one of the applications stored in the memory 444 may be a messaging application or an e-card application. In this case, the application may enable users of other devices, such as users of the one or more wirelessly connected mobile devices 426 or users of remote devices connected to the cellular network 430 or Wi-Fi network 432 (preferably ones preauthorized by the owner of the mobile device 424), to send messages to be rendered on the integral display 421. For example, a husband may allow his wife and children to send personal messages and e-cards (which may include text and/or images) from their phones or computer devices to be displayed on the integral display 421. Here, the messaging application may check with a server, such as a text server or other server, for new messages, images, etc. sent by others and to be displayed on the integral display 421 when, for example, the mobile device 424 connects to the internet via a Wi-Fi or cellular network. In some cases, this messaging application may also accept messages directly from other computer or phone devices so that, for example, a wife may send a personalized message directly to her husband's mobile device case when she is near the mobile device case.

Still further, one of the applications stored in the memory 444 or any of the specific applications described herein, could implement a display scheduling feature that uses the clock or timer within the mobile device 424 to determine when to display certain images or to run certain applications on the integral display 421. For example, a display scheduling application may be responsive to the clock within the mobile device 424 to automatically execute a calendar application at the same time each day or each week day to thereby present the user's calendar to the user when, for example, the user typically leaves for work. Of course, the user could program when each application is to automatically execute for each day of the week, for example, and could program or configure, via the user interface 448, the settings of the display scheduling application to display certain application information at particular areas or regions of the integral display 421. Thus for example, the user may program a calendar to appear near the top of the integral display 421, a picture to display next to the calendar, text messages to be displayed in a bar below the picture, etc.

In still another example, one of the applications stored in the memory 444 may be an alarm or reminder application that may set or provide alarms or reminders to users based on any desired alarm or reminder criteria which may be set by the user. For example, the alarm application could operate as an alarm clock that sounds and/or displays an alarm at particular, user configured times. In a similar manner, the application could sound or display a reminder message to a user based on a time (e.g., shortly before the user is to leave work with a reminder to pick up an item from a store), based on calendared events set as part of a calendar application, etc. Such an alarm or reminder application may sound an alarm or reminder using a sound emitting device or speaker (not shown) disposed within the mobile device 424. Alternatively or in conjunction with such a sound, the application may cause all or a portion of the integral display 421 to change color, flash from one color to another, get brighter, etc. to indicate the existence of an alarm or reminder. Of course, in this case, the application may also or instead display a text message on the integral display 421 indicating the nature or the specifics of the alarm or reminder, information associated with the reminder (e.g., the conference room and attendees of a meeting for which the reminder or alarm is set), etc.

In still another case, one of the applications stored in the memory 444 may be a learning application that executes periodically, continuously, or at various other times to provide new information for assisting the user to learn. Such an application could present new words of the day, along with their pronunciation and definition, new language information for use in learning a new or different language, news, etc.

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing display features via a flexible electronic display on a dynamically flexible article as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

What is claimed:

1. An article, comprising:
    a flexible substrate including:
    a first portion, the first portion being a flexible backplane portion on which an elongated optoelectronic area is disposed, the optoelectronic area including a set of optoelectronic elements disposed in a plurality of rows and columns, each of the optoelectronic elements being configured to at least one of emit, reflect, transflect, or absorb light;
    a second portion on which a set of flexible connecting lines are disposed in a plurality of planes to maximize the optoelectronic area, wherein each individual flexible connecting line of the set of flexible connecting lines is entirely disposed in a single plane of the plurality of planes, the set of flexible connecting lines coupled to the set of optoelectronic elements; and
    a set of driving circuits communicatively coupled to the set of flexible connecting lines to communicate drive signals with the set of optoelectronic elements,
    wherein at least one connecting line of the set of flexible connecting lines is a shared connecting line communicatively connected to one of: a respective two or more columns of the set of optoelectronic elements, or a respective two or more rows of the set of optoelectronic elements.

2. The article according to claim 1, wherein the set of flexible connecting lines includes at least one source connecting line and at least one gate connecting line, and wherein the shared connecting line is a shared source connecting line or a shared gate connecting line.

3. The article according to claim 2, wherein when the shared connecting line is the shared source connecting line, a total number of rows of the set of optoelectronic elements is x, a total number of columns of the set of optoelectronic elements is y, a total number of shared source connecting lines is n, n is less than y, and a total number of gate connecting lines is x*(y/n), or wherein when the shared connecting line is the shared gate connecting line, a total number of rows of the set of optoelectronic elements is x, a total number of columns of the set of optoelectronic elements is y, a total number of shared gate connecting lines is n, n is less than x, and a total number of source connecting lines is y*(x/n).

4. The article according to claim 1, wherein:
    a first optoelectronic element of the set of optoelectronic elements is connected to the shared connecting line and to a first other connecting line;

a second optoelectronic element of the set of optoelectronic elements is connected to the shared connecting line and to a second other connecting line; and a third optoelectronic element of the set of optoelectronic elements is connected to a third other connecting line and to one of the first other connecting line or the second other connecting line.

5. The article according to claim 1, wherein:

the set of optoelectronic elements comprises a set of electrical energizing components coupled to a set of electrically energizable components;

at least one of the set of electrical energizing components or the set of electrically energizable components is disposed on the flexible backplane portion of the flexible substrate and;

the article further comprises a frontplane substrate.

6. The article according to claim 5, wherein the frontplane substrate is a flexible frontplane substrate.

7. The article according to claim 1, wherein the optoelectronic area is a flexible optoelectronic area, wherein the article further comprises a support for the flexible optoelectronic area, the support limiting bending of the flexible optoelectronic area, and wherein the support, the substrate on which the flexible optoelectronic area is disposed, and the flexible optoelectronic area are each dynamically flexible.

8. The article according to claim 1, wherein:

the optoelectronic area is a display area;

the set of optoelectronic elements is a set of pixels;

the signals provided by the set of driving circuits cause an image content based on the driving signals to be presented, on the display area, by using the set of pixels; and one or more inputs received at the article comprise at least one of an input generated by a user of the article or an input received by the article from another device.

9. The article according to claim 1, further comprising a flexible sheet of electronics that is dynamically flexible, wherein:

the flexible sheet of electronics is a flexible electronic display or a flexible lighting array;

the optoelectronic area is a display area of the flexible electronic display or of the flexible lighting array;

the set of optoelectronic elements is a set of pixels; and the set of pixels at least one of emit or reflect light based on signals received from the set of driving circuits.

10. The article according to claim 1, wherein the flexible connecting lines are disposed such that the flexible substrate may be bent in a manner that maximizes a viewable area of the optoelectronic area.

11. An article, comprising:

a flexible substrate including a first flexible frontplane portion and a second flexible backplane portion;

an elongated optoelectronic area disposed on the first frontplane portion of the flexible substrate, the optoelectronic area including an array of pixels, each pixel including an optoelectronic element having a transistor electrically coupled to an electrically energizable component configured to at least one of emit, reflect, transflect, or absorb light, wherein the array of pixels of the elongated optoelectronic area includes a first number of rows of pixels and a second number of columns of pixels and wherein each of the transistors includes a first transistor electrode of a first type and a second transistor electrode of a second type;

a first set of flexible connecting lines disposed on the second flexible backplane portion of the flexible substrate and extending into the first flexible frontplane portion of the flexible substrate, wherein each of the first set of flexible connecting lines is connected to the first transistor electrode of a plurality of different transistors within a particular row of pixels; and a second set of flexible connecting lines disposed on the second flexible backplane portion of the flexible substrate and extending into the first flexible frontplane portion of the flexible substrate, wherein each of the second set of flexible connecting lines is connected to the second transistor electrode of a multiplicity of different transistors within a particular column of pixels;

wherein the first set of flexible connecting lines and the second set of flexible connecting lines are disposed in a plurality of planes to maximize the optoelectronic area, wherein each individual flexible connecting line of the first set of flexible connecting lines and each individual flexible connecting line of the second set of flexible connecting lines is entirely disposed in a single plane of the plurality of planes; and wherein, the number of connecting lines in the first set of flexible connecting lines is greater than the first number of rows of pixels, and the number of connecting lines in the second set of flexible connecting lines is less than the second number of columns of pixels.

12. The article of claim 11, wherein each of the second set of flexible connecting lines is connected to the second transistor electrode of a multiplicity of different transistors disposed within two or more columns of pixels.

13. The article of claim 11, wherein the first set of flexible connecting lines includes, for each particular row of pixels, a first line connected to the first transistor electrode of a first set of transistors within the particular row of pixels and a second line connected to the first transistor electrode of a second set of transistors within the particular row of pixels, wherein the first and second sets of transistors within the particular row of pixels do not include a common transistor.

14. The article of claim 11, wherein each of the transistors includes a gate electrode and a source electrode, and wherein the first transistor electrode is one of a gate electrode or a source electrode and wherein the second transistor electrode is the other of a source electrode or a gate electrode.

15. The article of any of claim 11, wherein the electrically energizable component of each optoelectronic element includes a pixel electrode that is electrically coupled to the transistor of the optoelectronic element.

16. The article of claim 15, wherein the pixel electrode of each optoelectronic element covers substantially the area defined by the pixel for the optoelectronic element and the transistor of a particular optoelectronic element coupled to the pixel electrode of the particular optoelectronic element is disposed at a position offset from area defined by the pixel.

17. The article of claim 16, wherein the transistor of a particular optoelectronic element is disposed at a position beneath the pixel electrode of a pixel adjacent to the pixel defined by the particular optoelectronic element.

18. The article of claim 11, wherein the one of the first set of flexible connecting lines or the second set of flexible connecting lines is disposed between two other connecting lines within the first set of connecting lines or the second set of connection lines.

19. The article of claim 11, wherein each optoelectronic element includes a further electronic element coupled to the transistor and the pixel electrode of the optoelectronic element, and further including a third set of flexible connecting lines disposed on the second portion of the flexible substrate and extending into the first portion of the flexible substrate, wherein each of the third set of flexible connecting lines is connected to the further electronic element of a multiplicity of different optoelectronic elements within a particular column of pixels or within a particular row of pixels.

20. An article, comprising:
   a flexible substrate including:
   a first portion, the first portion being a flexible backplane portion on which an elongated optoelectronic area is disposed, the optoelectronic area including a set of optoelectronic elements disposed in a plurality of rows and columns, each of the optoelectronic elements being configured to at least one of emit, reflect, transflect, or absorb light;
   a second portion on which a set of flexible connecting lines are disposed in a plurality of planes to maximize the optoelectronic area, wherein each of the flexible connecting lines is entirely disposed in a single plane of the plurality of planes and each of the flexible connecting lines is disposed on a planar layer, the set of flexible connecting lines coupled to the set of optoelectronic elements; and
   a set of driving circuits communicatively coupled to the set of flexible connecting lines to communicate drive signals with the set of optoelectronic elements,
   wherein at least one connecting line of the set of flexible connecting lines is a shared connecting line communicatively connected to one of: a respective two or more columns of the set of optoelectronic elements, or a respective two or more rows of the set of optoelectronic elements.

* * * * *